United States Patent
Ohnuma et al.

(10) Patent No.: US 7,727,846 B2
(45) Date of Patent: Jun. 1, 2010

(54) METHOD OF MANUFACTURING AN SOI SUBSTRATE AND METHOD OF MANUFACTURING A SEMICONDUCTOR DEVICE

(75) Inventors: Hideto Ohnuma, Atsugi (JP); Ryota Imahayashi, Atsugi (JP); Yoichi Iikubo, Isehara (JP); Kenichiro Makino, Atsugi (JP); Sho Nagamatsu, Isehara (JP)

(73) Assignee: Semiconductor Energy Laboratory Co., Ltd, Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/213,137

(22) Filed: Jun. 16, 2008

(65) Prior Publication Data

US 2009/0004878 A1    Jan. 1, 2009

(51) Int. Cl.
H01L 21/331    (2006.01)
H01L 21/8222    (2006.01)

(52) U.S. Cl. .................. 438/311; 438/475; 438/662; 438/9; 257/E21.17; 257/E21.051; 257/E21.218; 257/E21.227; 257/E21.032; 257/E21.304; 257/E21.328; 257/E21.347

(58) Field of Classification Search .................. 438/311, 438/9, 57, 30, 149, 474, 475, 513, 514, 637, 438/535, 680, 692, 706, 712, 745, 199, 662, 438/663
See application file for complete search history.

(56) References Cited

U.S. PATENT DOCUMENTS 5,374,564 A    12/1994    Bruel
6,372,609 B1    4/2002    Aga et al.
6,380,046 B1    4/2002    Yamazaki
6,803,264 B2    10/2004    Yamazaki et al.
2005/0009252 A1    1/2005    Yamazaki et al.
2007/0173000 A1    7/2007    Yamazaki
2007/0254455 A1*    11/2007    Yamaguchi et al. .......... 438/455
2008/0238533 A1*    10/2008    Kato .......................... 327/535
2009/0004764 A1*    1/2009    Ohnuma et al. ............... 438/30
2009/0117707 A1*    5/2009    Shimomura et al. ......... 438/458

FOREIGN PATENT DOCUMENTS

| JP | 02-054532 | 2/1990 |
| JP | 11-163363 | 6/1999 |
| JP | 2000-124092 | 4/2000 |

* cited by examiner

Primary Examiner—David Nhu
(74) Attorney, Agent, or Firm—Eric J. Robinson; Robinson Intellectual Property Law Office, P.C.

(57) ABSTRACT

It is an object of the present invention is to provide a method of manufacturing an SOI substrate provided with a single-crystal semiconductor layer which can be practically used even when a substrate having a low heat-resistant temperature, such as a glass substrate or the like, is used, and further, to manufacture a semiconductor device with high reliability by using such an SOI substrate. A semiconductor layer which is separated from a semiconductor substrate and bonded to a supporting substrate having an insulating surface is irradiated with electromagnetic waves, and the surface of the semiconductor layer is subjected to polishing treatment. At least part of a region of the semiconductor layer is melted by irradiation with electromagnetic waves, and a crystal defect in the semiconductor layer can be reduced. Further, the surface of the semiconductor layer can be polished and planarized by polishing treatment.

19 Claims, 21 Drawing Sheets 104   102   101

124

125   123

130

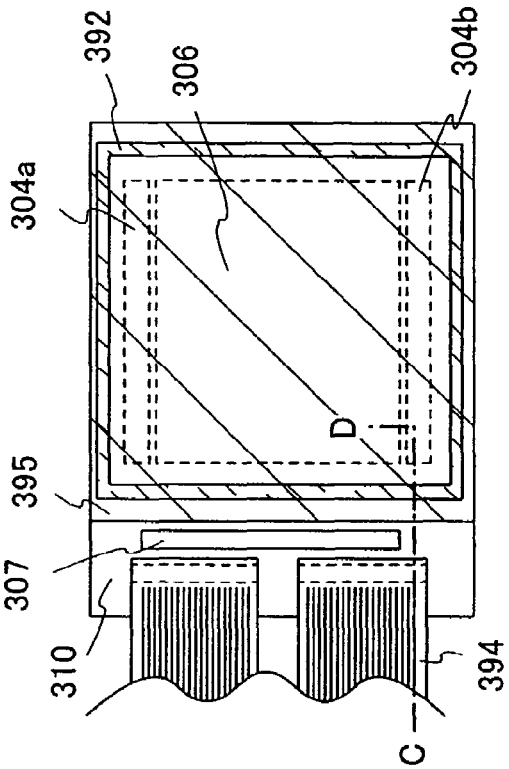
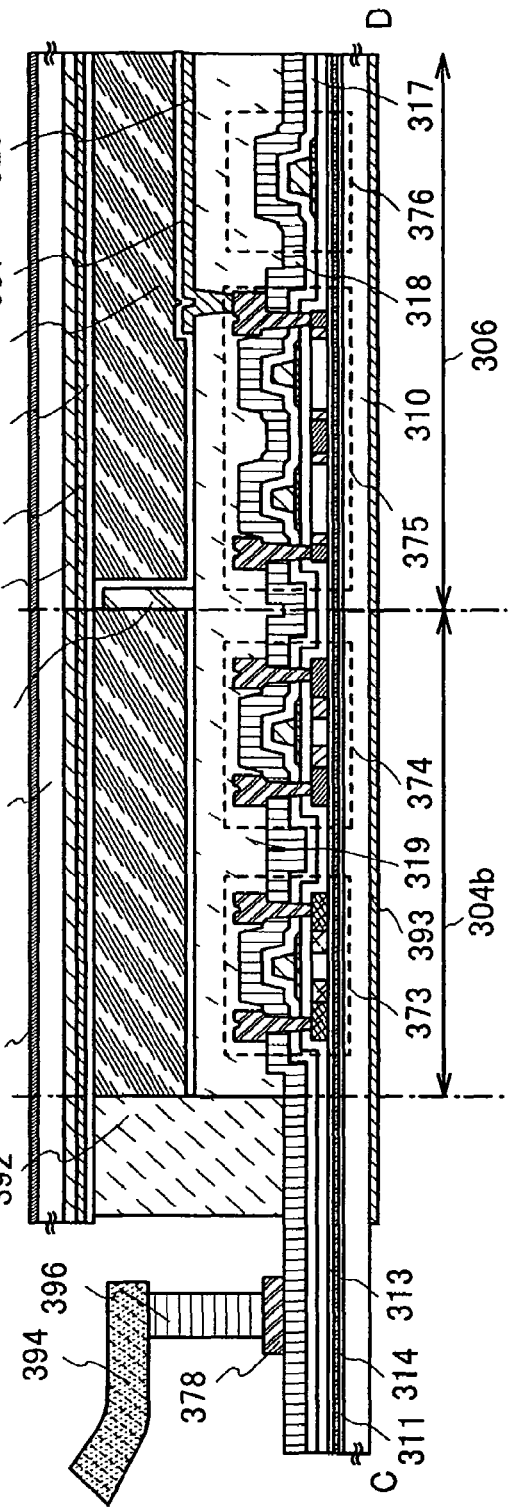
FIG. 7A
FIG. 7B

METHOD OF MANUFACTURING AN SOI SUBSTRATE AND METHOD OF MANUFACTURING A SEMICONDUCTOR DEVICE

BACKGROUND OF THE INVENTION

1. Field of the Invention

The present invention relates to a method of manufacturing SOI substrates having a so-called silicon-on-insulator (SOI) structure as which a semiconductor layer is provided on an insulating surface and a method of manufacturing semiconductor devices having an SOI structure.

2. Description of the Related Art

As an alternative to an integrated circuit using a silicon wafer which is manufactured by thinly slicing an ingot of a single-crystal semiconductor, an integrated circuit using a semiconductor substrate which is referred to as a silicon-on-insulator (hereinafter also referred to as "SOI") substrate, as which a thin single-crystal semiconductor layer is provided on an insulating surface has been developed. The integrated circuit using an SOI substrate has attracted attention as an integrated circuit in which parasitic capacitance between a drain of a transistor and the substrate is reduced and the performance of a semiconductor integrated circuit is improved.

As a method of manufacturing SOI substrates, a hydrogen ion implantation separation method is known (e.g., see Reference 1: Japanese Published Patent Application No. 2000-124092). The hydrogen ion implantation separation method is a method in which hydrogen ions are implanted into a silicon wafer to form an embrittlement layer at a given depth from the surface, and a thin silicon layer is bonded to another silicon wafer by separation of the silicon wafer from the embrittlement layer as a separation plane. In addition to the heat treatment for separation of a silicon layer, it is necessary to perform heat treatment in an oxidizing atmosphere to form an oxide film over the silicon layer, remove the oxide film, and perform heat treatment at 1000° C. to 1300° C. to increase bonding strength.

Furthermore, a semiconductor device in which an insulating substrate such as high heat resistance glass is provided with a silicon layer is disclosed (e.g., see Reference 2: Japanese Published Patent Application No. H11-163363). This semiconductor device has a structure in which the entire surface of crystallized glass having a distortion point of 750° C. or more is protected by an insulating silicon film and a silicon layer obtained by a hydrogen ion implantation separation method is adhered to the insulating silicon film.

SUMMARY OF THE INVENTION

In addition, in an ion irradiation step to form an embrittlement layer, a silicon layer is damaged by being irradiated with ions. In heat treatment to increase the bonding strength between the silicon layer and a supporting substrate, damage to the silicon layer by an ion irradiation step is repaired.

However, when a substrate having a low heat-resistant temperature, such as a glass substrate or the like, is used for the supporting substrate, heat treatment at a temperature of 1000° C. or more could not be performed and the damage to the silicon layer by the above ion irradiation step could not be sufficiently repaired.

In the foregoing problems, an object of the present invention is to provide a method of manufacturing an SOI substrate provided with a semiconductor layer which can be used practically even when a substrate having a low heat-resistant temperature, such as a glass substrate or the like, is used. In addition, another object of the present invention is to manufacture a semiconductor device with high reliability which uses such an SOI substrate.

In the manufacture of an SOI substrate, a semiconductor layer which is separated from a semiconductor substrate and bonded to a supporting substrate having an insulating surface is irradiated with electromagnetic waves, and the surface of the semiconductor layer irradiated with electromagnetic waves is subjected to polishing treatment.

At least part of the semiconductor layer is melted by irradiation with electromagnetic waves, and a crystal defect in the semiconductor layer can be reduced. Since irradiation treatment with electromagnetic waves is used, the temperature rise of a supporting substrate is suppressed; therefore, a substrate having a low heat-resistant temperature such as a glass substrate can be used for the supporting substrate. Accordingly, damage of the semiconductor layer induced by a step of ion irradiation to a semiconductor layer can be sufficiently repaired.

Further, the surface of the semiconductor layer can be polished by polishing treatment and planarized. Therefore, an SOI substrate having a semiconductor layer in which a crystal defect is reduced by irradiation with electromagnetic waves and which has high planarity by polishing treatment can be obtained.

In addition, the surface of the semiconductor layer may be subjected to polishing treatment before irradiation with electromagnetic waves. By the polishing treatment, the surface of the semiconductor layer can be planarized and the thickness of the semiconductor layer can be controlled. The surface of the semiconductor layer is planarized so that uniform heat capacity of the semiconductor layer can be obtained in an irradiation step using electromagnetic waves, and uniform quality of crystals can be formed by performing a uniform heating and cooling step or a uniform melting and solidification step. In addition, the thickness of the semiconductor layer is set at an appropriate value for absorbing electromagnetic wave energy; thus, electromagnetic wave energy can be efficiently provided to the semiconductor layer. Further, since the surface of the semiconductor layer has many crystal defects, the surface which has many crystal defects is removed so that the crystal defects in the semiconductor layer after irradiation with electromagnetic waves can be reduced.

Planarization and control of the thickness of the semiconductor layer before irradiation with electromagnetic waves may be performed by etching treatment instead of polishing treatment. Note that, in this specification, in the case where polishing treatment is performed plural times, polishing treatment before irradiation with electromagnetic waves is referred to as first polishing treatment, and polishing treatment after irradiation with electromagnetic waves is referred to as second polishing treatment.

For the polishing treatment, a chemical mechanical polishing (CMP) method or a liquid jet polishing method can be used.

Any electromagnetic waves that provide high energy to the semiconductor layer can be used. Preferably, a laser beam can be used. In addition, intense light such as lamp light or the like may also be used. A heat treatment method using lamp light, such as spike annealing or flash annealing, which takes less than or equal to one second and takes shorter time than an RTA method, can be performed. This spike annealing process is a method in which a substrate is rapidly (steeply) heated by a high heat output of a heat lamp to reach a given temperature, and then heating is immediately stopped to rapidly cool the substrate. The wavelength of electromagnetic waves may be 190 nm to 600 nm.

In bonding a semiconductor layer to a substrate, a silicon oxide film is formed, preferably using organic silane as a material on one or both surfaces that are to form a bond and can be used as an insulating layer (also referred to as a bonding layer) having a bonding surface (forming a bond). Examples of organic silane that can be used include silicon-containing compounds, such as tetraethyl orthosilicate (TEOS) (chemical formula: $Si(OC_2H_5)_4$), trimethylsilane (TMS) (chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), tris(dimethylamino)silane (chemical formula: $SiH(N(CH_3)_2)_3$), and the like. In other words, in a structure in which a semiconductor layer is bonded to a supporting substrate, a layer which forms a smooth surface and has a hydrophilic surface is provided as a bonding surface.

Note that a chemical vapor deposition (CVD) method in this specification includes a plasma CVD method, a thermal CVD method, and a photo CVD method in its category.

A silicon oxide film to serve as an insulating layer having a bonding surface can be formed using monosilane, disilane, or trisilane as a source gas by a chemical vapor deposition method. In addition, a silicon oxide film to serve as an insulating layer having a bonding surface may also be a thermal oxide film and preferably contains chlorine.

A semiconductor layer which is bonded to a supporting substrate is obtained in such a way that a semiconductor substrate is separated from a weakness layer formed in the semiconductor substrate. The embrittlement layer can be formed by irradiating the semiconductor substrate with ions of hydrogen, helium, or a halogen typified by fluorine. In this case, irradiation may be performed using ions which consist of single atoms that have different masses or ions which consist of a plurality of atoms that have different masses. When hydrogen ions are irradiated, it is preferable that $H^+$ ions, $H_2^+$ ions, and $H_3^+$ ions be contained and a ratio of $H_3^+$ ions be high.

A supporting substrate may be provided with a silicon nitride film or a silicon nitride oxide film, which prevents diffusion of an impurity element from the supporting substrate, as a blocking layer (also referred to as a barrier layer). A silicon oxynitride film may also be combined with the above films as insulating film that has a function of relieving stress.

Note that a silicon oxynitride film means a film that contains many oxygen atoms comparing to nitrogen atoms and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains many nitrogen atoms comparing to oxygen atoms and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen atoms fall within the ranges given above, where the total number of atoms contained in the silicon oxynitride film or the silicon nitride oxide film is defined as 100 at. %.

In addition, a protective layer may be formed between the semiconductor substrate and the insulating layer having a bonding surface. The protective layer can be formed of a single layer or a stacked structure of a plurality of layers selected from a group of a silicon nitride layer, a silicon oxide layer, a silicon nitride oxide layer, and a silicon oxynitride layer. The layer can be formed over the semiconductor substrate before the embrittlement layer is formed in the semiconductor substrate. Further, the protective layer may be formed over the semiconductor substrate after the embrittlement layer is formed in the semiconductor substrate.

One mode of a method of manufacturing an SOI substrate of the present invention includes the steps of: irradiating one surface of a semiconductor substrate with an ion, and forming an embrittlement layer at a given depth from the one surface of the semiconductor substrate; forming an insulating layer over the one surface of the semiconductor substrate or over a supporting substrate; performing heat treatment for generating a crack in the embrittlement layer in a state that the semiconductor substrate and the supporting substrate are overlapped with each other with the insulating layer interposed therebetween and for separating the semiconductor substrate at the embrittlement layer, and forming a semiconductor layer over the supporting substrate; irradiating the semiconductor layer with an electromagnetic wave; and performing polishing treatment on a surface of the semiconductor layer which is irradiated with the electromagnetic wave.

Another mode of a method of manufacturing an SOI substrate of the present invention includes the steps of: forming an insulating layer over one surface of a semiconductor substrate; irradiating the semiconductor substrate with an ion through the insulating layer formed over the one surface of the semiconductor substrate, and forming an embrittlement layer at a given depth from the one surface of the semiconductor substrate; performing heat treatment for generating a crack in the embrittlement layer in a state that the semiconductor substrate and a supporting substrate are overlapped with each other with the insulating layer interposed therebetween so that the semiconductor substrate is separated at the embrittlement layer, and forming a semiconductor layer over the supporting substrate; irradiating the semiconductor layer with an electromagnetic wave; and performing polishing treatment on a surface of the semiconductor layer which is irradiated with the electromagnetic wave.

Another mode of a method of manufacturing an SOI substrate of the present invention includes the steps of: irradiating one surface of a semiconductor substrate with an ion, and forming an embrittlement layer at a given depth from the one surface of the semiconductor substrate; forming an insulating layer over the one surface of the semiconductor substrate or over a supporting substrate; performing heat treatment for generating a crack in the embrittlement layer in a state that the semiconductor substrate and the supporting substrate are overlapped with each other with the insulating layer interposed therebetween so that the semiconductor substrate is separated at the embrittlement layer, and forming a semiconductor layer over the supporting substrate; performing first polishing treatment on a surface of the semiconductor layer; irradiating the semiconductor layer which is subjected to the first polishing treatment with an electromagnetic wave; and performing second polishing treatment on the surface of the semiconductor layer which is irradiated with the electromagnetic wave.

Another mode of a method of manufacturing an SOI substrate of the present invention includes the steps of: forming an insulating layer over one surface of a semiconductor substrate; irradiating the semiconductor substrate with an ion through the insulating layer formed over the one surface of the semiconductor substrate, and forming an embrittlement layer at a given depth from the one surface of the semiconductor substrate; performing heat treatment for generating a crack in the embrittlement layer in a state that the semiconductor substrate and the supporting substrate are overlapped with each other with the insulating layer interposed therebetween so that the semiconductor substrate is separated at the embrittlement layer, and forming a semiconductor layer over the supporting substrate; performing first polishing treatment on a surface of the semiconductor layer; irradiating the semiconductor layer which is subjected to the first polishing treatment with an electromagnetic wave; and performing second polishing treatment on the surface of the semiconductor layer which is irradiated with the electromagnetic wave.

Another mode of a method of manufacturing an SOI substrate of the present invention includes the steps of: irradiating one surface of a semiconductor substrate with an ion, and forming an embrittlement layer at a given depth from the one surface of the semiconductor substrate; forming an insulating layer over the one surface of the semiconductor substrate or over a supporting substrate; performing heat treatment for generating a crack in the embrittlement layer in a state that the semiconductor substrate and the supporting substrate are overlapped with each other with the insulating layer interposed therebetween so that the semiconductor substrate is separated at the embrittlement layer, and forming a semiconductor layer over the supporting substrate; performing etching treatment on a surface of the semiconductor layer; irradiating the semiconductor layer which is subjected to the etching treatment with an electromagnetic wave; and performing polishing treatment on the surface of the semiconductor layer which is irradiated with the electromagnetic wave.

Another mode of a method of manufacturing an SOI substrate of the present invention includes the steps of: forming an insulating layer over one surface of a semiconductor substrate; irradiating the semiconductor substrate with an ion through the insulating layer formed over the one surface of the semiconductor substrate, and forming an embrittlement layer at a given depth from the one surface of the semiconductor substrate; performing heat treatment for generating a crack in the embrittlement layer in a state that the semiconductor substrate and a supporting substrate are overlapped with each other with the insulating layer interposed therebetween so that the semiconductor substrate is separated at the embrittlement layer, and forming a semiconductor layer over the supporting substrate; performing etching treatment on a surface of the semiconductor layer; irradiating the semiconductor layer which is subjected to the etching treatment with an electromagnetic wave; and performing polishing treatment on the surface of the semiconductor layer which is irradiated with the electromagnetic wave.

A semiconductor element can be formed using the semiconductor layer formed in the method of manufacturing an SOI substrate, and a display element which is electrically connected to the semiconductor element can be formed.

Note that, in the present invention, the term "semiconductor device" refers to a device which can be operated by utilizing semiconductor characteristics. A device having a circuit including a semiconductor element (a transistor, a memory element, a diode, or the like) and a semiconductor device such as a chip having a processor circuit can be manufactured by using the present invention.

The present invention can also be applied to a semiconductor device (also referred to as a display device) having a function of displaying. The semiconductor device formed by using the present invention includes a semiconductor device (a light emitting display device) in which a TFT and a light-emitting element having electrodes sandwiching a layer containing an organic substance, an inorganic substance, or a mixture of an organic substance and an inorganic substance which exhibits light emission referred to as electroluminescence (hereinafter also referred to as EL) are connected to each other, a semiconductor device (a liquid crystal display device) in which a liquid crystal element including a liquid crystal material is used as a display element, and the like. In this specification, a display device means a device having a display element. Note that the display device may be a display panel in itself for which a plurality of pixels including a display element and a peripheral driver circuit for driving the pixels are provided over a substrate. Moreover, the display device may indicate a device which is provided with a flexible printed circuit (FPC) or a printed wiring board (PWB) and has an IC, a resistor, a capacitor, an inductor, a transistor, or the like. The display device may also include an optical sheet such as a polarizing plate or a retardation plate. Further, it may include a backlight (which may include a light guiding plate, a prism sheet, a diffusion sheet, a reflective sheet, and a light source (e.g., an LED or a cold-cathode tube)).

Note that as a display element or a semiconductor device, various modes and various elements can be used. For example, a display medium whose contrast is changed by an electromagnetic action, such as an EL element (e.g., an organic EL element, an inorganic EL element, or an EL element including both organic and inorganic substances), an electron-emissive element, a liquid crystal element, electronic ink, a grating light valve (GLV), a plasma display panel (PDP), a digital micromirror device (DMD), a piezoelectric ceramic display, a carbon nanotube, or the like can be employed. Note that semiconductor devices that use an EL element include an EL display; semiconductor devices that use an electron-emissive element include a field-emission display (FED), an SED-type flat panel display (SED: surface-conduction electron-emitter display), and the like; semiconductor devices that use a liquid crystal element include a liquid crystal display, a transmissive liquid crystal display, a semi-transmissive liquid crystal display, a reflective liquid crystal display, and the like; and semiconductor devices that use electronic ink include electronic paper.

Even when a substrate having a low heat-resistant, such as a glass substrate or the like, is used, an SOI substrate having a semiconductor layer that can be used practically and in which a crystal defect is reduced and which has high planarity can be manufactured by irradiation with electromagnetic waves and polishing treatment.

A semiconductor layer formed over such an SOI substrate is used, and a semiconductor device that includes various semiconductor elements, memory elements, integrated circuits, or the like which have high performance and high reliability can be manufactured with high yield.

BRIEF DESCRIPTION OF THE DRAWINGS

FIGS. 7A and 7B are diagrams illustrating a semiconductor device of the present invention.

DETAILED DESCRIPTION OF THE INVENTION

Figure 1A:
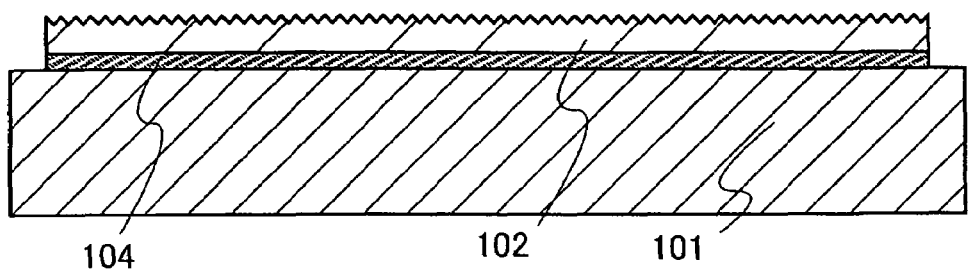
FIGS. 1A to 1C are diagrams illustrating a method of manufacturing an SOI substrate of the present invention.

Hereinafter, embodiment modes and an example of the present invention will be described using the accompanying drawings. However, the present invention is not limited to descriptions below. As can be easily understood by those skilled in the art, the modes and details of the present invention can be changed in various ways without departing from the spirit and scope of the present invention. Thus, the present invention should not be taken as being limited to the following description of the embodiment modes and the example. The same reference numerals are commonly given to the same components or components having the same function in the structure of the present invention, and repetitive descriptions will be omitted.

Embodiment Mode 1

A method of manufacturing a semiconductor device of the present invention will be described with reference to FIGS. 1A to 1C, 2A to 2D, 3A to 3D, and 4A to 4C.

In this embodiment mode, a semiconductor layer, which is separated from a semiconductor substrate and bonded to a supporting substrate having an insulating surface, is irradiated with electromagnetic waves and the surface of the semiconductor layer which is irradiated with electromagnetic waves is subjected to polishing treatment. A single-crystal semiconductor substrate is preferably used as the semiconductor substrate, and a single-crystal semiconductor layer is preferably formed as the semiconductor layer which is separated from the semiconductor substrate and bonded to the supporting substrate.

First, a method of forming a semiconductor layer over a supporting substrate which is a substrate having an insulating surface by using a semiconductor substrate will be described with reference to FIGS. 3A to 3D and FIGS. 4A to 4C.

Figure 3A:
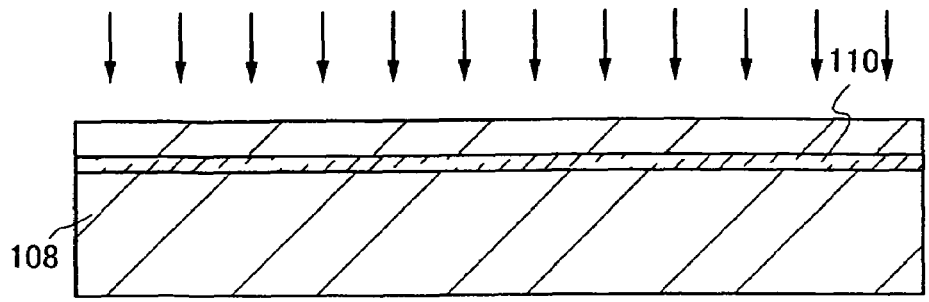
FIGS. 3A to 3D are diagrams illustrating a method of manufacturing an SOI substrate of the present invention.

A semiconductor substrate 108 shown in FIG. 3A is cleaned, and the surface of the semiconductor substrate 108 is irradiated with ions accelerated by an electric field to form an embrittlement layer 110 at a given depth. Ion irradiation is performed in consideration of the thickness of a semiconductor layer to be transferred to a supporting substrate. Accelerating voltage for irradiating the semiconductor substrate 108 with ions is set in consideration of such a thickness.

For the semiconductor substrate 108, a semiconductor substrate such as a silicon substrate, a germanium substrate, or the like; or a compound semiconductor substrate such as a gallium arsenide substrate, an indium phosphide substrate, or the like is used. It is preferable that a single-crystal semiconductor substrate be used for the semiconductor substrate 108, but a polycrystalline semiconductor substrate may also be used. A semiconductor layer obtained over a supporting substrate can be determined by selecting a semiconductor substrate to serve as a base.

In this embodiment mode, an ion irradiation separation method in which a semiconductor substrate is irradiated with hydrogen, helium, or fluorine ions at a given depth, heat treatment is then conducted, and a semiconductor layer, which is an outer layer, is separated from the semiconductor substrate can be used. Alternatively, a method in which single-crystal silicon is epitaxially grown over porous silicon and the porous silicon layer is separated by water jetting may also be employed.

For example, a single-crystal silicon substrate is used as the semiconductor substrate 108, the surface thereof is processed with dilute hydrofluoric acid, a film which is naturally oxidized is removed and a contaminant such as dust or the like which is attached to the surface is also removed, and the surface of the semiconductor substrate 108 is cleaned.

The embrittlement layer 110 may be formed by irradiation with ions by an ion doping method or an ion implantation method. The embrittlement layer 110 is formed by irradiation with ions of hydrogen, helium, or a halogen typified by fluorine. When irradiation is performed using fluorine ions as a halogen element, $BF_3$ may be used as a source gas. Note that ion implantation is a method in which ionized gas is separated by mass and a semiconductor is irradiated with the separated ionized gas.

When the single-crystal silicon substrate is irradiated with halogen ions such as fluorine ions by an ion irradiation method, fluorine which has been used for irradiation knocks out (expels) silicon atoms in silicon crystal lattice, so that blank portions are created effectively and microvoids are made in the embrittlement layer. In this case, a change occurs in the volume of microvoids formed in the embrittlement layer by heat treatment at a relatively low temperature, and a thin single-crystal semiconductor layer can be formed by cleavage along the embrittlement layer. Irradiation with fluorine ions is performed, and then irradiation with hydrogen ions may be performed, so that hydrogen may be contained in the void. Since the embrittlement layer which is formed to separate the thin semiconductor layer from the semiconductor substrate using a change in the volume of microvoids formed in the embrittlement layer, it is preferable to use effect of irradiating with fluorine and hydrogen.

In addition, irradiation may be performed using a ion or ions consisted of a plurality of identical atoms that have different masses. For example, when irradiation is performed using hydrogen ions, it is preferable to contain $H^+$ ions, $H_2^+$ ions, and $H_3^+$ ions and to have a high ratio of $H_3^+$ ions. In the case of irradiation using hydrogen ions, when $H^+$ ions, $H_2^+$ ions, and $H_3^+$ ions are contained and the ratio of $H_3^+$ ions is high, irradiation efficiency can be increased and irradiation time can be shortened. With such a structure, separation of the thin single-crystal semiconductor layer from the semiconductor substrate can be performed easily.

It is necessary to perform irradiation with ions under high dose conditions in the formation of the embrittlement layer, and consequently the surface of the semiconductor substrate 108 becomes rough in some cases. Therefore, a protective layer against ion irradiation, such as a silicon nitride film, a silicon nitride oxide film, a silicon oxide film, or the like may be provided on the surface which is irradiated with ions at a thickness of 50 nm to 200 nm.

For example, a stacked layer of a silicon oxynitride film (a thickness of 5 nm to 300 nm, preferably, 30 nm to 150 nm (e.g., 50 nm)) and a silicon nitride oxide film (a thickness of 5 nm to 150 nm, preferably, 10 nm to 100 nm (e.g., 50 nm)) is formed by a plasma CVD method as a protective layer over the semiconductor substrate 108. As an example, a silicon oxynitride film is formed at a thickness of 50 nm over the semiconductor substrate 108, and a silicon nitride oxide film is stacked at a thickness of 50 nm over the silicon oxynitride film. A silicon oxynitride film may be a silicon oxide film formed by a chemical vapor deposition method using an organic silane gas.

Alternatively, the semiconductor substrate 108 may be degreased and washed, and thermal oxidation may be performed after an oxide film on the surface of the semiconductor substrate 108 is removed. Although normal dry oxidation for thermal oxidation may be performed, it is preferable to perform oxidation in an oxidative atmosphere to which a halogen is added. For example, heat treatment is performed at a temperature of 700° C. or more in an atmosphere that contains HCl at 0.5 volume % to 10 volume % (preferably, 3 volume %) with respect to oxygen. Preferably, thermal oxidation is performed at a temperature of 950° C. to 1100° C. Processing time may be set for 0.1 hour to 6 hours, preferably 0.5 hour to 1 hour. An oxide film to be formed has a thickness of 10 nm to 1000 nm (preferably, 50 nm to 200 nm), for example, 100 nm.

Instead of HCl, one or a plurality of kinds selected from HF, $NF_3$, HBr, $Cl_2$, $ClF_3$, $BCl_3$, $F_2$, $Br_2$, and the like can be used as a substance that contains a halogen.

Heat treatment is performed in such a temperature range so that a gettering effect can be obtained by a halogen element. The gettering has an effect of removing a metal impurity, in particular. That is, an impurity such as metal or the like turns into volatile chloride, and then is diffused into a gas phase to be removed, by the action of chlorine. It has an advantageous effect on the case where the surface of the semiconductor substrate 108 is subjected to a chemical mechanical polishing (CMP) treatment. In addition, hydrogen has a function of compensating a defect at the interface between the semiconductor substrate 108 and the oxide film to be formed and reducing a density of localized state at the interface, whereby the interface between the semiconductor substrate 108 and the oxide film is inactivated, so that electric characteristics of a manufactured device are stabilized.

A halogen can be contained in the oxide film which is formed by this heat treatment. A halogen element is contained at a concentration of $1\times10^{17}/cm^3$ to $5\times10^{20}/cm^3$, whereby the oxide film can function as a protective layer which captures an impurity such as metal or the like and prevents contamination of the semiconductor substrate 108.

When the embrittlement layer 110 is formed, accelerating voltage and the number of all ions can be adjusted in accordance with the thickness of a film deposited over the semiconductor layer, the thickness of the given semiconductor layer which is separated from the semiconductor substrate and transferred to a supporting substrate, and ion species which are used for irradiation.

For example, a hydrogen gas is used as a material, and irradiation with ions is performed by an ion doping method at an acceleration voltage of 40 kV, and the number of all ions of $2\times10^{16}$ ions/cm$^2$, so that the embrittlement layer can be formed. If the protective layer is made to be thick, when irradiation with ions is performed under the same condition and the embrittlement layer is formed, a thin semiconductor layer can be formed as a given semiconductor layer which is separated from the semiconductor substrate and is transferred to the supporting substrate. For example, although it depends on the ratio of ion species ($H^+$ ions, $H_2^+$ ions, $H_3^+$ ions), in the case where the embrittlement layer is formed under the above conditions and a silicon oxynitride film (a thickness of 50 nm) and a silicon nitride oxide film (a thickness of 50 nm) are stacked as a protective layer over the semiconductor substrate, the thickness of the semiconductor layer to be transferred to the supporting substrate is about 120 nm; in the case where a silicon oxynitride film (a thickness of 100 nm) and a silicon nitride oxide film (a thickness of 50 nm) are stacked as a protective layer over the semiconductor substrate under the above conditions, the thickness of the semiconductor layer to be transferred to the supporting substrate is about 70 nm.

When helium (He) or hydrogen is used as a source gas, irradiation is performed with an accelerating voltage in the range of 10 kV to 200 kV and with a dose in the range of $1\times10^{16}$ ions/cm$^2$ to $6\times10^{16}$ ions/cm$^2$ so that the embrittlement layer can be formed. When helium is used as a source gas, $He^+$ ions can be used as main ions for irradiation even when mass separation is not performed. In addition, when hydrogen is used as a source gas, $H_3^+$ ions and $H_2^+$ ions can be used as main ions for irradiation. Ion species change depending on a plasma generation method, pressure, the supply quantity of a source gas, or accelerating voltage.

As an example of formation of the embrittlement layer, a silicon oxynitride film (a thickness of 50 nm), a silicon nitride oxide film (a thickness of 50 nm), and a silicon oxide film (a thickness of 50 nm) are stacked as a protective layer over the semiconductor substrate, irradiation with hydrogen is performed at an acceleration voltage of 40 kV and a dose of $2\times10^{16}$ ions/cm$^2$, and the embrittlement layer is formed in the semiconductor substrate. Then, a silicon oxide film (a thickness of 50 nm) is formed as an insulating layer having a bonding surface over the silicon oxide film, which is a top layer of the protective layer. As another example of formation of the embrittlement layer, a silicon oxide film (a thickness of 100 nm) and a silicon nitride oxide film (a thickness of 50 nm) are stacked as a protective layer over the semiconductor substrate, and irradiation with hydrogen is performed at an acceleration voltage of 40 kV and a dose of $2\times10^{16}$ ions/cm$^2$ to form the embrittlement layer in the semiconductor substrate. Then, a silicon oxide film (a thickness of 50 nm) is formed as an insulating layer over the silicon nitride oxide film, which is a top layer of the protective layer. Note that the silicon oxynitride film or the silicon nitride oxide film may be formed by a plasma CVD method, and the silicon oxide film may be formed by a CVD method using an organic silane gas.

In the case where a glass substrate that is used in the electronics industry, such as an aluminosilicate glass substrate, an aluminoborosilicate glass substrate, or a barium borosilicate glass substrate, is used as a supporting substrate 101, alkali metal such as sodium or the like is contained in a very small amount in a glass substrate, and a very small amount of impurity might adversely affect the characteristics of semiconductor elements such as transistors or the like. The silicon nitride oxide film has an effect of preventing such an impurity like a metal impurity contained in the supporting substrate 101 from diffusing into the semiconductor substrate side. Note that, instead of a silicon nitride oxide film, a silicon nitride film may be formed. A stress relaxation layer such as a silicon oxynitride film or silicon oxide film is preferably provided between the semiconductor substrate and the silicon nitride oxide film. When a stacked structure of the silicon nitride oxide film and the silicon oxynitride film is provided, an impurity can be prevented from diffusing to the semiconductor substrate and stress distortion can be reduced.

Figure 3B:
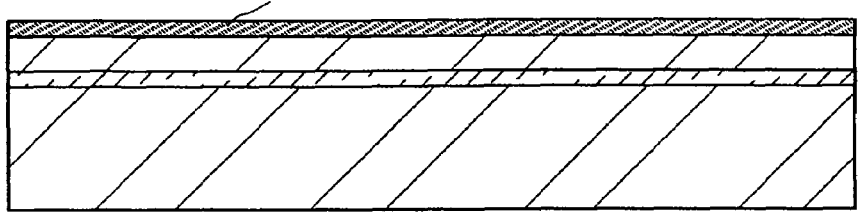

Next, as shown in FIG. 3B, a silicon oxide film is formed as an insulating layer 104 on the surface which forms a bond with the supporting substrate. It is preferable to use a silicon oxide film formed by a chemical vapor deposition method using an organic silane gas for the silicon oxide film. In addition, a silicon oxide film formed by a chemical vapor deposition method using a silane gas can also be used. In film formation by a chemical vapor deposition method, a film formation temperature of, for example, 350° C. or less (a specific example is 300° C.) is applied as the temperature that does not have degasification from the embrittlement layer 110, which is formed in the single-crystal semiconductor substrate. In addition, heat treatment temperature which is higher than the film formation temperature is used for heat treatment by which a single-crystal semiconductor layer is separated from a single-crystal semiconductor substrate or a polycrystalline semiconductor layer is separated from a polycrystalline semiconductor substrate.

The insulating layer 104 forms a smooth surface and has a hydrophilic surface. A silicon oxide film is suitable for the insulating layer 104. In particular, a silicon oxide film formed by a chemical vapor deposition method using an organic silane gas is preferable. Examples of organic silane gas that can be used include silicon-containing compounds, such as tetraethyl orthosilicate (TEOS) (chemical formula: $Si(OC_2H_5)_4$), trimethylsilane (TMS) (chemical formula: $(CH_3)_3SiH$), tetramethylsilane (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), trisdimethylaminosilane (chemical formula: $SiH(N(CH_3)_2)_3$), and the like. Note that, in the case where a silicon oxide layer is formed by a chemical vapor deposition method using organic silane as a source gas, it is preferable to mix a gas which provides oxygen. For a gas which provides oxygen, oxygen, nitrous oxide, nitrogen dioxide, or the like can be used. Further, an inert gas such as argon, helium, nitrogen, hydrogen, or the like may be mixed. In addition, for the insulating layer 104, a silicon oxide layer formed by a chemical vapor deposition method using silane such as monosilane, disilane, trisilane, or the like as a source gas can also be used. Also in this case, it is preferable to mix a gas which provides oxygen, an inert gas, or the like. In film formation by a chemical vapor deposition method, a film formation temperature of, for example, 350° C. or less is applied as the temperature that does not have degasification from the embrittlement layer 110, which is formed in the semiconductor substrate 108. In addition, heat treatment temperature which is higher than the film formation temperature is used for heat treatment by which a semiconductor layer is separated from a single-crystal semiconductor substrate or a polycrystalline semiconductor substrate. Note that a chemical vapor deposition method includes a plasma CVD method, a thermal CVD method, and a photo CVD method in its category.

In addition, as the insulating layer 104, silicon oxide formed by heat treatment under an oxidizing atmosphere, silicon oxide which grows by reaction of an oxygen radical, chemical oxide formed using an oxidative chemical solution, or the like can be used. For the insulating layer 104, an insulating layer including a siloxane (Si—O—Si) bond may be used. In addition, the organic silane gas and an oxygen radical or a nitrogen radical may be reacted, and the insulating layer 104 may be formed.

The insulating layer 104 which forms a smooth surface and has a hydrophilic surface is provided at a thickness of 5 nm to 500 nm, preferably, 10 nm to 200 nm. If this thickness is used, it is possible to smooth the roughness of the surface of a film to be formed and to obtain smoothness of the growth surface of the film. In addition, distortion of the supporting substrate and the semiconductor layer that are to be bonded together can be reduced. The surface of the insulating layer 104 is preferably set as follows: preferably, arithmetic mean roughness Ra is less than 0.8 nm and root-mean-square roughness Rms is less than 0.9 nm; more preferably, Ra is 0.4 nm or less and Rms is 0.5 nm or less; still preferably, Ra is 0.3 nm or less and Rms is 0.4 nm or less. For example, Ra is 0.27 nm and Rms is 0.34 mm. In this specification, Ra is arithmetic mean roughness, Rms is root-mean-square roughness, and the measurement range is 2 $\mu m^2$ or 10 $\mu m^2$.

A silicon oxide film which is similar to the insulating layer 104 may also be provided for the supporting substrate 101. That is, when a semiconductor layer 102 is bonded to the supporting substrate 101, a strong bond of the insulating layer 104 and the semiconductor layer 102 can be formed by providing the insulating layer 104 that is formed of a silicon oxide film which preferably uses organic silane as a process material for one surface or both surfaces that form a bond.

Figure 3C:
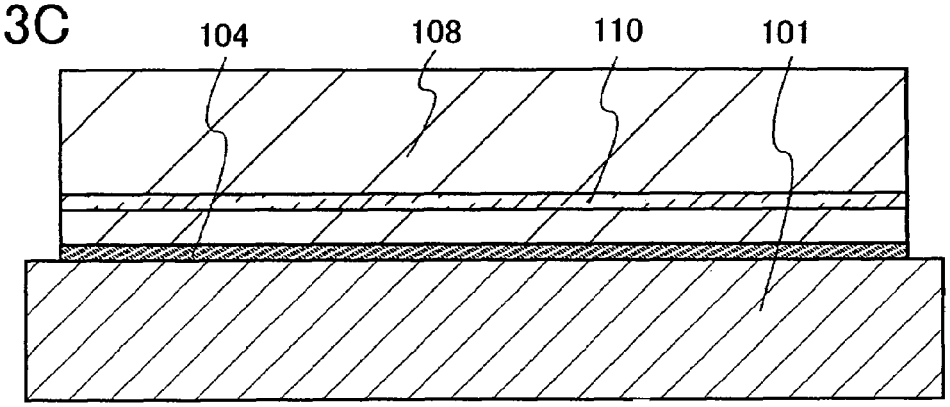

In FIG. 3C, a mode is shown in which the supporting substrate 101 and the surface of the insulating layer 104 which is formed over the semiconductor substrate 108 are in close contact with each other and bonded. Surfaces of the supporting substrate 101 and the insulating layer 104 of the semiconductor substrate 108 at which a bond is formed are cleaned sufficiently. The surfaces may be cleaned by megasonic cleaning. In addition, the surfaces may be cleaned with ozone water after megasonic cleaning, an organic substance may be removed, and the hydrophilicity of the surfaces may be improved.

By making the supporting substrate 101 and the insulating layer 104 face each other and pressing one part thereof from the outside, the supporting substrate 101 and the insulating layer 104 attract each other by increase in van der Waals forces or contribution of hydrogen bonding due to local reduction in distance between the bonding surfaces. Further, since the distance between the supporting substrate 101 and the insulating layer 104 in an adjacent region, which also face each other, is reduced, a region which is strongly influenced by van der Waals forces or a region to which hydrogen bonding contributes is widened. Accordingly, bonding of the supporting substrate 101 and the insulating layer 104 proceeds and spreads to the entire bonding surfaces. For example, a pressure of about 100 kPa to 5000 kPa may be used.

Surfaces to be bonded may be activated so as to form a good bonding. For example, surfaces where a bond is formed are irradiated with an atomic beam or an ion beam. When an atomic beam or an ion beam is used, an inert gas (such as argon or the like) neutral atom beam, or an inert gas ion beam can be used. In addition, plasma irradiation or radical treatment is performed. By such surface treatment, a bond between heterogeneous materials is easily formed even at a temperature of 200° C. to 400° C.

In order to improve bonding strength of a bond interface between the supporting substrate and the insulating layer, heat treatment is preferably performed. For example, heat treatment is performed in a temperature condition of 70° C. to 350° C. (e.g., at 200° C. for 2 hours) in an oven, a furnace, or the like.

Figure 3D:
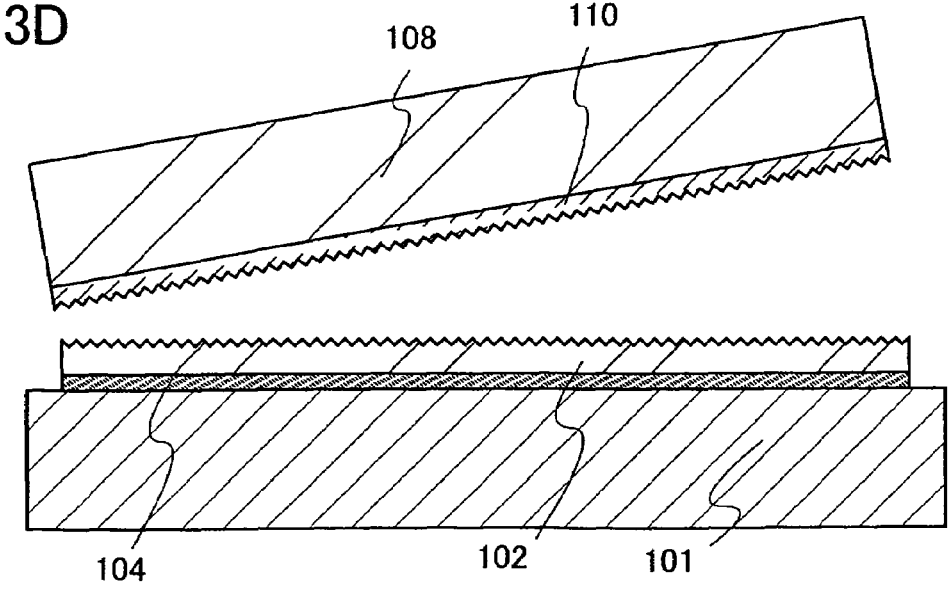

In FIG. 3D, after the supporting substrate 101 and the semiconductor substrate 108 are attached to each other, heat treatment is performed, and the semiconductor substrate 108 is separated from the supporting substrate 101 with the embrittlement layer 110 serving as a cleavage plane. When heat treatment is performed at, for example, 400° C. to 700° C., a change in the volume of microvoids formed in the embrittlement layer 110 occurs, which enables cleavage along the embrittlement layer 110. Since the insulating layer 104 is bonded to the supporting substrate 101, the semiconductor layer 102 having the same crystallinity as that of the semiconductor substrate 108 remains over the supporting substrate 101.

Heat treatment in a temperature range of 400° C. to 700° C. may be continuously performed with the same device as the above heat treatment for improving the bonding strength or with another device. For example, after heat treatment in a furnace at 200° C. for 2 hours, a temperature is increased to near 600° C. and held for 2 hours, a temperature is decreased to a temperature ranging from room temperature to 400° C., and then the substrate is taken out of the furnace. Alternatively, heat treatment may be performed with a temperature increasing from room temperature. Further, after heat treatment may be performed in a furnace at 200° C. for 2 hours, heat treatment may be performed in a temperature range of 600° C. to 700° C. with a rapid thermal annealing (RTA) device for 1 minute to 30 minutes (e.g., at 600° C. for 7 minutes, or at 650° C. for 7 minutes).

By heat treatment in a temperature range of 400° C. to 700° C., bonding between the insulating layer and the supporting substrate changes from hydrogen bonding to covalent bonding, and an element added to the embrittlement layer is segregated and then pressure of the element rises, whereby the semiconductor layer can be separated from the semiconductor substrate. After the heat treatment, the supporting substrate and the semiconductor substrate are in a state where one of the supporting substrate and the semiconductor substrate is provided over the other, and the supporting substrate and the semiconductor substrate can be separated from each other without application of large force. For example, a substrate provided over the other is lifted by a vacuum chuck, so that the substrate can be easily separated. At this time, if a substrate on a lower side is fixed with a vacuum chuck or a mechanical chuck, both the supporting substrate and the semiconductor substrate can be separated from each other without horizontal alignment.

Note that, in FIGS. 1A to 1C, 2A to 2D, 3A to 3D, and 4A to 4C, an example is shown in which the semiconductor substrate 108 is smaller than the supporting substrate 101; however, the present invention is not limited thereto, and the semiconductor substrate 108 and the supporting substrate 101 may have the same size or the semiconductor substrate 108 may be larger than the supporting substrate 101.

Figure 4A:
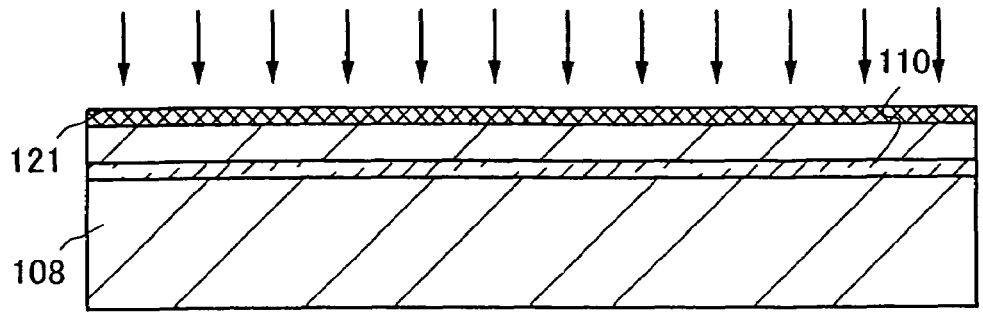
FIGS. 4A to 4C are diagrams illustrating a method of manufacturing an SOI substrate of the present invention.
Figure 4B:
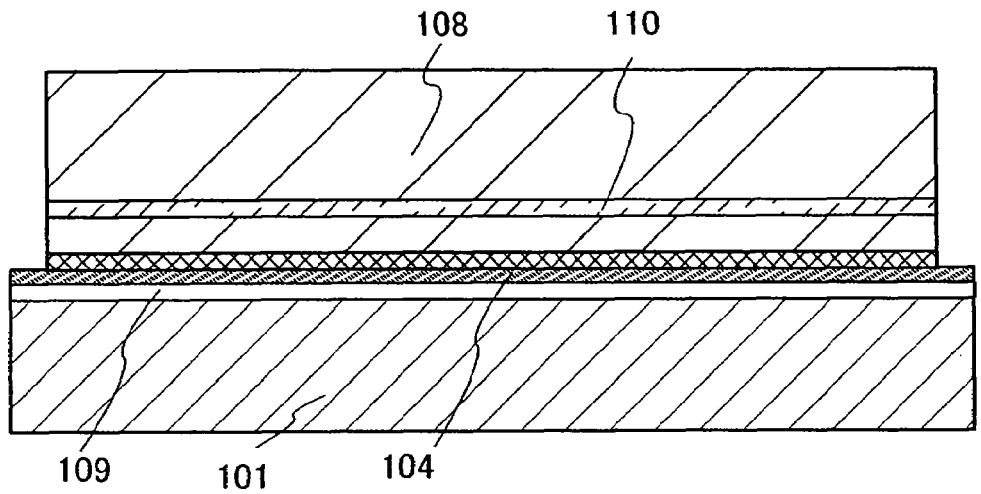
Figure 4C:
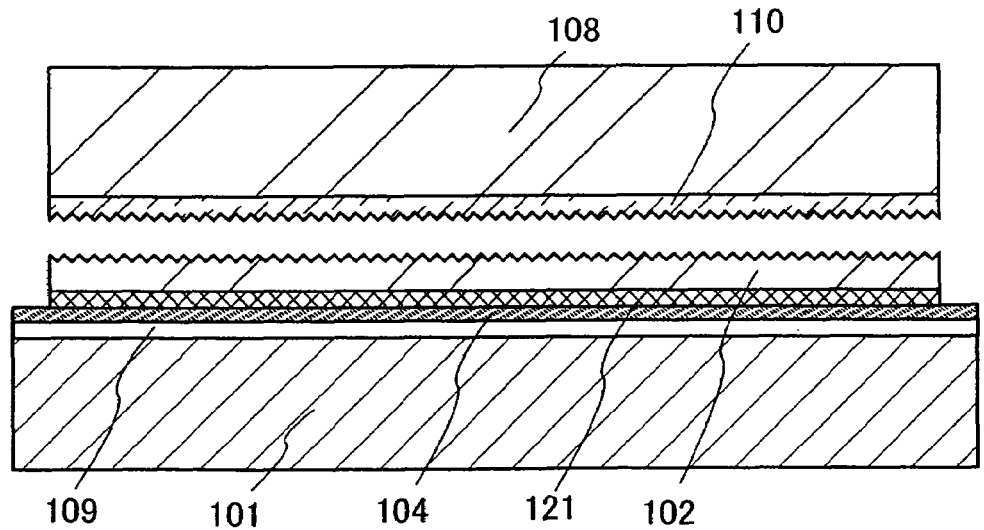

In FIGS. 4A to 4C, manufacturing steps are shown in which an insulating layer is provided on a supporting substrate and a single-crystal semiconductor layer is formed. In FIG. 4A, a step is shown in which the semiconductor substrate 108 provided with a silicon oxide film as a protective layer 121 is irradiated with ions accelerated by an electric field to form the embrittlement layer 110 at a given depth. Ion irradiation is performed similarly to the case of FIG. 3A. The protective layer 121 is formed on the surface of the semiconductor substrate 108, thereby preventing the surface from being damaged by ion irradiation and planarity from being lost. In addition, the protective layer 121 has an effect of preventing an impurity in the supporting substrate from diffusing to the semiconductor layer 102 formed using the semiconductor substrate 108.

In FIG. 4B, a step is shown in which the supporting substrate 101 provided with a blocking layer 109 and the insulating layer 104, and the protective layer 121 of the semiconductor substrate 108 are arranged in contact with each other to form a bond. The bond is formed by arranging the insulating layer 104 over the supporting substrate 101 in contact with the protective layer 121 of the semiconductor substrate 108.

Then, the semiconductor substrate 108 is separated, as shown in FIG. 4C. Heat treatment by which a single-crystal semiconductor layer is separated is performed in a similar manner to the case of FIG. 3D. The temperature of the heat treatment in a bonding and separation step is less than or equal to that of the heat treatment that is performed in advance on the supporting substrate 101. In this manner, a semiconductor substrate shown in FIG. 4C can be obtained.

As the supporting substrate 101, a substrate having insulating properties or a substrate having an insulating surface can be used, and it is possible to use any of a variety of glass substrates that are used in the electronics industry and are referred to as non-alkali glass substrates, such as an aluminosilicate glass substrate, an aluminoborosilicate glass substrate, or a barium borosilicate glass substrate. In addition, a quartz substrate, a ceramic substrate, a sapphire substrate, a metal substrate whose surface is coated with an insulating layer, or the like can be used.

With the above process, as shown in FIG. 1A, the insulating layer 104 is provided over the supporting substrate 101, which is a substrate having an insulating surface, and the semiconductor layer 102, which is separated from the semiconductor substrate 108, is formed.

A crystal defect is generated in the semiconductor layer 102 of an SOI substrate by a separation step and an ion irradiation step, and planarity of the surface is lost, whereby unevenness of the surface is formed. When a transistor is formed as a semiconductor element using the semiconductor layer 102, it is difficult to form a thin gate insulating layer with high insulation voltage over a surface of the semiconductor layer 102 with such an unevenness. In addition, if the semiconductor layer 102 has a crystal defect, performance and reliability of the transistor are affected, and for example, a localized interface state density at a interface of the semiconductor layer 102 and the gate insulating layer increases.

Figure 1B:
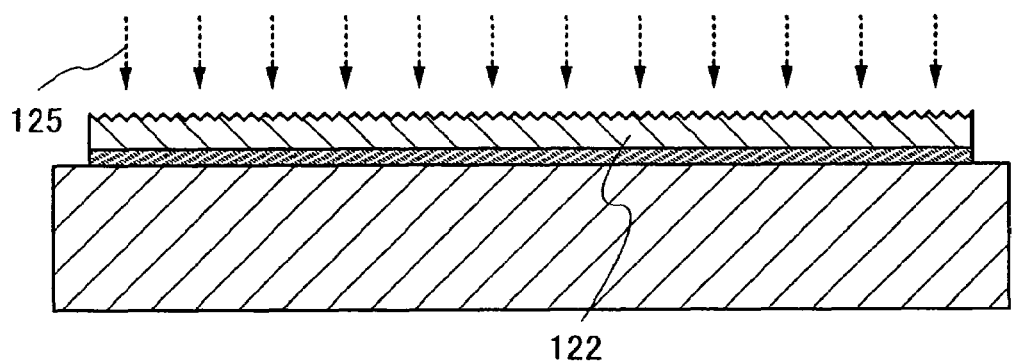

Such a semiconductor layer 102 is irradiated with electromagnetic waves 125 in the present invention, and a semiconductor layer 122 with reduced crystal defect is obtained (see FIG. 1B). At least part of a region of the semiconductor layer is melted by irradiation with electromagnetic waves, whereby a crystal defect in the semiconductor layer can be reduced. Note that an oxide film (a film which has been naturally oxidized or a chemical oxide film) formed on the surface of the semiconductor layer is preferably removed using dilute hydrofluoric acid before irradiation with electromagnetic waves.

Any electromagnetic waves may be used as long as they provide high energy to the semiconductor layer, and a laser beam can be preferably used.

Wavelengths of electromagnetic waves are wavelengths that are absorbed by the semiconductor layer. The wavelengths can be determined by considering the skin depth of electromagnetic waves or the like. For example, the wavelengths of electromagnetic waves can be 190 nm to 600 nm. In addition, electromagnetic wave energy can be determined by considering the wavelengths of electromagnetic waves, the skin depth of electromagnetic waves, the thickness of the semiconductor layer to be irradiated, or the like.

A laser emitting the laser beam can be a continuous wave laser, a pseudo continuous wave laser, or a pulsed laser. A pulsed laser is preferably used to melt the semiconductor layer partly. For example, there are a gas laser such as an excimer laser like a KrF laser, an Ar laser, a Kr laser, or the like; and a solid-state laser such as a YAG laser, a $YVO_4$ laser, a YLF laser, a $YAlO_3$ laser, a $GdVO_4$ laser, a KGW laser, a KYW laser, an alexandrite laser, a Ti:sapphire laser, a $Y_2O_3$ laser, or the like. An excimer laser is a pulsed laser, and some solid-state lasers such as a YAG laser or the like can be used as a continuous wave laser, a pseudo continuous wave laser, and a pulsed laser. Note that in a solid-state laser, the second to fifth harmonics of a fundamental wave can be preferably used. In addition, a semiconductor laser such as GaN, GaAs, GaAlAs, InGaAsP, or the like can be used.

If the semiconductor layer can be irradiated with electromagnetic wave energy, lamp light may be used. For example, light emitted from an ultraviolet lamp, a black light, a halogen lamp, a metal halide lamp, a xenon arc lamp, a carbon arc lamp, a high pressure sodium lamp, or a high pressure mercury lamp may be used. A flash annealing with the use of the above lamp light may be used. Since a flash annealing which is performed by preferably using a halogen lamp, a xenon lamp, or the like takes very short treatment time, heating up of the supporting substrate can be suppressed.

A shutter; a reflector such as a mirror, a half mirror, or the like; an optical system including a cylindrical lens, a convex lens, or the like may be provided to adjust the shape or path of electromagnetic waves.

Note that, as for an irradiation method of electromagnetic waves, electromagnetic waves may be selectively emitted, or light (electromagnetic waves) to be emitted may be scanned in the XY directions. In this case, it is preferable to use a polygon mirror or a galvanometer mirror for an optical system.

For example, in the case where an XeCl excimer laser having a wavelength of 308 nm is used as electromagnetic waves and the semiconductor layer to be irradiated is a single-crystal silicon layer, the energy density of XeCl excimer laser to be given to the silicon layer may be set as appropriate in a range of 300 $J/cm^2$ to 450 $mJ/cm^2$ when the thickness of the silicon layer is 50 nm to 60 nm; the energy density to be given to the silicon layer may be set as appropriate in a range of 400 $J/cm^2$ to 650 $mJ/cm^2$ when the thickness of the silicon layer is 60 nm to 90 nm; and the energy density to be given to the silicon layer may be set as appropriate in a range of 450 $J/cm^2$ to 850 $mJ/cm^2$ when the thickness of the silicon layer is in a range of 90 nm to 150 nm.

Irradiation with electromagnetic waves can be performed in an atmosphere which contains oxygen such as an atmospheric atmosphere or in an inert atmosphere such as a nitrogen atmosphere. To perform irradiation with electromagnetic waves in an inert atmosphere, irradiation with electromagnetic waves may be performed in an airtight chamber, and an atmosphere in this chamber may be controlled. In the case where a chamber is not used, a nitrogen atmosphere can be formed by spraying nitrogen gas, an inert gas or the like on a surface to be irradiated with electromagnetic waves.

When the irradiation treatment with electromagnetic waves is performed in a nitrogen atmosphere which contains oxygen of 10 ppm or less, preferably, 6 ppm or less, the surface of the semiconductor layer can be relatively flat. On the other hand, when the irradiation treatment with electromagnetic waves is performed in an atmosphere which contains 10% or more oxygen, for example, in an atmospheric atmosphere, a crystal defect of the semiconductor layer can be reduced by the irradiation with lower energy than in the nitrogen atmosphere.

Figure 1C:
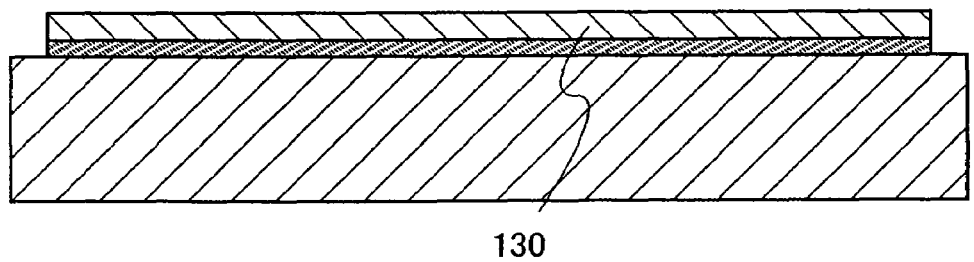

Further, the surface of the semiconductor layer 122 is polished by polishing treatment, and unevenness of the surface of the semiconductor layer 122 is reduced, whereby a semiconductor layer 130 with a planarized surface is obtained (see FIG. 1C). Therefore, an SOI substrate which has the semiconductor layer 130 in which a crystal defect is reduced by irradiation with electromagnetic waves and which has high planarity by polishing treatment can be formed. The thickness to be polished by polishing treatment may be set as appropriate in accordance with the thickness and the surface roughness of the semiconductor layer 122 before the polishing treatment.

Polishing treatment for the semiconductor layer which is irradiated with electromagnetic waves is performed in such a way that arithmetic mean roughness Ra of the surface of the semiconductor layer 130 is 1 nm or less and root-mean-square roughness Rms thereof is 2 nm or less. The surface of the semiconductor layer 130 is preferably set as follows: preferably, Ra is less than 0.8 nm and Rms is less than 0.9 nm; more preferably, Ra is 0.4 nm or less and Rms is 0.5 nm or less; still preferably, Ra is 0.3 nm or less and Rms is 0.4 nm or less.

For polishing treatment, a chemical mechanical polishing (CMP) method or a liquid jet polishing method can be used. Note that the surface of the semiconductor layer is cleaned and purified before polishing treatment. Cleaning may be performed by using megasonic cleaning, two-fluid jet cleaning, or the like; and dust or the like of the surface of the semiconductor layer is removed by cleaning. In addition, it is preferable to remove a film that has been naturally oxidized or the like over the surface of the semiconductor layer by using dilute hydrofluoric acid and to expose the semiconductor layer surface. As polishing treatment, when a CMP method is used, slurry in which fine particles such as silica or the like having a grain size of 10 nm to 200 nm are dispersed in an alkaline solution of pH 10 to 14 is used. The pressure to be applied to the semiconductor layer by a CMP method is preferably 0.001 MPa to 0.1 MPa, and more preferably, 0.005 MPa to 0.05 MPa. The spindle rotation speed (the number of rotations) is preferably 10 rpm to 100 rpm, and more preferably, 20 rpm to 60 rpm. The table rotation speed (the number of rotations) is preferably 5 rpm to 80 rpm, and more preferably, 10 rpm to 40 rpm. As an example of process conditions of a CMP method, slurry of pH 12 that contains silica having a grain size of 60 nm is preferably used with a pressure of 0.01 MPa, with a spindle rotation speed (the number of rotations) of 20 rpm, and with a table rotation speed (the number of rotations) of 20 rpm.

In addition, polishing treatment (or etching treatment) may be performed on the surface of the semiconductor layer before irradiation with electromagnetic waves. In FIGS. 2A to 2D, an example is shown in which polishing treatment (or etching treatment) is performed on the surface of the semiconductor layer 102 before irradiation with electromagnetic waves.

Figure 2A:
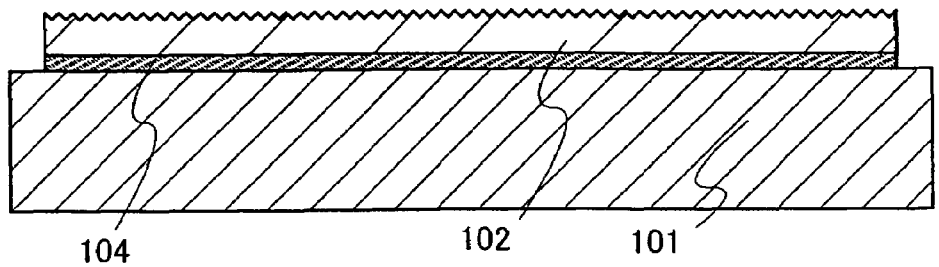
FIGS. 2A to 2D are diagrams illustrating a method of manufacturing an SOI substrate of the present invention.

FIG. 2A corresponds to FIG. 1A. The insulating layer 104 is provided and the semiconductor layer 102 separated from the semiconductor substrate 108 is formed over the supporting substrate 101. As shown in FIG. 2A, the surface of the semiconductor layer 102 has poor planarity and unevenness. Note that, in FIGS. 1A to 1C, 2A to 2D, 3A to 3D, and 4A to 4C, the unevenness shape of the surface of the semiconductor layer 102 characteristically illustrates a rough surface and poor planarity, and a real shape is not limited thereto.

Figure 2B:
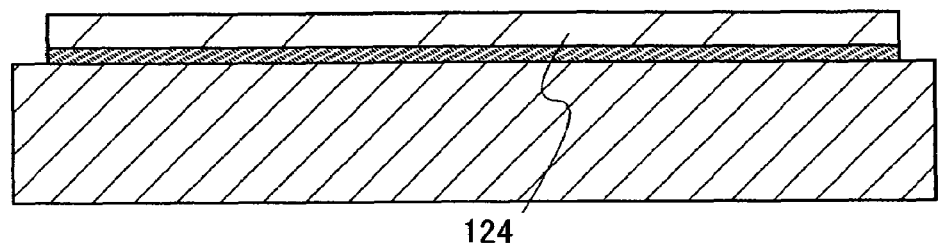
Figure 2C:
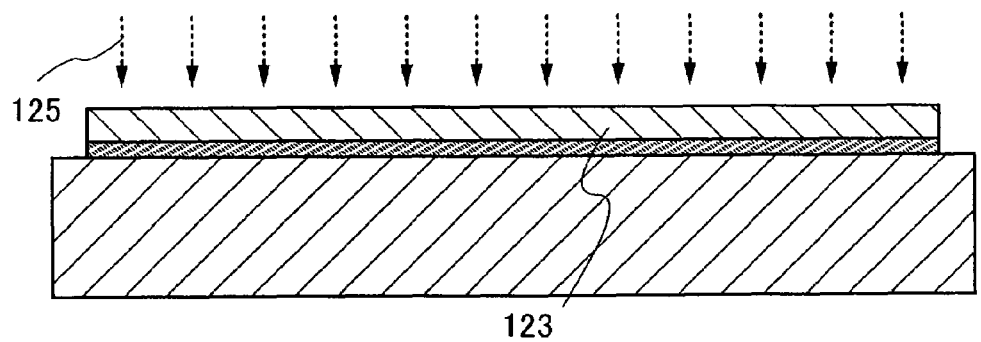

The surface of the semiconductor layer 102 is polished by first polishing treatment, and the unevenness of the surface of the semiconductor layer 102 is reduced to form a semiconductor layer 124 with a planarized surface (see FIG. 2B). Note that, when polishing treatment is performed plural times to the semiconductor layer after being transposed, before and after an irradiation step using electromagnetic waves, polishing treatment before irradiation with electromagnetic waves is referred to as first polishing treatment, and polishing treatment after irradiation with electromagnetic waves is referred to as second polishing treatment.

The thickness to be polished by polishing treatment may be set, as appropriate, in accordance with the thickness and the degree of the surface roughness of the semiconductor layer 102 before polishing treatment. For example, if the semiconductor layer 102 has a thickness of 120 nm, polishing may be performed on the semiconductor layer 102 by 20 nm to 80 nm, preferably by 40 nm to 70 nm, and as an example, the semiconductor layer 102 is polished by 65 nm and the thickness of the semiconductor layer after polishing is 55 nm. Alternatively, if the semiconductor layer 102 has a thickness of 70 nm, polishing may be performed on the semiconductor layer 102 by 5 nm to 40 nm, preferably, by 10 nm to 30 nm, and as an example, the semiconductor layer 102 is polished by 20 nm and the thickness of the semiconductor layer after polishing is 50 nm.

Instead of polishing treatment which controls thickness before irradiation with electromagnetic waves, etching treatment may be performed. The etching treatment can be performed by a wet etching method, a dry etching method, or a combination of a wet etching method and a dry etching method.

The semiconductor layer 124 whose surface is planarized by polishing treatment (or etching treatment) is irradiated with the electromagnetic waves 125, whereby a semiconductor layer 123 is obtained. At least part of the semiconductor layer 123 is melted by irradiation with electromagnetic waves, and a crystal defect in the semiconductor layer 123 is reduced by recrystallization.

As shown in FIGS. 2A to 2D, when polishing treatment is performed on the semiconductor layer before an irradiation step using electromagnetic waves, the following effects can be obtained. Polishing treatment can planarize the surface of the semiconductor layer and control the thickness of the semiconductor layer. The surface of the semiconductor layer is planarized, whereby heat capacity of the semiconductor layer can be uniform in an irradiation step using electromagnetic waves, and uniform crystals can be formed by performing a uniform heating and cooling step or a uniform melting and solidification step. In addition, in polishing treatment (or etching treatment instead of polishing treatment), the thickness of the semiconductor layer is set at an appropriate value for absorbing electromagnetic wave energy; thus, electromagnetic wave energy can be efficiently provided to the semiconductor layer. Further, since the surface of the semiconductor layer has many crystal defects, the surface with many crystal defects is removed so that a crystal defect in the semiconductor layer after irradiation with electromagnetic waves can be reduced.

Figure 2D:
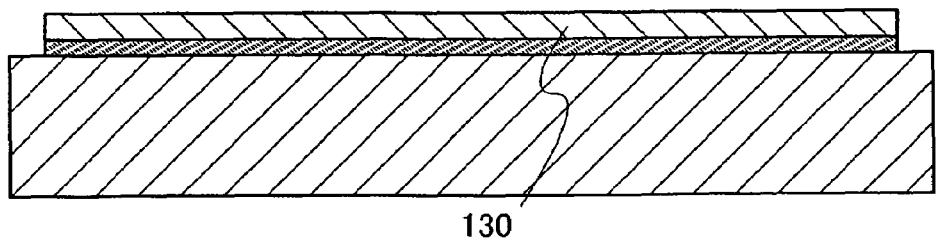

Second polishing treatment used to further polish the surface of the semiconductor layer 123 in which crystallinity is improved by irradiation with electromagnetic waves, and the semiconductor layer 130 is formed (see FIG. 2D). Polishing treatment is performed after irradiation with electromagnetic waves, so that unevenness of the surface of the semiconductor layer 123 due to irradiation with electromagnetic waves can be reduced, and the semiconductor layer 130 with high planarity can be obtained.

As described above, in this embodiment mode, an SOI substrate having a semiconductor layer in which a crystal defect is reduced by irradiation with electromagnetic waves and which has high planarity by polishing treatment can be formed.

A semiconductor element such as a transistor or the like is formed using the semiconductor layer 130 formed over the SOI substrate, whereby a gate insulating layer can be made to be thin and the localized interface state density at an interface of the semiconductor layer 130 and the gate insulating layer can be reduced. In addition, the thickness of the semiconductor layer 130 is made to be small, whereby a transistor of complete depletion type can be formed using a single-crystal semiconductor layer over the supporting substrate.

In this embodiment mode, when a single-crystal silicon substrate is used for the semiconductor substrate 108, a single-crystal silicon layer can be obtained as the semiconductor layer 130. In addition, in a method of manufacturing an SOI substrate in this embodiment mode, a process temperature can be set at 700° C. or less; therefore, a glass substrate can be used as the supporting substrate 101. That is, similarly to the conventional thin film transistor, a transistor can be formed over a glass substrate and a single-crystal silicon layer can be used for the semiconductor layer with which the transistor is formed. These make it possible to form a transistor with high performance and high reliability in which high speed operation is possible and which can be driven with a low subthreshold value, high field effect mobility, and low consumption voltage can be formed over a supporting substrate such as a glass substrate or the like.

Therefore, a semiconductor device which has high performance and high reliability can be manufactured with high yield.

Embodiment Mode 2

In this embodiment mode, a method of manufacturing a CMOS (complementary metal oxide semiconductor) will be described as an example of a method of manufacturing a semiconductor device including a semiconductor element having high performance and high reliability with high yield with reference to FIGS. 5A to 5E and 6A to 6D. Note that repetitive descriptions for the same components as or components having similar functions to the components in Embodiment Mode 1 are omitted.

Figure 5A:
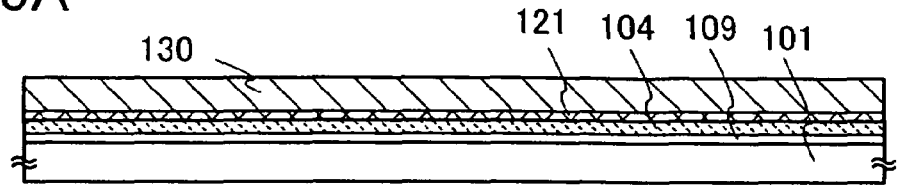
FIGS. 5A to 5E are diagrams illustrating a method of manufacturing a semiconductor device of the present invention.

In FIG. 5A, the blocking layer 109, the insulating layer 104, the protective layer 121, and the semiconductor layer 130 are formed over the supporting substrate 101. The semiconductor layer 130 corresponds to FIG. 1C or 2D; and the blocking layer 109, the insulating layer 104, and the protective layer 121 correspond to FIG. 4C. Note that here, although an example is shown in which an SOI substrate having a structure shown in FIG. 5A is used, an SOI substrate having another structure shown in this specification can also be used.

Since the semiconductor layer 130 is separated from the semiconductor substrate 108 and subjected to treatment of irradiation with electromagnetic waves and polishing treatment, the semiconductor layer 130 in which crystal defect is reduced and planarity is high is obtained.

In the semiconductor layer 130, a p-type impurity such as boron, aluminum, gallium, or the like or an n-type impurity such as phosphorus, arsenic, or the like is preferably added to a formation region of an n-channel field-effect transistor or a p-channel field-effect transistor. In other words, a p-type impurity is added to a formation region of an n-channel field-effect transistor or an n-type impurity is added to a formation region of a p-channel field-effect transistor, whereby a so-called well region is formed. The dose of impurity ions may range from about $1 \times 10^{12}$ cm$^2$ to $1 \times 10^{14}$ cm$^2$. Furthermore, in the case of controlling the threshold voltage of the field-effect transistor, a p-type or n-type impurity may be added to the well region.

Figure 5B:
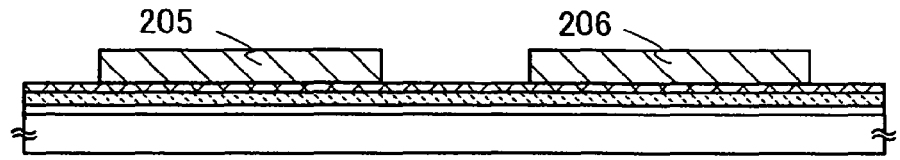

The semiconductor layer 130 is etched into island shapes in accordance with the arrangement of the semiconductor element to form isolated semiconductor layers 205 and 206 (see FIG. 5B).

An oxide film over the semiconductor layer is removed, and a gate insulating layer 207 that covers the semiconductor layers 205 and 206 is formed. Since the semiconductor layers 205 and 206 in this embodiment mode have high planarity, even if a gate insulating layer formed over the semiconductor layers 205 and 206 is a thin gate insulating layer, the gate insulating layer can cover the semiconductor layers 205 and 206 with favorable coverage. Therefore, a degradation of the gate insulating layer due to a defective coverage of the gate insulating layer can be prevented, and a semiconductor device having high reliability can be manufactured with high yield. The thinned gate insulating layer 207 is effective in operating a thin film transistor with low voltage at high speed.

The gate insulating layer 207 may be formed of silicon oxide or a stacked structure of silicon oxide and silicon nitride. The gate insulating layer 207 may be formed by depositing an insulating film by a plasma CVD method or a low pressure CVD method or is preferably formed by solid phase oxidation or solid phase nitridation by plasma treatment. This is because a gate insulating layer which is formed using a semiconductor layer that is oxidized or nitrided by plasma treatment is dense and has high insulation voltage and is excellent in reliability.

As the gate insulating layer 207, a high permittivity material such as zirconium dioxide, hafnium oxide, titanium dioxide, tantalum pentoxide, or the like may be used. If a high permittivity material is used for the gate insulating layer 207, gate leakage current can be reduced.

Figure 5C:
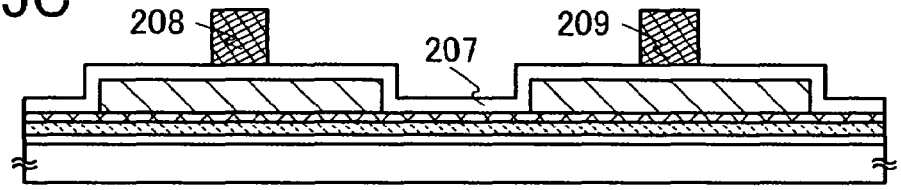
Figure 5D:
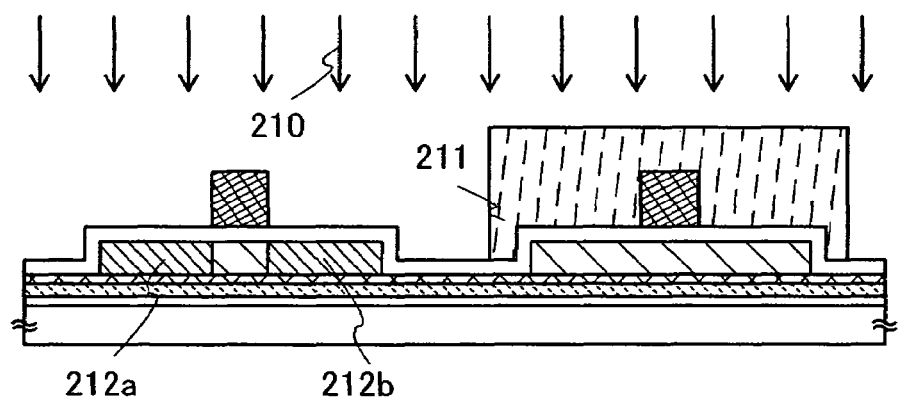
Figure 5E:
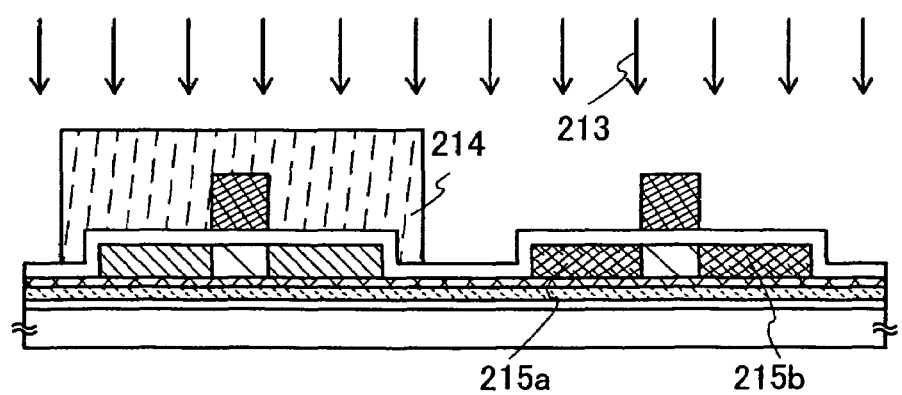

A gate electrode layer 208 and a gate electrode layer 209 are formed over the gate insulating layer 207 (see FIG. 5C). The gate electrode layers 208 and 209 can be formed by a sputtering method, an evaporation method, a CVD method, or the like. The gate electrode layers 208 and 209 may be formed of an element selected from tantalum (Ta), tungsten (W), titanium (Ti), molybdenum (Mo), aluminum (Al), copper (Cu), chromium (Cr), or neodymium (Nd); or an alloy material or a compound material that contains any of these elements as its main component. In addition, as the gate electrode layers 208 and 209, a semiconductor film typified by a polycrystalline silicon film doped with an impurity element such as phosphorus or the like, or an AgPdCu alloy may be used.

A mask 211 that covers the semiconductor layer 206 is formed. The mask 211 and the gate electrode layer 208 are used as masks, and an impurity element 210 that imparts n-type conductivity is added to form first n-type impurity regions 212a and 212b (see FIG. 5D). In this embodiment mode, phosphine (PH$_3$) is used as a doping gas that contains an impurity element. Here, doping is performed so that the first n-type impurity regions 212a and 212b contain an impurity element that imparts n-type conductivity at a concentration of about $1 \times 10^{17}$/cm$^3$ to $5 \times 10^{18}$/cm$^3$. In this embodiment mode, phosphorus (P) is used as an impurity element that imparts n-type conductivity.

Next, a mask 214 that covers the semiconductor layer 205 is formed. The mask 214 and the gate electrode layer 209 are used as masks, and an impurity element 213 that imparts p-type conductivity is added to form first p-type impurity regions 215a and 215b (see FIG. 5E). In this embodiment mode, diborane (B$_2$H$_6$) or the like is used as a doping gas that contains an impurity element because boron (B) is used as an impurity element.

Figure 6A:
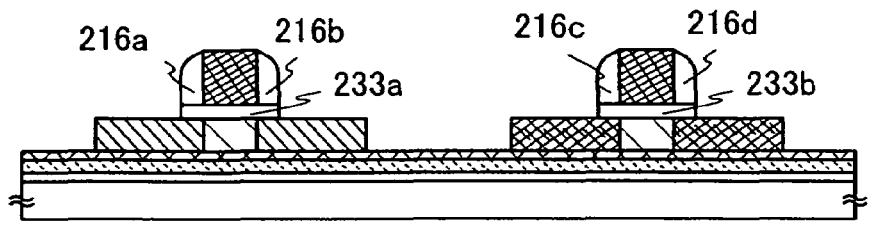
FIGS. 6A to 6D are diagrams illustrating a method of manufacturing a semiconductor device of the present invention.
Figure 6B:
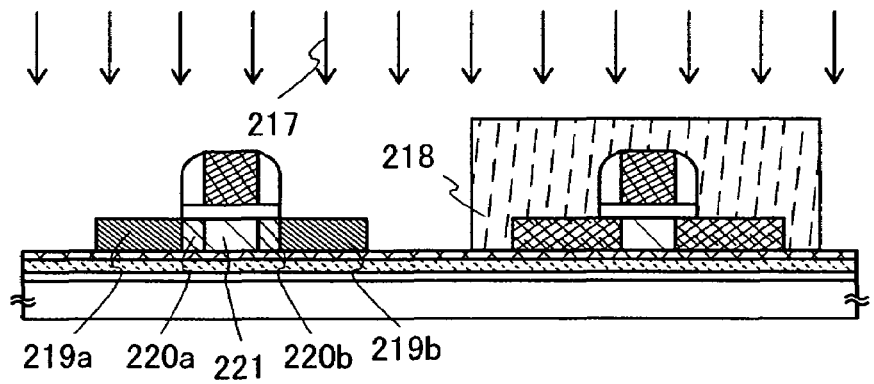
Figure 6C:
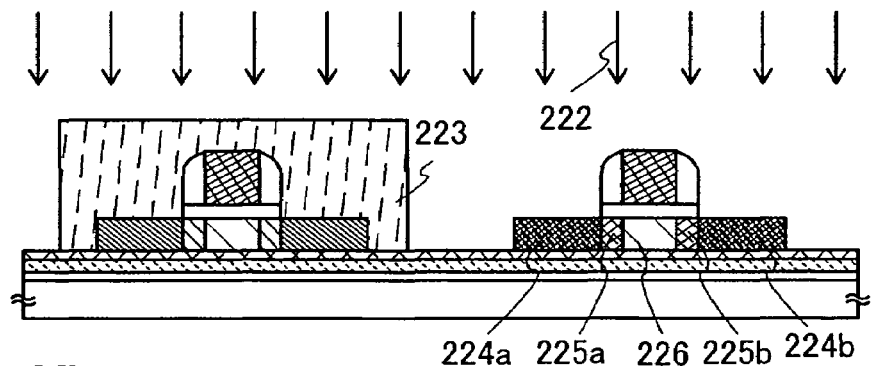

The mask 214 is removed, sidewall insulating layers 216a to 216d with a sidewall structure are formed on side surfaces of the gate electrode layers 208 and 209, and gate insulating layers 233a and 233b are formed (see FIG. 6A). The sidewall insulating layers 216a to 216d with a sidewall structure may be formed on the side surfaces of the gate electrode layers 208 and 209 in a self-aligning manner, in the following manner: an insulating layer covering the gate electrode layers 208 and 209 is formed and is processed by anisotropic etching using an RIE (reactive ion etching) method. Here, there is no particular limitation on the insulating layers and the insulating layers are preferably layers of silicon oxide with favorable step coverage, which are formed by reacting TEOS (tetraethyl orthosilicate), silane, or the like with oxygen, nitrous oxide, or the like. The insulating layers can be formed by a thermal CVD method, a plasma CVD method, a normal-pressure CVD method, a bias ECRCVD method, a sputtering method, or the like. The gate insulating layers 233a and 233b can be formed by using the gate electrode layers 208 and 209 and the sidewall insulating layers 216a to 216d as masks and by etching the gate insulating layer 207.

In this embodiment mode, in etching the insulating layer, portions of the insulating layer over the gate electrode layers are removed to expose the gate electrode layers. However, the sidewall insulating layers 216a to 216d may be formed to have a shape in which portions of the insulating layer over the gate electrode layers remain. In addition, a protective film may be formed over the gate electrode layers in a later step. By protecting the gate electrode layers in this manner, reduction of the gate electrode layers can be prevented in an etching processing. In the case of forming silicide in a source region and a drain region, since a metal film formed for formation of the silicide is not contact with the gate electrode layers, even when a material of the metal film can easily react with a material of the gate electrode layer, defects such as chemical reaction, diffusion, and the like can be prevented. Various etching methods such as a dry etching method or a wet etching method may be used for etching. In this embodiment mode, a dry etching method is used. As an etching gas, a chlorine-based gas typified by Cl$_2$, BCl$_3$, SiCl$_4$, CCl$_4$, or the like, a fluorine-based gas typified by CF$_4$, SF$_6$, NF$_3$, or the like, or O$_2$ can be used as appropriate.

Next, a mask 218 which covers the semiconductor layer 206 is formed. The mask 218, the gate electrode layer 208, and the sidewall insulating layers 216a and 216b are used as masks, and an impurity element 217 that imparts n-type conductivity is added to form second n-type impurity regions 219a and 219b and third n-type impurity regions 220a and 220b. In this embodiment mode, $PH_3$ is used as a doping gas that contains an impurity element. Here, the doping is performed so that the second n-type impurity regions 219a and 219b contain an impurity element that imparts n-type conductivity at a concentration of about $5\times10^{19}/cm^3$ to $5\times10^{20}/cm^3$. In addition, a channel formation region 221 is formed in the semiconductor layer 205 (see FIG. 6B).

The second n-type impurity regions 219a and 219b are high-concentration n-type impurity regions and function as a source and a drain. On the other hand, the third n-type impurity regions 220a and 220b are low-concentration impurity regions, or LDD (lightly doped drain) regions. Since the third n-type impurity regions 220a and 220b are formed in Loff regions, which are not covered with the gate electrode layer 208, off state current can be reduced. Accordingly, a semiconductor device with higher reliability and lower power consumption can be manufactured.

The mask 218 is removed, and a mask 223 that covers the semiconductor layer 205 is formed. The mask 223, the gate electrode layer 209, and the sidewall insulating layers 216c and 216d are used as masks, and an impurity element 222 that imparts p-type conductivity is added to form second p-type impurity regions 224a and 224b, and third p-type impurity regions 225a and 225b.

Doping is performed so that the second p-type impurity regions 224a and 224b contain an impurity element that imparts p-type conductivity at a concentration of about $1\times10^{20}/cm^3$ to $5\times10^{21}/cm^3$. In this embodiment mode, the third p-type impurity regions 225a and 225b are formed in a self-aligning manner by the sidewall insulating layers 216c and 216d so as to have a lower concentration than the second p-type impurity regions 224a and 224b. In addition, a channel formation region 226 is formed in the semiconductor layer 206 (see FIG. 6C).

The second p-type impurity regions 224a and 224b are high-concentration p-type impurity regions and function as a source and a drain. On the other hand, the third p-type impurity regions 225a and 225b are low-concentration impurity regions, or LDD (lightly doped drain) regions. Since the third p-type impurity regions 225a and 225b are formed in Loff regions, which are not covered with the gate electrode layer 209, off state current can be reduced. Accordingly, a semiconductor device with higher reliability and lower power consumption can be manufactured.

The mask 223 is removed, and heat treatment, strong light irradiation, or laser beam irradiation may be performed in order to activate the impurity element. At the same time as the activation, plasma damage to the gate insulating layer and plasma damage to an interface between the gate insulating layer and the semiconductor layer can be repaired.

Next, an interlayer insulating layer which covers the gate electrode layers and the gate insulating layers is formed. In this embodiment mode, a stacked structure of an insulating film 227 that contains hydrogen to serve as a protective film and an insulating layer 228 is employed. The insulating film 227 and the insulating layer 228 may be formed by using a silicon nitride film, a silicon nitride oxide film, a silicon oxynitride film, or a silicon oxide film by a sputtering method or a plasma CVD method. Alternatively, a single layer structure or a stacked structure of three or more layers using a different insulating film containing silicon may also be employed.

Further, a step in which heat treatment is performed at 300° C. to 550° C. for 1 to 12 hours in a nitrogen atmosphere and the semiconductor layer is hydrogenated is performed. Preferably, the temperature is 400° C. to 500° C. This step is a step for terminating a dangling bond of the semiconductor layer by hydrogen contained in the insulating film 227, which is an interlayer insulating layer. In this embodiment mode, heat treatment is performed at 410° C. for 1 hour.

The insulating film 227 and the insulating layer 228 can also be formed of a material selected from aluminum nitride (AlN), aluminum oxynitride (AlON), aluminum nitride oxide having a higher content of nitrogen than that of oxygen (AlNO), aluminum oxide, diamond-like carbon (DLC), nitrogen-containing carbon (CN), or other substances containing an inorganic insulating material. A siloxane resin may also be used. The siloxane resin is a resin including a Si—O—Si bond. Siloxane has a skeletal structure formed of a bond of silicon (Si) and oxygen (O). As a substituent, an organic group containing at least hydrogen (e.g., an alkyl group or an aryl group) or a fluoro group may be used. In addition, as a substituent, both an organic group containing at least hydrogen and a fluoro group may also be used. Further, an organic insulating material such as polyimide, acrylic, polyamide, polyimide amide, resist, benzocyclobutene, or polysilazane may also be used. A coating film with a favorable planarity formed by a coating method may also be used.

The insulating film 227 and the insulating layer 228 can be formed by using dipping, spray coating, a doctor knife, a roll coater, a curtain coater, a knife coater, a CVD method, an evaporation method, or the like. The insulating film 227 and the insulating layer 228 may also be formed by a droplet discharge method. A droplet discharge method requires less material solution. In addition, a method capable of transferring or drawing a pattern similarly to a droplet discharge method, for example, a printing method (a method of forming a pattern such as screen printing, offset printing, or the like) can also be used.

Next, contact holes (openings) which reach the semiconductor layers are formed in the insulating film 227 and the insulating layer 228 using a mask made of a resist. Etching may be performed once or plural times depending on selectivity of a material to be used. The insulating film 227 and the insulating layer 228 are partly removed by the etching to form the openings which reach the second n-type impurity regions 219a and 219b and the second p-type impurity regions 224a and 224, which are source regions and drain regions. The etching may be performed by wet etching, dry etching, or both wet etching and dry etching. A hydrofluoric-acid-based solution such as a mixed solution of ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate. Further, an inert gas may be added to an etching gas to be used. As an inert element to be added, one or a plurality of elements selected from He, Ne, Ar, Kr, or Xe can be used.

A conductive film is formed so as to cover the openings, and the conductive film is etched to form wiring layers 229a, 229b, 230a, and 230b which function as source and drain electrode layers which are electrically connected to parts of source regions and drain regions. The wiring layers can be formed by forming a conductive film by a PVD method, a CVD method, an evaporation method, or the like, and then, etching the conductive film into a desired shape. Further, a conductive film can be selectively formed in a predetermined position by a droplet discharge method, a printing method, an electroplating method, or the like. Moreover, a reflow method or a damascene method may also be used. As a material for the wiring layers, metal such as Ag, Au, Cu, Ni, Pt, Pd, Ir, Rh, W, Al, Ta, Mo, Cd, Zn, Fe, Ti, Zr, Ba, or the like; Si or Ge; or an alloy or nitride thereof can be used. A stacked structure of these materials may also be employed.

Figure 6D:
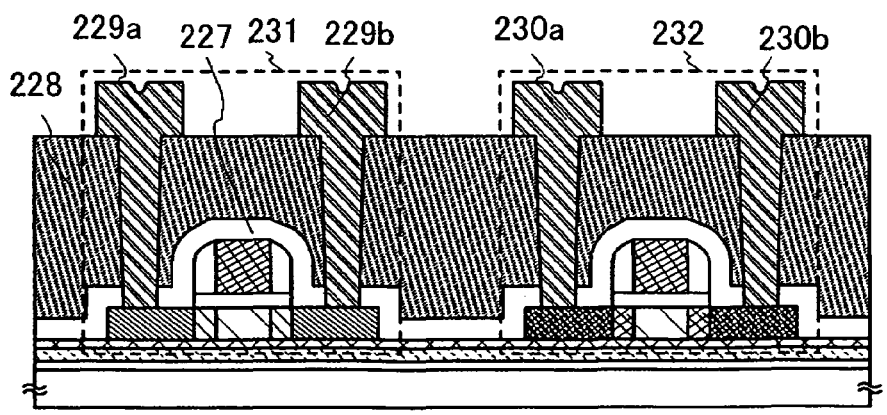

Through the above process, a semiconductor device having a CMOS structure which includes a thin film transistor 231 which is an n-channel thin film transistor, and a thin film transistor 232 which is a p-channel thin film transistor, can be formed (see FIG. 6D). Although not shown in the drawings, a CMOS structure is described in this embodiment mode; therefore, the thin film transistor 231 and the thin film transistor 232 are electrically connected to each other.

A structure of the thin film transistor is not limited to this embodiment mode, and a single gate structure in which one channel formation region is formed, a double gate structure in which two channel formation regions are formed, or a triple gate structure in which three channel formation regions are formed may be employed.

In this embodiment mode as described above, a semiconductor device which has high performance and high reliability can be formed with high yield by using an SOI substrate that has a semiconductor layer in which a crystal defect is reduced by irradiation with electromagnetic waves and which has high planarity by polishing treatment.

Embodiment Mode 3

In this embodiment mode, an example of a method of manufacturing a semiconductor device (also referred to as a liquid crystal display device) having a display function as a semiconductor device having high performance and high reliability with high yield will be described with reference to FIGS. 7A and 7B. Specifically, a liquid crystal display device that includes a liquid crystal display element as a display element will be described.

FIG. 7A is a top view of a semiconductor device which is one mode of the present invention, and FIG. 7B is a cross-sectional view taken along a line C-D of FIG. 7A.

As shown in FIG. 7A, a pixel region 306 and driver circuit regions 304a and 304b which are scanning line driver circuits are sealed between a supporting substrate 310 and a counter substrate 395 with a sealant 392. In addition, a driver circuit region 307 which is a signal line driver circuit formed using a driver IC is provided over the supporting substrate 310. A transistor 375 and a capacitor 376 are provided in the pixel region 306. A driver circuit having transistors 373 and 374 is provided in the driver circuit region 304b. In the semiconductor device of this embodiment mode, the SOI substrate having high performance and high reliability using the present invention described in Embodiment Mode 1 is used.

In the pixel region 306, the transistor 375 to serve as a switching element is provided over a blocking layer 311, an insulating layer 314, and a protective layer 313. In this embodiment mode, a multi-gate thin film transistor (TFT) is used for the transistor 375, which includes a semiconductor layer having impurity regions functioning as source and drain regions, a gate insulating layer, a gate electrode layer having a two-layer structure, and source and drain electrode layers. The source or drain electrode layer is in contact with and electrically connected to the impurity region of the semiconductor layer and an electrode layer 320 which is used for a display element and also referred to as a pixel electrode layer.

Impurity regions in the semiconductor layer can be formed as high-concentration impurity regions and low-concentration impurity regions by controlling the concentration of the impurity element. A thin film transistor having low-concentration impurity regions is referred to as a transistor having an LDD (lightly doped drain) structure. Further, the low-concentration impurity regions may be formed to overlap with the gate electrode. A thin film transistor having such a structure is referred to as a transistor having a GOLD (gate overlapped LDD) structure. The polarity of the thin film transistor is to be an n-type by using phosphorus (P) or the like in the impurity regions. When p-channel thin film transistors are formed, boron (B) or the like may be added. After that, insulating films 317 and 318 are formed to cover the gate electrode and the like.

Further, in order to enhance a level of planarity, an insulating film 319 is formed as an interlayer insulating film. The insulating film 319 can be formed using an organic material, an inorganic material, or a stacked structure of them. For example, the insulating film 319 can be formed using a material such as silicon oxide, silicon nitride, silicon oxynitride, silicon nitride oxide, aluminum nitride, aluminum oxynitride, aluminum nitride oxide having a higher content of nitrogen than that of oxygen, aluminum oxide, diamond-like carbon (DLC), polysilazane, nitrogen-containing carbon, PSG (phosphosilicate glass), BPSG (borophosphosilicate glass), alumina, and other substances containing an inorganic insulating material. Further, an organic insulating material can also be used. The organic material can be either photosensitive or non-photosensitive. For example, polyimide, acrylic, polyamide, polyimide amide, resist, benzocyclobutene, a siloxane resin, or the like can be used.

Since a semiconductor layer used for a semiconductor element is formed similarly to the case of Embodiment Mode 1 of the preset invention, a single-crystal semiconductor layer separated from a single-crystal semiconductor substrate can be used as the semiconductor layer of the semiconductor device, and a pixel region and a driver circuit region can be formed over the same substrate. In that case, transistors in the pixel region 306 and transistors in the driver circuit region 304b are formed at the same time. Needless to say, the driver circuit region 307 may also be formed over the same substrate in a similar manner. Transistors used for the driver circuit region 304b form a CMOS circuit. Although the thin film transistors that form the CMOS circuit have a GOLD structure, an LDD structure like the transistor 375 can also be used.

Next, an insulating layer 381 which functions as an alignment film is formed so as to cover the electrode layer 320 used for a display element and the insulating film 319 by a printing method or a droplet discharge method. Note that when a screen printing method or an offset printing method is used, the insulating layer 381 can be formed selectively. After that, a rubbing treatment is performed. This rubbing treatment is not required to be performed depending on modes of liquid crystals, e.g., a VA mode. The same as the insulating layer 381 can be said for an insulating layer 383 which functions as an alignment film. Next, the sealant 392 is formed in a peripheral region of pixels by a droplet discharge method.

Then, the counter substrate 395, which has the insulating layer 383 that functions as the alignment film, an electrode layer 384 that is used for a display element and also referred to as a counter electrode layer, a colored layer 385 functioning as a color filter, and a polarizer 391 (also referred to as polarizing plate), is attached to the supporting substrate 310 that is a TFT substrate with a spacer 387 interposed therebetween. A gap between the two substrates is provided with a liquid crystal layer 382. The semiconductor device in this embodiment mode is a transmissive type. Therefore, a polarizer (a polarizing plate) 393 is also provided on the side opposite to the surface of the supporting substrate 310 having elements. The stacked structure of the polarizer and the colored layer is also not limited to that of FIGS. 7A and 7B and may be determined as appropriate depending on materials of the polarizer and the colored layer or conditions of a manufacturing process. The polarizer can be provided on the substrate with an adhesive layer. In addition, a filler may be mixed in the sealant and further, a light-shielding film (black matrix) or the like may be formed on the counter substrate 395. When the liquid crystal display device is formed to be a full-color display device, color filters and the like may be formed using materials which exhibit red (R), green (G), and blue (B) colors. On the other hand, when the liquid crystal display device is formed to be a monochrome display device, colored layers are not required. Alternatively, a colored layer may be formed of a material which exhibits at least one color. In addition, an anti-reflective film having an antireflective function may be provided on the viewing side of the semiconductor device. Further, the polarizing plate and the liquid crystal layer may be stacked with a retardation plate interposed therebetween.

Note that, when a successive additive color mixture method (a field sequential method) is employed in which RGB light-emitting diodes (LEDs) and the like are used as a backlight and color display is performed by a time division method, color filters are not required to be provided. The black matrix, which can reduce reflection of external light by wirings of transistors or CMOS circuits, is preferably provided so as to overlap with the transistors or the CMOS circuits. Note that the black matrix may also be provided so as to overlap with a capacitor, and in such a case, reflection of light by metal films of the capacitor can be prevented.

The liquid crystal layer can be formed by a dispenser method (a dripping method) or an injection method in which the supporting substrate 310 having elements and the counter substrate 395 are bonded first and then liquid crystals are injected into a space therebetween by using a capillary phenomenon. When handling a large-sized substrate to which the injection method is difficult to be applied, the dripping method is preferably used.

The spacer can be provided by dispersing particles with a size of several μm. In this embodiment mode, however, a method of forming a resin film over the entire surface, followed by etching is employed. After applying such a spacer material by a spinner, the material is subjected to light-exposure and development treatment, so that a given pattern is formed. Further, the material is heated at 150° C. to 200° C. in a clean oven or the like so as to be hardened. Although the shape of the spacer formed in the above manner can vary depending on the conditions of light-exposure and development treatment, the shape of the spacer is preferably a columnar shape with a flat top. This is because mechanical strength that is high enough as a semiconductor device can be secured when attaching the counter substrate to the TFT substrate. The shape of the spacer can also be conic or pyramidal, but the present invention is not limited thereto.

Next, an FPC 394 which is a connection wiring board is connected to a terminal electrode layer 378 that is electrically connected to the pixel region, with an anisotropic conductive layer 396 interposed therebetween. The FPC 394 functions to transmit signals and potentials from outside. Through the above process, a semiconductor device having a display function can be manufactured.

In the semiconductor device of this embodiment mode, as described in Embodiment Mode 1, an SOI substrate can be used which is provided with a semiconductor layer that is separated from a semiconductor substrate, bonded to a supporting substrate, and then subjected to irradiation with electromagnetic waves and polishing treatment so that crystal defects are reduced and high planarity is provided.

Therefore, a semiconductor device which has high performance and high reliability can be formed with high yield.

Embodiment Mode 4

A semiconductor device having a light-emitting element can be formed by applying the present invention, and the light-emitting element emits light by any one of bottom emission, top emission, and dual emission. This embodiment mode will describe an example of a method of manufacturing a semiconductor device in which a semiconductor device having a display function (also called a display device or a light-emitting device) is manufactured as a bottom-emission, dual-emission, or top-emission semiconductor device with high performance, high reliability, and high yield, with reference to FIGS. 8A and 8B, 9, and 10.

Figure 8A:
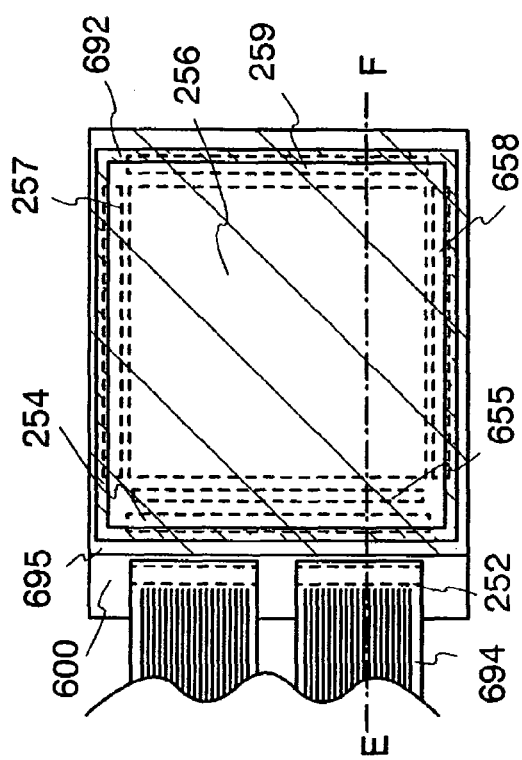
FIGS. 8A and 8B are diagrams illustrating a semiconductor device of the present invention.
Figure 8B:
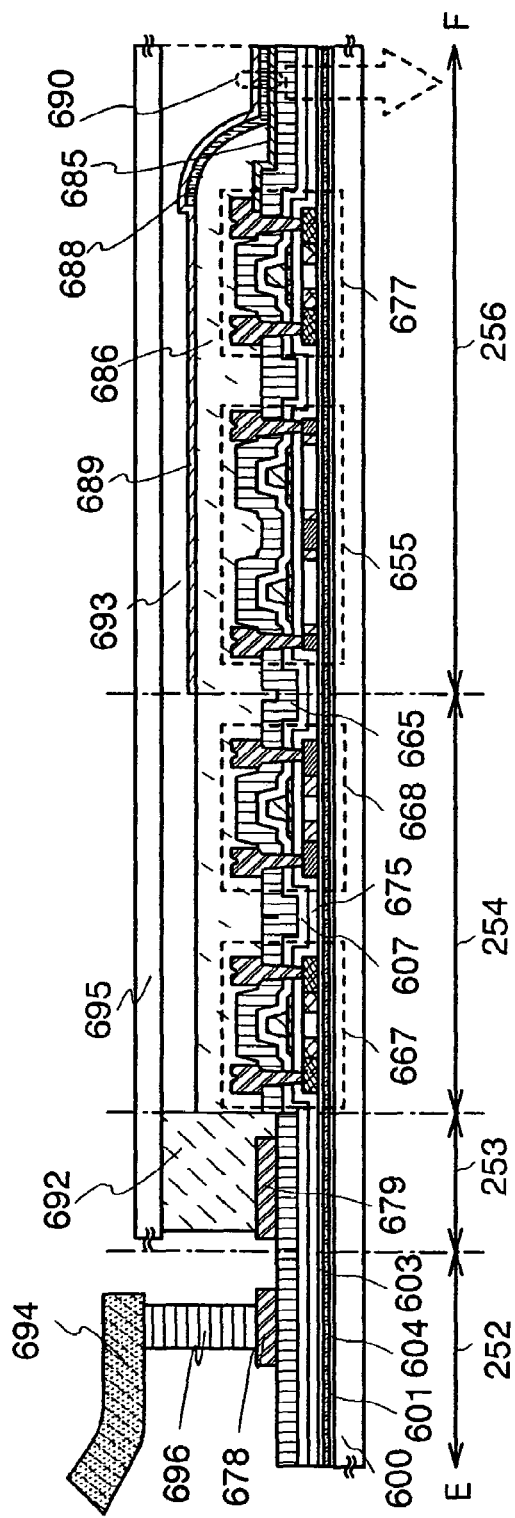

A semiconductor device shown in FIGS. 8A and 8B employs a bottom-emission structure in which light is emitted in a direction indicated by an arrow. FIG. 8A is a plane view of the semiconductor device, and FIG. 8B is a cross-sectional view taken along a line E-F of FIG. 8A. In FIGS. 8A and 8B, the semiconductor device includes an external terminal connection region 252, a sealing region 253, a driver circuit region 254, and a pixel region 256.

The semiconductor device shown in FIGS. 8A and 8B includes an element substrate 600, a thin film transistor 655, a thin film transistor 677, a thin film transistor 667, a thin film transistor 668, a light-emitting element 690 including a first electrode layer 685, a light-emitting layer 688, and a second electrode layer 689, a filler 693, a sealant 692, a blocking layer 601, an insulating layer 604, an oxide film 603, a gate insulating layer 675, an insulating film 607, an insulating film 665, an insulating layer 686, a sealing substrate 695, a wiring layer 679, a terminal electrode layer 678, an anisotropic conductive layer 696, and an FPC 694. The semiconductor device includes the external terminal connection region 252, the sealing region 253, the driver circuit region 254, and the pixel region 256. The filler 693 can be formed by a dropping method using a composition in a liquid state. A semiconductor device (light-emitting display device) is sealed by attaching the element substrate 600 provided with the filler by a dropping method and the sealing substrate 695 to each other.

In the semiconductor device shown in FIGS. 8A and 8B, the first electrode layer 685 is formed using a light-transmitting conductive material so as to transmit light emitted from the light-emitting element 690, and the second electrode layer 689 is formed using a reflective conductive material so as to reflect light emitted from the light-emitting element 690.

Since the second electrode layer 689 is required to have reflectivity, a conductive film or the like formed of titanium, tungsten, nickel, gold, platinum, silver, copper, tantalum, molybdenum, aluminum, magnesium, calcium, lithium, or an alloy thereof may be used. It is preferable to use a substance having high reflectivity in a visible light range, and an aluminum film is used in this embodiment mode.

The first electrode layer 685 may be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

Figure 9:
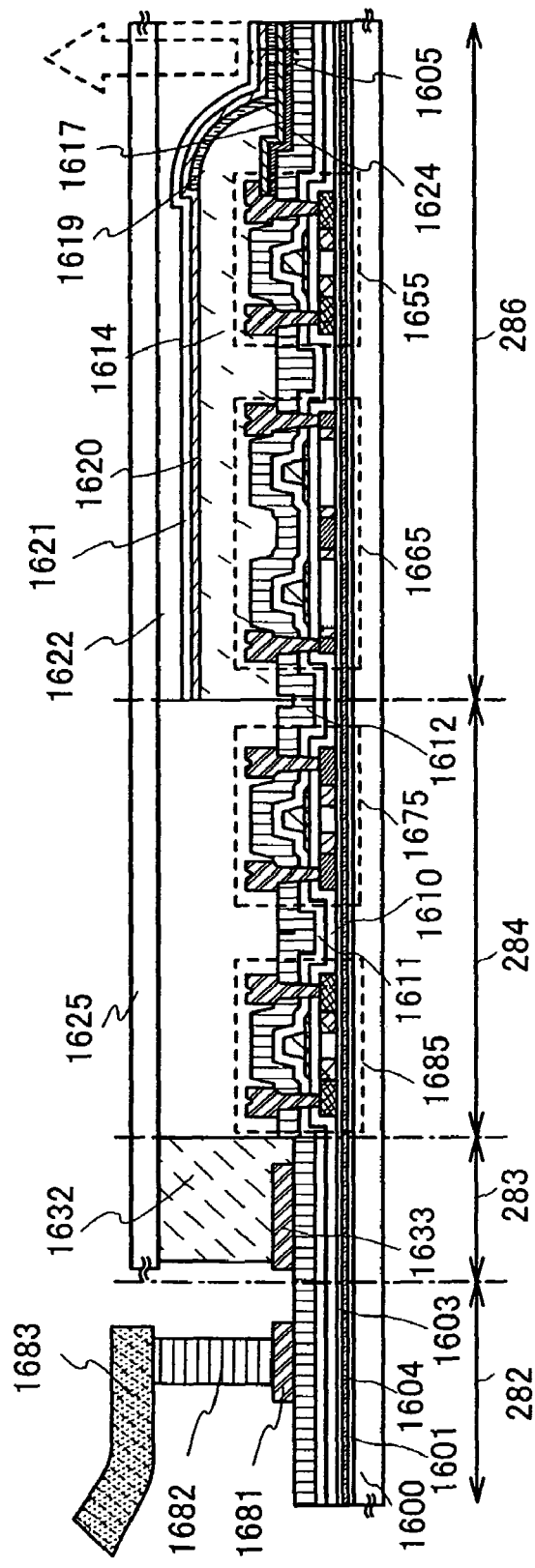
FIG. 9 is a diagram illustrating a semiconductor device of the present invention.

A semiconductor device shown in FIG. 9 employs a top-emission structure in which light is emitted in a direction indicated by an arrow. The semiconductor device shown in FIG. 9 includes an element substrate 1600, a thin film transistor 1655, a thin film transistor 1665, a thin film transistor 1675, a thin film transistor 1685, a wiring layer 1624, a first electrode layer 1617, a light-emitting layer 1619, a second electrode layer 1620, a filler 1622, a sealant 1632, a blocking layer 1601, an insulating layer 1604, an oxide film 1603, a gate insulating layer 1610, an insulating film 1611, an insulating film 1612, an insulating layer 1614, a sealing substrate 1625, a wiring layer 1633, a terminal electrode layer 1681, an anisotropic conductive layer 1682, and an FPC 1683.

The semiconductor device shown in FIG. 9 includes an external terminal connection region 282, a sealing region 283, a driver circuit region 284, and a pixel region 286. In the semiconductor device shown in FIG. 9, the wiring layer 1624 that is a reflective metal layer is provided below the first electrode layer 1617. The first electrode layer 1617 that is a transparent conductive film is formed over the wiring layer 1624. Since the wiring layer 1624 is required to have reflectivity, a conductive film or the like formed of titanium, tungsten, nickel, gold, platinum, silver, copper, tantalum, molybdenum, aluminum, magnesium, calcium, lithium, or an alloy thereof may be used. It is preferable to use a substance having high reflectivity in a visible light range. A conductive film may also be used as the first electrode layer 1617, and in that case, the wiring layer 1624 having reflectivity is not required to be provided.

The first electrode layer 1617 and the second electrode layer 1620 may each be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

Further, when a material such as a metal film having no light-transmitting property is formed thin (preferably, a thickness of about 5 nm to 30 nm) so as to be able to transmit light, light can be emitted through the first electrode layer 1617 and the second electrode layer 1620. As a metal thin film which can be used for the first electrode layer 1617 and the second electrode layer 1620, a conductive film formed of titanium, tungsten, nickel, gold, platinum, silver, aluminum, magnesium, calcium, lithium, or an alloy thereof, or the like can be used.

Figure 10:
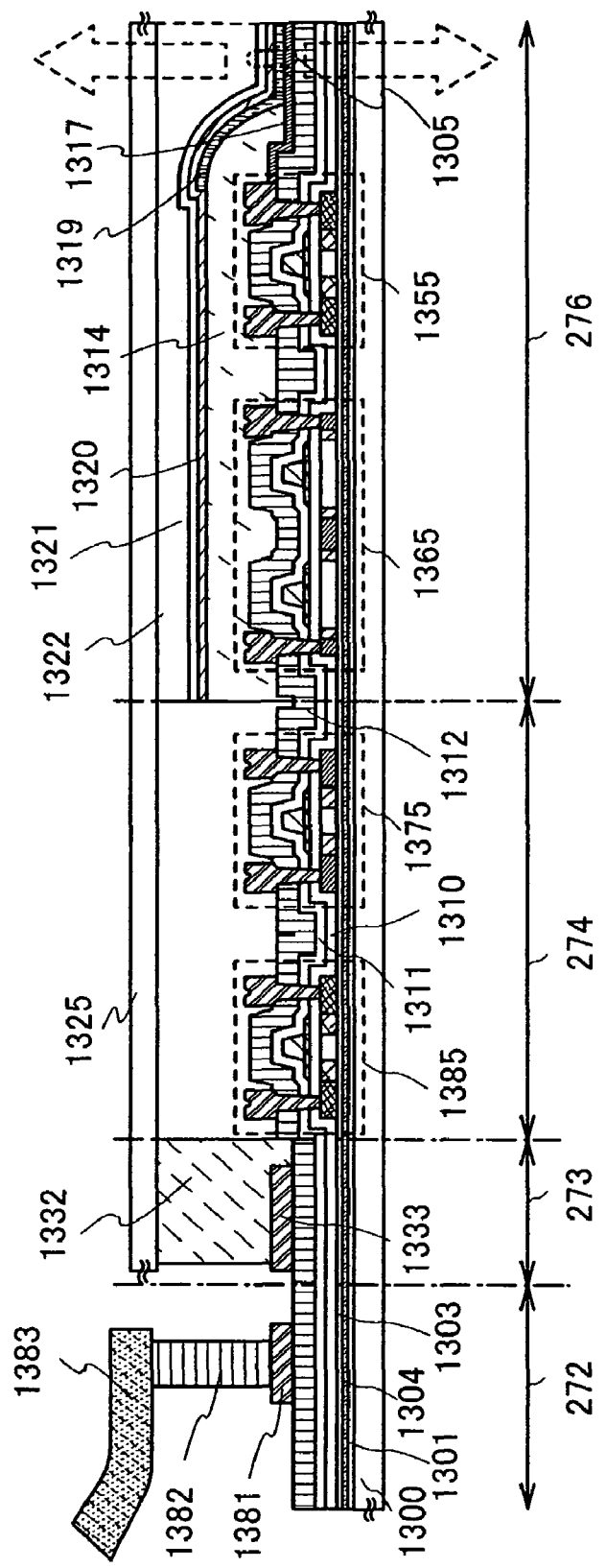
FIG. 10 is a diagram illustrating a semiconductor device of the present invention.

A semiconductor device shown in FIG. 10 includes an element substrate 1300, a thin film transistor 1355, a thin film transistor 1365, a thin film transistor 1375, a thin film transistor 1385, a first electrode layer 1317, a light-emitting layer 1319, a second electrode layer 1320, a filler 1322, a sealant 1332, a blocking layer 1301, an insulating layer 1304, an oxide film 1303, a gate insulating film 1310, an insulating film 1311, an insulating film 1312, an insulating layer 1314, a sealing substrate 1325, a wiring layer 1333, a terminal electrode layer 1381, an anisotropic conductive layer 1382, and an FPC 1383. The semiconductor device includes an external terminal connection region 272, a sealing region 273, a driver circuit region 274, and a pixel region 276.

The semiconductor device shown in FIG. 10 is dual-emission type and has a structure in which light is emitted in directions indicated by arrows from both the element substrate 1300 side and the sealing substrate 1325 side. Therefore, a light-transmitting electrode layer is used for each of the first electrode layer 1317 and the second electrode layer 1320.

In this embodiment mode, the first electrode layer 1317 and the second electrode layer 1320, which are light-transmitting electrode layers, may each be specifically formed using a transparent conductive film formed of a light-transmitting conductive material, and indium oxide containing tungsten oxide, indium zinc oxide containing tungsten oxide, indium oxide containing titanium oxide, indium tin oxide containing titanium oxide, or the like can be used. Needless to say, indium tin oxide (ITO), indium zinc oxide (IZO), indium tin oxide added with silicon oxide (ITSO), or the like can also be used.

Further, when a material such as a metal film having no light-transmitting property is formed thin (preferably, a thickness of about 5 nm to 30 nm) so as to be able to transmit light, light can be emitted through the first electrode layer 1317 and the second electrode layer 1320. As a metal thin film which can be used for the first electrode layer 1317 and the second electrode layer 1320, a conductive film or the like formed of titanium, tungsten, nickel, gold, platinum, silver, aluminum, magnesium, calcium, lithium, or an alloy thereof can be used.

In the above-described manner, the semiconductor device shown in FIG. 10 has a structure in which light emitted from a light-emitting element 1305 passes through the first electrode layer 1317 and the second electrode layer 1320 so that light is emitted from both sides.

A pixel of a semiconductor device that is formed using a light-emitting element can be driven by a passive matrix mode or an active matrix mode. Further, either digital driving or analog driving can be employed.

A color filter (colored layer) may be formed over a sealing substrate. The color filter (colored layer) can be formed by an evaporation method or a droplet discharge method. By using the color filter (colored layer), high-definition display can also be carried out. This is because a broad peak can be modified to be sharp in the light emission spectrum of each color of RGB by the color filter (colored layer).

Full color display can be performed by formation of a material to emit light of a single color and combination of the material with a color filter or a color conversion layer. The color filter (colored layer) or the color conversion layer may be provided for, for example, the sealing substrate, and the sealing substrate may be attached to the element substrate.

Needless to say, display of single color light emission may also be performed. For example, an area color type semiconductor device may be formed by using single color light emission. The area color type is suitable for a passive matrix display portion and can mainly display characters and symbols.

By using a single-crystal semiconductor layer, a pixel region and a driver circuit region can be formed to be integrated over the same substrate. In that case, a transistor in the pixel region and a transistor in the driver circuit region are formed at the same time.

The transistors provided in a semiconductor device of this embodiment mode shown in FIGS. 8A and 8B, 9, and 10 can be manufactured similarly to the transistors described in Embodiment Mode 2.

In the semiconductor device of this embodiment mode, as described in Embodiment Mode 1, an SOI substrate can be used which is provided with a semiconductor layer that is separated from a semiconductor substrate, bonded to a supporting substrate, and then subjected to irradiation with electromagnetic waves and polishing treatment so that crystal defects are reduced and high planarity is provided.

Therefore, a semiconductor device which has high performance and high reliability can be formed with high yield.

This embodiment mode can be combined with Embodiment Mode 1, as appropriate.

Embodiment Mode 5

This embodiment mode will describe an example of a semiconductor device (also referred to as a display device or a light-emitting device) including a display function as a semiconductor device having high performance and high reliability. Specifically, a light-emitting display device using a light-emitting element for a display element will be described.

This embodiment mode will describe structures of light-emitting elements that can be used for display elements in the display device of the present invention with reference to FIGS. 13A to 13D.

FIGS. 13A to 13D show structures of a light-emitting element in which an EL layer 860 is sandwiched between a first electrode layer 870 and a second electrode layer 850. The EL layer 860 includes a first layer 804, a second layer 803, and a third layer 802 as shown in the drawings. In FIGS. 13A to 13D, the second layer 803 is a light-emitting layer, and the first layer 804 and the third layer 802 are functional layers.

The first layer 804 is a layer having a function of transporting holes to the second layer 803. In FIGS. 13A to 13D, a hole-injecting layer included in the first layer 804 includes a substance having a high hole-injecting property, and molybdenum oxide, vanadium oxide, ruthenium oxide, tungsten oxide, manganese oxide, or the like can be used. Further, the first layer 804 can also be formed using the following: a phthalocyanine-based compound such as phthalocyanine (abbrev.: $H_2Pc$), copper phthalocyanine (abbrev.: CuPc), or the like; an aromatic amine compound such as 4,4'-bis[N-(4-diphenylaminophenyl)-N-phenylamino]biphenyl (abbrev.: DPAB), 4,4'-bis(N-{4-[N-(3-methylphenyl)-N-phenylamino]phenyl}-N-phenylamino)biphenyl (abbrev.: DNTPD), or the like; a high molecular compound such as poly(ethylene dioxythiophene)/poly(styrenesulfonic acid) (abbrev.: PEDOT/PSS); and the like.

Further, a composite material including an organic compound and an inorganic compound can be used for the hole-injecting layer. In particular, a composite material including an organic compound and an inorganic compound showing an electron-accepting property with respect to the organic compound is excellent in a hole-injecting property and a hole-transporting property since electrons are transferred between the organic compound and the inorganic compound and carrier density is increased.

Further, in the case where a composite material including an organic compound and an inorganic compound is used for the hole-injecting layer, the hole-injecting layer can form an ohmic contact with the electrode layer; therefore, a material of the electrode layer can be selected regardless of the work function.

As the inorganic compound used for the composite material, oxide of a transition metal is preferably used. In addition, oxide of a metal belonging to Groups 4 to 8 of the periodic table can be used. Specifically, the following are preferable because an electron-accepting property is high: vanadium oxide, niobium oxide, tantalum oxide, chromium oxide, molybdenum oxide, tungsten oxide, manganese oxide, and rhenium oxide. Among them, molybdenum oxide is particularly preferable because it is stable in the atmosphere, low in hygroscopicity, and is easy to be handled.

As the organic compound used for the composite material, various compounds can be used, such as an aromatic amine compound, a carbazole derivative, aromatic hydrocarbon, or a high molecular compound (e.g., an oligomer, a dendrimer, a polymer, or the like). Note that, as the organic compound used for the composite material, it is preferable to use an organic compound having a high hole-transporting property. Specifically, it is preferable to use a substance having a hole mobility of greater than or equal to $10^{-6}$ cm$^2$/Vs. Further, other materials may also be used as long as a hole-transporting property thereof is higher than an electron-transporting property. Examples of the organic compound which can be used for the composite material are specifically listed below.

For example, as the aromatic amine compound, the following can be given: N,N'-di(p-tolyl)-N,N'-diphenyl-p-phenylenediamine (abbrev.: DTDPPA); 4,4'-bis[N-(4-diphenylaminophenyl)-N-phenylamino]biphenyl (abbrev.: DPAB); 4,4'-bis(N-{4-[N-(3-methylphenyl)-N-phenylamino]phenyl}-N-phenylamino)biphenyl (abbrev.: DNTPD); 1,3,5-tris[N-(4-diphenylaminophenyl)-N-phenylamino]benzene (abbrev.: DPA3B); and the like.

As specific examples of the carbazole derivative which can be used for the composite material, the following can be given: 3-[N-(9-phenylcarbazol-3-yl)-N-phenylamino]-9-phenylcarbazole (abbrev.: PCzPCA1); 3,6-bis[N-(9-phenylcarbazol-3-yl)-N-phenylamino]-9-phenylcarbazole (abbrev.: PCzPCA2); 3-[N-(1-naphthyl)-N-(9-phenylcarbazol-3-yl)amino]-9-phenylcarbazole (abbrev.: PCzPCN1); and the like.

Further, the following can also be used: 4,4'-di(N-carbazolyl)biphenyl (abbrev.: CBP); 1,3,5-tris[4-(N-carbazolyl)phenyl]benzene (abbrev.: TCPB); 9-[4-(N-carbazolyl)]phenyl-10-phenylanthracene (abbrev.: CzPA); 1,4-bis[4-(N-carbazolyl)phenyl]-2,3,5,6-tetraphenylbenzene; and the like.

Further, as the aromatic hydrocarbon which can be used for the composite material, the following can be given: 2-tert-butyl-9,10-di(2-naphthyl)anthracene (abbrev.: t-BuDNA); 2-tert-butyl-9,10-di(1-naphthyl)anthracene; 9,10-bis(3,5-diphenylphenyl)anthracene (abbrev.: DPPA); 2-tert-butyl-9,10-bis(4-phenylphenyl)anthracene (abbrev.: t-BuDBA); 9,10-di(2-naphthyl)anthracene (abbrev.: DNA); 9,10-diphenylanthracene (abbrev.: DPAnth); 2-tert-butylanthracene (abbrev.: t-BuAnth); 9,10-bis(4-methyl-1-naphthyl)anthracene (abbrev.: DMNA); 2-tert-butyl-9,10-bis[2-(1-naphthyl)phenyl]anthracene; 9,10-bis[2-(1-naphthyl)phenyl]anthracene; 2,3,6,7-tetramethyl-9,10-di(1-naphthyl)anthracene; 2,3,6,7-tetramethyl-9,10-di(2-naphthyl)anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides the above, pentacene, coronene, or the like can also be used. As described above, an aromatic hydrocarbon which has a hole mobility of greater than or equal to $1 \times 10^{-6}$ cm$^2$/Vs and of which the carbon number is 14 to 42 is more preferable.

Note that the aromatic hydrocarbon which can be used for the composite material may have a vinyl skeleton. As examples of the aromatic hydrocarbon having a vinyl group, 4,4'-bis(2,2-diphenylvinyl)biphenyl (abbrev.: DPVBi), 9,10-bis[4-(2,2-diphenylvinyl)phenyl]anthracene (abbrev.: DPVPA), and the like can be given.

Further, a high molecular compound such as poly(N-vinylcarbazole) (abbrev.: PVK), poly(4-vinyltriphenylamine) (abbrev.: PVTPA), or the like can also be used.

As a substance for forming a hole-transporting layer included in the first layer 804 in FIGS. 13A to 13D, a substance having a high hole-transporting property, specifically, an aromatic amine compound (that is, a compound having a benzene ring-nitrogen bond) is preferable. As examples of the material which are widely used, the following can be given: 4,4'-bis[N-(3-methylphenyl)-N-phenylamino]biphenyl; a derivative thereof such as 4,4'-bis[N-(1-napthyl)-N-phenylamino]biphenyl (hereinafter referred to as NPB); and a starburst aromatic amine compound such as 4,4',4"-tris(N,N-diphenyl-amino)triphenylamine, 4,4',4"-tris[N-(3-methylphenyl)-N-phenylamino]triphenylamine, and the like. These substances described here are mainly substances each having a hole mobility of greater than or equal to $10^{-6}$ cm$^2$/Vs. Further, other materials may also be used as long as a hole-transporting property thereof is higher than an electron-transporting property. The hole-transporting layer is not limited to a single layer and may be a mixed layer of any of the aforementioned substances or a stacked layer which includes two or more layers each containing the aforementioned substance.

The third layer 802 has a function of transporting and injecting electrons to the second layer 803. With reference to FIGS. 13A to 13D, an electron-transporting layer included in the third layer 802 is described. As the electron-transporting layer, a substance having a high electron-transporting property can be used. For example, a layer containing a metal complex or the like including a quinoline or benzoquinoline skeleton, such as tris(8-quinolinolato)aluminum (abbrev.: Alq), tris(4-methyl-8-quinolinolato)aluminum (abbrev.: Almq$_3$), bis(10-hydroxybenzo[h]quinolinato)beryllium (abbrev.: BeBq$_2$), bis(2-methyl-8-quinolinolato)(4-phenylphenolato)aluminum (abbrev.: BAlq), or the like can be used. Further, a metal complex or the like including an oxazole-based or thiazole-based ligand, such as bis[2-(2-hydroxyphenyl)benzoxazolato]zinc (abbrev.: Zn(BOX)$_2$), bis[2-(2-hydroxyphenyl)benzothiazolato]zinc (abbrev.: Zn(BTZ)$_2$), or the like can be used. Besides the above metal complexes, the following can be used: 2-(4-biphenylyl)-5-(4-tert-butylphenyl)-1,3,4-oxadiazole (abbrev.: PBD); 1,3-bis[5-(p-tert-butylphenyl)-1,3,4-oxadiazol-2-yl]benzene (abbrev.: OXD-7); 3-(4-biphenylyl)-4-phenyl-5-(4-tert-butylphenyl)-1,2,4-triazole (abbrev.: TAZ), bathophenanthroline (abbrev.: BPhen); bathocuproine (abbrev.: BCP); and the like. These substances described here are mainly substances each having an electron mobility of greater than or equal to $10^{-6}$ cm$^2$/Vs. Further, other substances may also be used for the electron-transporting layer as long as an electron transporting property thereof is higher than a hole transporting property. The electron-transporting layer is not limited to a single layer and may be a stacked layer which includes two or more layers each containing the aforementioned substance.

With reference to FIGS. 13A to 13D, an electron-injecting layer included in the third layer 802 is described. As the electron-injecting layer, a substance having a high electron-injecting property can be used. As the electron-injecting layer, an alkali metal, an alkaline earth metal, or a compound thereof such as lithium fluoride (LiF), cesium fluoride (CsF), or calcium fluoride (CaF$_2$) can be used. For example, a layer which is made of a substance having an electron-transporting property and contains an alkali metal, an alkaline earth metal, or a compound thereof, for example, a layer of Alq containing magnesium (Mg) or the like can be used. It is preferable to use the layer which is made of a substance having an electron-transporting property and contains an alkali metal or an alkaline earth metal as the electron-injecting layer because electron injection from the electrode layer is efficiently performed by using the layer.

Next, the second layer 803 which is a light-emitting layer is described. The light-emitting layer has a function of emitting light and includes an organic compound having a light-emitting property. Further, the light-emitting layer may include an inorganic compound. The light-emitting layer may be formed using various light-emitting organic compounds and inorganic compounds. The thickness of the light-emitting layer is preferably about 10 nm to 100 nm.

There are no particular limitations on the organic compound used for the light-emitting layer as long as it is a light-emitting organic compound. As the organic compound, for example, the following can be given: 9,10-di(2-naphthyl)anthracene (abbrev.: DNA), 9,10-di(2-naphthyl)-2-tert-butylanthracene (abbrev.: t-BuDNA), 4,4'-bis(2,2-diphenylvinyl)biphenyl (abbrev.: DPVBi), coumarin 30, coumarin 6, coumarin 545, coumarin 545T, perylene, rubrene, periflanthene, 2,5,8,11-tetra(tert-butyl)perylene (abbrev.: TBP), 9,10-diphenylanthracene (abbrev.: DPA), 5,12-diphenyltetracene, 4-(dicyanomethylene)-2-methyl-[p-(dimethylamino)styryl]-4H-pyran (abbrev.: DCM1), 4-(dicyanomethylene)-2-methyl-6-[2-(joulolidin-9-yl)ethenyl]-4H-pyran (abbrev.: DCM2), 4-(dicyanomethylene)-2,6-bis[p-(dimethylamino)styryl]-4H-pyran (abbrev.: BisDCM), and the like. Further, a compound capable of emitting phosphorescence such as bis[2-(4',6'-difluorophenyl)pyridinato-N,C$^{2'}$]iridium(picolinate) (abbrev.: FIrpic), bis{2-[3',5'-bis(trifluoromethyl)phenyl]pyridinato-N,C$^{2'}$}iridium(picolinate) (abbrev.: Ir(CF$_3$ppy)$_2$(pic)), tris(2-phenylpyridinato-N,C$^{2'}$)iridium (abbrev.: Ir(ppy)$_3$), bis(2-phenylpyridinato-N,C$^{2'}$)iridium (acetylacetonate) (abbrev.: Ir(ppy)$_2$(acac)), bis[2-(2'-thienyl)pyridinato-N,C$^{3'}$]iridium(acetylacetonate) (abbrev.: Ir(thp)$_2$(acac)), bis(2-phenylquinolinato-N,C$^{2'}$)iridium (acetylacetonate) (abbrev.: Ir(pq)$_2$(acac)), or bis[2-(2'-benzothienyl)pyridinato-N,C$^{3'}$]iridium(acetylacetonate) (abbrev.: Ir(btp)$_2$(acac)) may be used.

Further, a triplet excitation light-emitting material containing a metal complex or the like may be used for the light-emitting layer in addition to a singlet excitation light-emitting material. For example, among pixels emitting light of red, green, and blue, the pixel emitting light of red whose luminance is reduced by half in a relatively short time is formed using a triplet excitation light-emitting material and the other pixels are formed using a singlet excitation light-emitting material. A triplet excitation light-emitting material has a feature of favorable light-emitting efficiency, so that less power is consumed to obtain the same luminance. In other words, when a triplet excitation light-emitting material is used for the pixel emitting light of red, a smaller amount of current is necessary to be applied to a light-emitting element; thus, reliability can be improved. The pixel emitting light of red and the pixel emitting light of green may be formed using a triplet excitation light-emitting material and the pixel emitting light of blue may be formed using a singlet excitation light-emitting material in order to achieve low power consumption. Low power consumption can be further achieved by formation of a light-emitting element that emits light of green, which has high visibility for human eyes, with the use of a triplet excitation light-emitting material.

Another organic compound may be further added to the light-emitting layer including any of the above-described organic compounds which emit light. Examples of the organic compound that can be added are TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, DPVBi, and the like, and 4,4'-bis(N-carbazolyl)biphenyl (abbrev.: CBP), 1,3,5-tris[4-(N-carbazolyl)phenyl]benzene (abbrev.: TCPB), and the like. However, the present invention is not limited thereto. It is preferable that the organic compound which is added in addition to the organic compound which emits light have a larger excitation energy and be added in a larger amount than the organic compound which emits light, in order to make the organic compound emit light efficiently (which makes it possible to prevent concentration quenching of the organic compound). Further, as another function, the added organic compound may emit light along with the organic compound which emits light (which makes it possible to emit white light or the like).

The light-emitting layer may have a structure in which color display is performed by formation of a light-emitting layer having a different emission wavelength range for each pixel. Typically, light-emitting layers corresponding to respective colors of R (red), G (green), and B (blue) are formed. Also in this case, color purity can be improved and a pixel region can be prevented from having a mirror surface (reflection) by provision of a filter which transmits light of the emission wavelength range on the light-emission side of the pixel. By provision of the filter, a circularly polarizing plate or the like that has been conventionally considered to be necessary can be omitted, and further, the loss of light emitted from the light-emitting layer can be eliminated. Further, change in color tone, which occurs when a pixel region (display screen) is obliquely seen, can be reduced.

Either a low-molecular organic light-emitting material or a high-molecular organic light-emitting material may be used for a material of the light-emitting layer. A high-molecular organic light-emitting material has higher physical strength than a low-molecular material and a light-emitting element using the high-molecular organic light-emitting material has higher durability than an element using a low-molecular material. In addition, since a high-molecular organic light-emitting material can be formed by coating, the light-emitting element can be relatively easily formed.

The color of light emission is determined depending on a material forming the light-emitting layer; therefore, a light-emitting element which emits light of a desired color can be formed by selecting an appropriate material for the light-emitting layer. As a high-molecular electroluminescent material which can be used for forming the light-emitting layer, a polyparaphenylene-vinylene-based material, a polyparaphenylene-based material, a polythiophene-based material, a polyfluorene-based material, and the like can be given.

As the polyparaphenylene-vinylene-based material, a derivative of poly(paraphenylenevinylene) [PPV] such as poly(2,5-dialkoxy-1,4-phenylenevinylene) [RO-PPV], poly (2-(2'-ethyl-hexoxy)-5-methoxy-1,4-phenylenevinylene) [MEH-PPV], poly(2-(dialkoxyphenyl)-1,4-phenylenevinylene) [ROPh-PPV], and the like can be given. As the polyparaphenylene-based material, a derivative of polyparaphenylene [PPP] such as poly(2,5-dialkoxy-1,4-phenylene) [RO-PPP], poly(2,5-dihexoxy-1,4-phenylene), and the like can be given. As the polythiophene-based material, a derivative of polythiophene [PT] such as poly(3-alkylthiophene) [PAT], poly(3-hexylthiophen) [PHT], poly(3-cyclohexylthiophen) [PCHT], poly(3-cyclohexyl-4-methylthiophene) [PCHMT], poly(3,4-dicyclohexylthiophene) [PDCHT], poly[3-(4-octylphenyl)-thiophene][POPT], poly[3-(4-octylphenyl)-2, 2bithiophene][PTOPT], and the like can be given. As the polyfluorene-based material, a derivative of polyfluorene [PF] such as poly(9,9-dialkylfluorene) [PDAF], poly(9,9-dioctylfluorene) [PDOF], and the like can be given.

The inorganic compound used for the light-emitting layer may be any inorganic compound as long as light emission of the organic compound is not easily quenched by the inorganic compound, and various kinds of metal oxide and metal nitride may be used. In particular, oxide of a metal that belongs to Group 13 or 14 of the periodic table is preferable because light emission of the organic compound is not easily quenched, and specifically, aluminum oxide, gallium oxide, silicon oxide, and germanium oxide are preferable. However, the inorganic compound is not limited thereto.

Note that the light-emitting layer may be formed by stacking a plurality of layers each containing a combination of the organic compound and the inorganic compound, which are described above, or may further contain another organic compound or inorganic compound. A layer structure of the light-emitting layer can be changed, and an electrode layer for injecting electrons may be provided or light-emitting materials may be dispersed, instead of provision of a specific electron-injecting region or light-emitting region. Such a change can be permitted unless it departs from the spirit of the present invention.

A light-emitting element formed using the above materials emits light by being applied with forward bias voltage. A pixel of a semiconductor device which is formed using a light-emitting element can be driven by a passive matrix mode or an active matrix mode. In either case, each pixel emits light by application of forward bias voltage thereto at a specific timing; however, the pixel is in a non-light-emitting state for a certain period. Reliability of a light-emitting element can be improved by application of reverse bias in the non-light-emitting period. In a light-emitting element, there is a deterioration mode in which light emission intensity is decreased under a constant driving condition or a deterioration mode in which a non-light-emitting region is increased in the pixel and luminance is apparently decreased. However, progression of deterioration can be slowed down by performing alternating driving in which bias voltage is applied forwardly and reversely; thus, reliability of a semiconductor device including a light-emitting element can be improved. In addition, either digital driving or analog driving can be applied.

A color filter (colored layer) may be provided for a sealing substrate. The color filter (colored layer) can be formed by an evaporation method or a droplet discharge method. High-definition display can be performed with the use of the color filter (colored layer). This is because a broad peak can be modified to be sharp in a light emission spectrum of each of RGB by the color filter (colored layer).

Full color display can be performed by combination of a material emitting light of single color with a color filter or a color conversion layer. The color filter (colored layer) or the color conversion layer may be provided for, for example, the sealing substrate, and the sealing substrate may be attached to the element substrate.

Needless to say, display of single color light emission may also be performed. For example, an area color type semiconductor device may be formed by using single color light emission. The area color type is suitable for a passive matrix display portion and can mainly display characters and symbols.

Figure 13A:
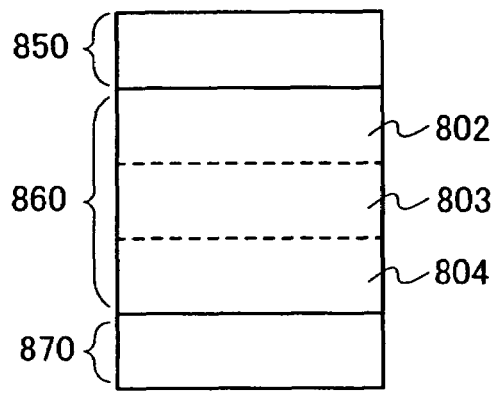
FIGS. 13A to 13D are diagrams illustrating a structure of a light-emitting element which is applicable to the present invention.
Figure 13B:
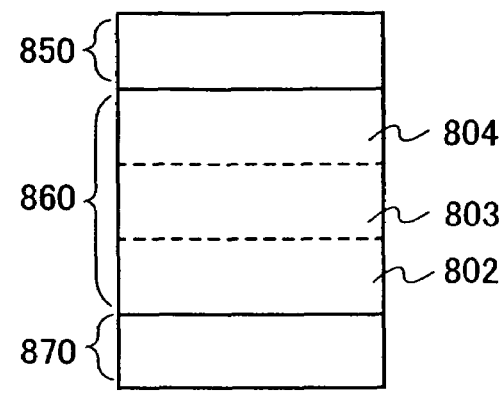

It is necessary to select materials for the first electrode layer 870 and the second electrode layer 850 considering the work function. The first electrode layer 870 and the second electrode layer 850 can be either an anode (an electrode layer with high potential) or a cathode (an electrode layer with low potential) depending on the pixel structure. In the case where the polarity of a driving thin film transistor is a p-channel type, the first electrode layer 870 may serve as an anode and the second electrode layer 850 may serve as a cathode as shown in FIG. 13A. In the case where the polarity of the driving thin film transistor is an n-channel type, the first electrode layer 870 may serve as a cathode and the second electrode layer 850 may serve as an anode as shown in FIG. 13B. Materials that can be used for the first electrode layer 870 and the second electrode layer 850 are described below.

It is preferable to use a material having a high work function (specifically, a material having a work function of greater than or equal to 4.5 eV) for one of the first electrode layer 870 and the second electrode layer 850, which serves as an anode, and a material having a low work function (specifically, a material having a work function of less than or equal to 3.5 eV) for the other electrode layer which serves as a cathode. However, since the first layer 804 is excellent in a hole-injecting property and a hole-transporting property and the third layer 802 is excellent in an electron-injecting property and an electron-transporting property, various materials as the first electrode layer 870 and the second electrode layer 850 can be used irrespective of their work functions.

The light-emitting elements in FIGS. 13A and 13B each have a structure in which light is extracted from the first electrode layer 870 and thus, the second electrode layer 850 need not necessarily have a light-transmitting property. The second electrode layer 850 may be formed of a film mainly containing an element selected from Ti, Ni, W, Cr, Pt, Zn, Sn, In, Ta, Al, Cu, Au, Ag, Mg, Ca, Li or Mo, or an alloy material or a compound material containing any of the above elements as its main component, such as titanium nitride, $TiSi_xN_y$, $WSi_x$, tungsten nitride, $WSi_xN_y$, or NbN; or a stacked film thereof with a total thickness of 100 nm to 800 nm.

In addition, when the second electrode layer 850 is formed using a light-transmitting conductive material similarly to the material used for the first electrode layer 870, light can be extracted from the second electrode layer 850 as well, and a dual emission structure can be obtained, in which light from the light-emitting element is emitted through both the first electrode layer 870 and the second electrode layer 850.

Note that the light-emitting element of the present invention can have various embodiment by changing types of the first electrode layer 870 and the second electrode layer 850.

FIG. 13B shows an example in which the EL layer 860 is formed by stacking the third layer 802, the second layer 803, and the first layer 804 in this order from the first electrode layer 870 side.

Figure 13C:
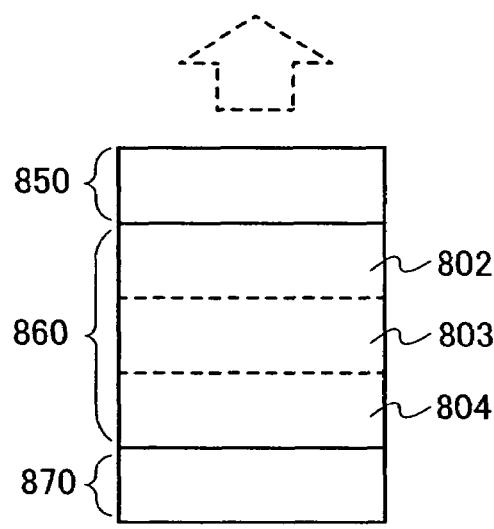
Figure 13D:
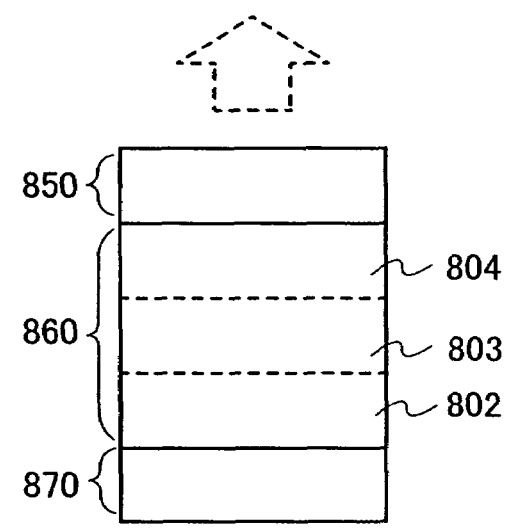

FIG. 13C shows a structure in which an electrode layer having reflectivity is used for the first electrode layer 870 and an electrode layer having a light-transmitting property is used for the second electrode layer 850 in FIG. 13A. Light emitted from the light-emitting element is reflected at the first electrode layer 870, transmitted through the second electrode layer 850, and emitted to the outside. Similarly, FIG. 13D shows a structure in which an electrode layer having reflectivity is used for the first electrode layer 870 and an electrode layer having a light-transmitting property is used for the second electrode layer 850 in FIG. 13B. Light emitted from the light-emitting element is reflected at the first electrode layer 870, transmitted through the second electrode layer 850, and emitted to the outside.

Further, various methods can be used as a method of forming the EL layer 860 when an organic compound and an inorganic compound are mixed in the EL layer 860. For example, there is a co-evaporation method of vaporizing both an organic compound and an inorganic compound by resistance heating. Further, for co-evaporation, an inorganic compound may be vaporized by an electron beam (EB) while an organic compound is vaporized by resistance heating. Furthermore, a method of sputtering an inorganic compound while vaporizing an organic compound by resistance heating to deposit the both at the same time may also be used. Instead, the EL layer 860 may be formed by a wet method.

As a method of manufacturing the first electrode layer 870 and the second electrode layer 850, an evaporation method by resistance heating, an EB evaporation method, a sputtering method, a CVD method, a spin coating method, a printing method, a dispenser method, a droplet discharge method, or the like can be used.

This embodiment mode can be combined with any of Embodiment Mode 1 and 4 as appropriate.

In the semiconductor device of this embodiment mode, as described in Embodiment Mode 1, an SOI substrate can be used which is provided with a semiconductor layer that is separated from a semiconductor substrate, bonded to a supporting substrate, and then subjected to irradiation with electromagnetic waves and polishing treatment so that crystal defects in the semiconductor layer are reduced and high planarity is provided. Therefore, a semiconductor device which has high performance and high reliability can be formed with high yield.

Embodiment Mode 6

This embodiment mode will describe other examples of a semiconductor device having a display function as a semiconductor device with high performance and high reliability. In this embodiment mode, other structures that can be applied to the light-emitting element in the semiconductor device of the present invention will be described with reference to FIGS. 11A to 11C and 12A to 12C.

Light-emitting elements using electroluminescence can be roughly classified into light-emitting elements that use an organic compound as a light-emitting material and light-emitting elements that use an inorganic compound as a light-emitting material. In general, the former are referred to as organic EL elements, while the latter are referred to as inorganic EL elements.

Inorganic EL elements are classified into a dispersion-type inorganic EL element and a thin-film-type inorganic EL element according to their element structures. The difference between the two EL elements lies in that the former dispersion-type inorganic EL element includes an electroluminescent layer in which particles of a light-emitting material are dispersed in a binder, while the latter thin-film-type inorganic EL element includes an electroluminescent layer made of a thin film of a light-emitting material. Although the two light-emitting elements are different in the above points, they have a common characteristic in that both require electrons that are accelerated by a high electric field. As light-emission mechanisms, there are donor-acceptor recombination type light emission that utilizes a donor level and an acceptor level, and localized type light emission that utilizes inner-shell electron transition of a metal ion. In general, donor-acceptor recombination light emission is employed in dispersion type inorganic EL elements and localized type light emission is employed in thin-film type inorganic EL elements in many cases.

A light-emitting material that can be used in the present invention contains a base material and an impurity element which serves as a luminescence center. By changing the impurity element to be contained in the light-emitting material, light emission of various colors can be obtained. As a method of forming a light-emitting material, various methods such as a solid-phase method and a liquid-phase method (a coprecipitation method) can be used. Further, an evaporative decomposition method, a double decomposition method, a method utilizing thermal decomposition reaction of a precursor, a reversed micelle method, a method which combines the foregoing method with high-temperature baking, a liquid-phase method such as a freeze-drying method, or the like can also be used.

A solid phase method is a method in which a base material, and an impurity element or a compound containing an impurity element are weighed, mixed in a mortar, heated in an electric furnace, and baked to be reacted, whereby the impurity element is contained in the base material. The baking temperature is preferably 700° C. to 1500° C. This is because the solid-phase reaction will not proceed when the temperature is too low, whereas the base material will be decomposed when the temperature is too high. The baking may be performed in a powder state; however, it is preferably performed in a pellet state. Although the solid-phase method requires baking at a relatively high temperature, the solid-phase method is easy to perform and has high productivity. Thus, it is suitable for mass production.

A liquid-phase method (a coprecipitation method) is a method in which a base material or a compound containing a base material, and an impurity element or a compound containing an impurity element are reacted in a solution, dried, and then baked. Particles of a light-emitting material are uniformly distributed, and the reaction can progress even when the grain size is small and the baking temperature is low.

As a base material of a light-emitting material, sulfide, oxide, or nitride can be used. Examples of sulfide include zinc sulfide (ZnS), cadmium sulfide (CdS), calcium sulfide (CaS), yttrium sulfide ($Y_2S_3$), gallium sulfide ($Ga_2S_3$), strontium sulfide (SrS), and barium sulfide (BaS). Examples of oxide include zinc oxide (ZnO) and yttrium oxide ($Y_2O_3$). Examples of nitride include aluminum nitride (AlN), gallium nitride (GaN), and indium nitride (InN). Further, it is also possible to use zinc selenide (ZnSe), zinc telluride (ZnTe), or ternary mixed crystals such as calcium gallium sulfide ($CaGa_2S_4$), strontium gallium sulfide ($SrGa_2S_4$), barium gallium sulfide ($BaGa_2S_4$), or the like.

For a luminescence center of an EL element which exhibits localized type light emission, the following elements can be used: manganese (Mn), copper (Cu), samarium (Sm), terbium (Tb), erbium (Er), thulium (Tm), europium (Eu), cerium (Ce), praseodymium (Pr), and the like. Note that a halogen element such as fluorine (F), chlorine (Cl), or the like may also be added. The halogen element can function to compensate electric charge.

Meanwhile, for a luminescence center of an EL element which exhibits donor-acceptor recombination light emission, a light-emitting material containing a first impurity element which forms a donor level and a second impurity element which forms an acceptor level can be used. Examples of the first impurity element include fluorine (F), chlorine (Cl), aluminum (Al), and the like. Meanwhile, examples of the second impurity element include copper (Cu), silver (Ag), and the like.

In the case of synthesizing a light-emitting material of an EL element which exhibits donor-acceptor recombination light emission by using a solid-phase method, the following steps are performed: weighing a base material, weighing a first impurity element or a compound containing the first impurity element, weighing a second impurity element or a compound containing the second impurity element, mixing them in a mortar, and heating and baking them in an electric furnace. As a base material, the above-described base materials can be used. As a first impurity element or a compound containing the first impurity element, fluorine (F), chlorine (Cl), aluminum sulfide ($Al_2S_3$), or the like can be used, for example. As a second impurity element or a compound containing the second impurity element, copper (Cu), silver (Ag), copper sulfide ($Cu_2S$), silver sulfide ($Ag_2S$), or the like can be used, for example. The baking temperature is preferably 700° C. to 1500° C. This is because the solid-phase reaction will not proceed when the temperature is too low, whereas the base material will be decomposed when the temperature is too high. The baking may be performed in a powder state; however, it is preferably performed in a pellet state.

In the case of performing solid-phase reaction, it is also possible to use a compound containing the first impurity element and the second impurity element as the impurity element. In that case, the impurity elements can be easily diffused, and solid-phase reaction can easily proceed; therefore, a uniform light-emitting material can be obtained. Further, since unnecessary impurity elements are not mixed, a light-emitting material with high purity can be obtained. As the compound containing the first impurity element and the second impurity element, copper chloride (CuCl), silver chloride (AgCl), or the like can be used.

Note that the concentration of the impurity element with respect to the base material may be 0.01 at. % to 10 at. %, preferably, 0.05 at. % to 5 at. %.

With regard to a thin-film-type inorganic EL element, an electroluminescent layer contains the above-described light-emitting material and can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low pressure hydride transport CVD method, an atomic layer epitaxy (ALE) method, or the like.

Figure 11A:
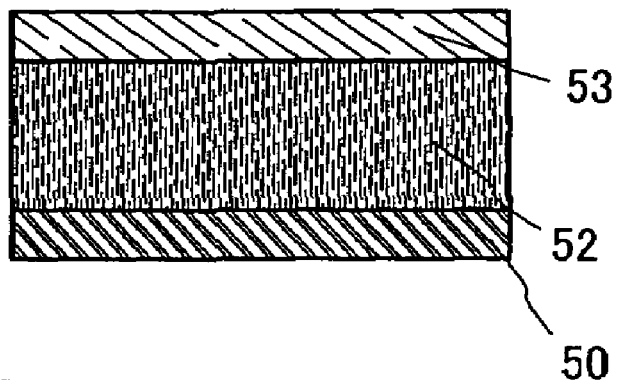
FIGS. 11A to 11C are diagrams illustrating a structure of a light-emitting element which is applicable to the present invention.
Figure 11B:
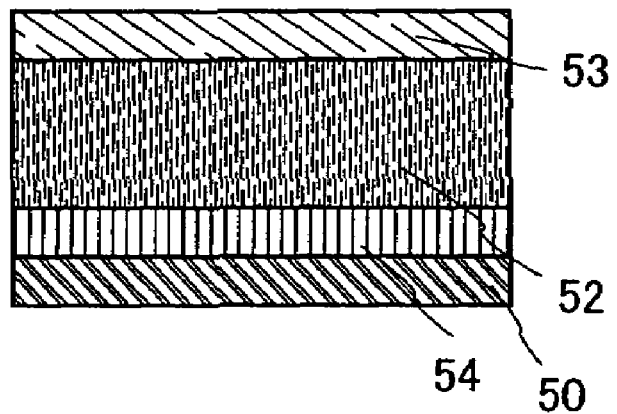
Figure 11C:
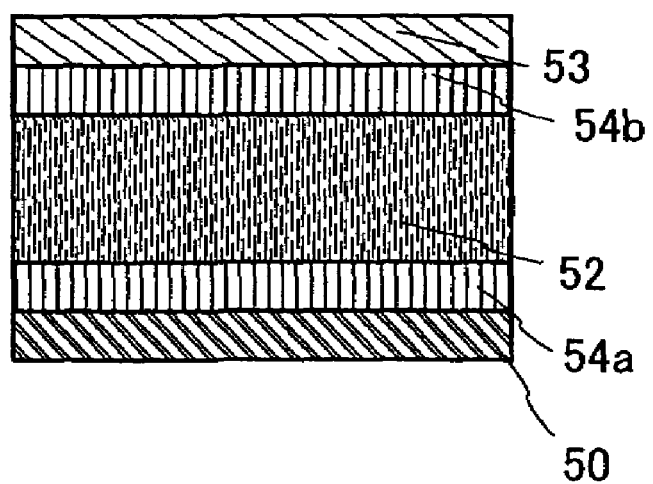

FIGS. 11A to 11C show examples of a thin-film-type inorganic EL element that can be used as a light-emitting element. Each of the light-emitting elements shown in FIGS. 11A to 11C includes a first electrode layer 50, an electroluminescent layer 52, and a second electrode layer 53.

The light-emitting elements shown in FIGS. 11B and 11C each have a structure in which an insulating layer is provided between the electrode layer and the electroluminescent layer of the light-emitting element shown in FIG. 11A. The light-emitting element shown in FIG. 11B has an insulating layer 54 between the first electrode layer 50 and the electroluminescent layer 52. The light-emitting element shown in FIG. 11C has an insulating layer 54a between the first electrode layer 50 and the electroluminescent layer 52, and an insulating layer 54b between the second electrode layer 53 and the electroluminescent layer 52. As described above, the insulating layer may be provided between the electroluminescent layer and one or both of the pair of electrode layers. In addition, the insulating layer may have either a single layer or a plurality of stacked layers.

Although the insulating layer 54 is provided to be in contact with the first electrode layer 50 in FIG. 11B, the insulating layer 54 may also be provided to be in contact with the second electrode layer 53 by reversing the order of the insulating layer and the electroluminescent layer.

In the case of forming a dispersion-type inorganic EL element, a film-form electroluminescent layer is formed by dispersing particles of a light-emitting material in a binder. When particles with a desired size cannot be obtained due to a method of forming a light-emitting material, the material may be processed into particulate forms by being ground in a mortar or the like. A binder is a substance for fixing particles of a light-emitting material in a dispersed state in order to keep the shape of the electroluminescent layer. Light-emitting materials are uniformly dispersed and fixed in the electroluminescent layer by the binder.

The electroluminescent layer of the dispersion-type inorganic EL element can be formed by a droplet discharge method by which an electroluminescent layer can be selectively formed, a printing method (e.g., screen printing or offset printing), a coating method such as a spin coating method, a dipping method, a dispenser method, or the like. The thickness of the electroluminescent layer is not limited to a specific value; however, it is preferably in the range of 10 nm to 1000 nm. In the electroluminescent layer which contains a light-emitting material and a binder, the percentage of the light-emitting material is preferably greater than or equal to 50 wt % and less than or equal to 80 wt %.

Figure 12A:
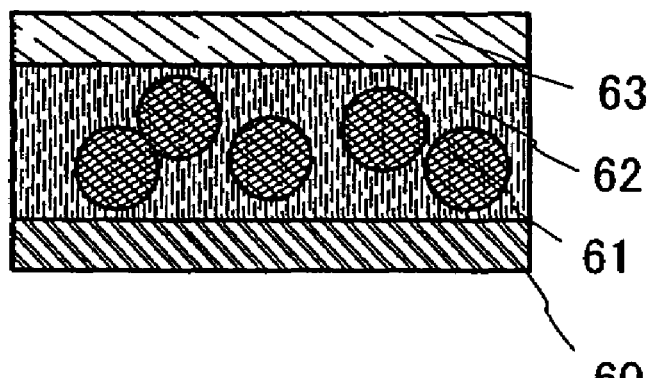
FIGS. 12A to 12C are diagrams illustrating a structure of a light-emitting element which is applicable to the present invention.
Figure 12B:
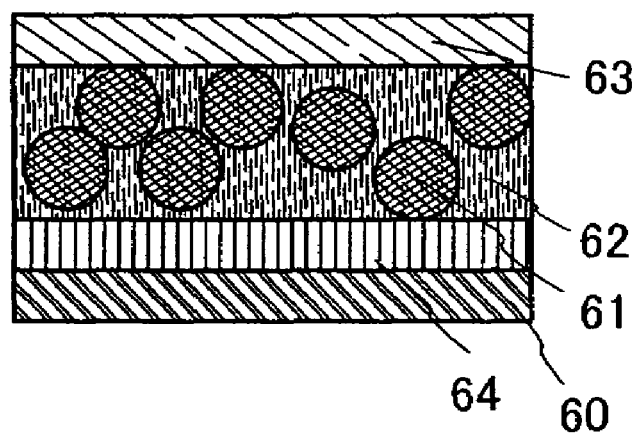
Figure 12C:
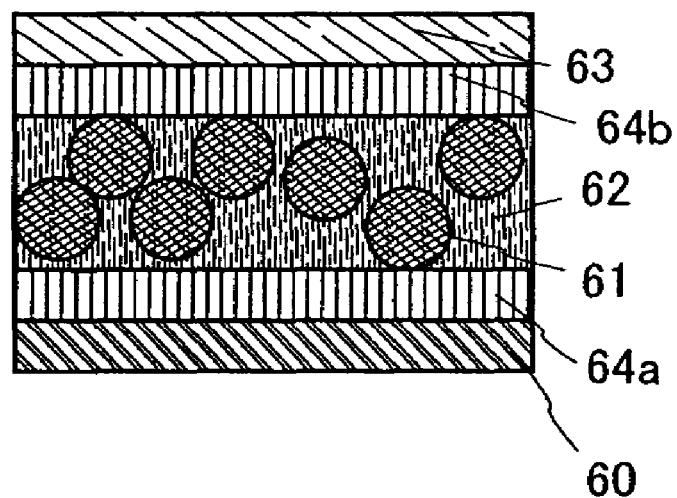

FIGS. 12A to 12C show examples of a dispersion-type inorganic EL element that can be used as a light-emitting element. The light-emitting element shown in FIG. 12A has a structure in which a first electrode layer 60, an electroluminescent layer 62, and a second electrode layer 63 are stacked, and the electroluminescent layer 62 contains a light-emitting material 61 fixed by a binder.

As a binder that can be used in this embodiment mode, an organic material, an inorganic material, or a mixed material of an organic material and an inorganic material can be used. As an organic material, the following resins can be used: a polymer having a relatively high dielectric constant such as a cyanoethyl cellulose based resin, a polyethylene resin, a polypropylene resin, a polystyrene based resin, a silicone resin, an epoxy resin, and vinylidene fluoride. Further, it is also possible to use thermally stable high molecular materials such as aromatic polyamide, polybenzimidazole, and the like; or a siloxane resin. Note that a siloxane resin has a Si—O—Si bond. Siloxane has a skeleton structure with the bond of silicon (Si) and oxygen (O). As a substituent, an organic group containing at least hydrogen (e.g., an alkyl group or aromatic hydrocarbon) is used. Further, a fluoro group may be used as the substituent, or both a fluoro group and an organic group containing at least hydrogen may be used as the substituent. Further, it is also possible to use a resin material such as a vinyl resin (e.g., polyvinyl alcohol, polyvinyl butyral, or the like), a phenol resin, a novolac resin, an acrylic resin, a melamine resin, a urethane resin, an oxazole resin (e.g., polybenzoxazole), or the like. When high-dielectric-constant microparticles of, for example, barium titanate ($BaTiO_3$), strontium titanate ($SrTiO_3$), or the like are mixed as appropriate into the above-described resin, the dielectric constant of the material can be controlled.

As an inorganic material contained in the binder, the following materials can be used: silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, and other substances containing an inorganic material. When a high-dielectric-constant inorganic material is mixed into an organic material (by addition or the like), it becomes possible to control the dielectric constant of the electroluminescent layer which contains a light-emitting material and a binder more efficiently, whereby the dielectric constant can be further increased.

In the manufacturing process, light-emitting materials are dispersed in a solution containing a binder. As a solvent of the solution containing a binder that can be used in this embodiment mode, it is preferable to appropriately select a solvent in which a binder material can be dissolved and with which a solution having a viscosity suitable for a method of forming the electroluminescent layer (various wet processes) and a desired film thickness can be formed. An organic solvent or the like can be used. For example, when a siloxane resin is used as a binder, propylene glycolmonomethyl ether, propylene glycolmonomethyl ether acetate (also referred to as PGMEA), 3-methoxy-3-methyl-1-butanol (also referred to as MMB), or the like can be used.

The light-emitting elements shown in FIGS. 12B and 12C each have a structure in which an insulating layer is provided between the electrode layer and the electroluminescent layer of the light-emitting element shown in FIG. 12A. The light-emitting element shown in FIG. 12B has an insulating layer 64 between the first electrode layer 60 and the electroluminescent layer 62. The light-emitting element shown in FIG. 12C has an insulating layer 64a between the first electrode layer 60 and the electroluminescent layer 62, and an insulating layer 64b between the second electrode layer 63 and the electroluminescent layer 62. As described above, the insulating layer may be provided between the electroluminescent layer and one or both of the pair of electrode layers. In addition, the insulating layer may have either a single layer or a plurality of stacked layers.

Note that the insulating layer 64 is provided in contact with the first electrode layer 60 in FIG. 12B, but, the insulating layer 64 may be provided in contact with the second electrode layer 63 by reversing the positions of the insulating layer and the electroluminescent layer.

There is no particular limitation of insulating layers to be selected as the insulating layers 54, 54a, 54b, 64, 64a, and 64b shown in FIGS. 11B, 11C, 12B, and 12C, but they preferably have high insulation voltage and are dense films. Further, the insulating layers preferably have high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like can be used. Alternatively, a mixed film of any of those materials or a stacked-layer film including two or more of those materials can be used. An insulating film of a material selected from the foregoing materials can be formed by sputtering, evaporation, CVD, or the like. Alternatively, the insulating layer may be formed by dispersing particles of a material selected from the foregoing insulating materials in a binder. A material for the binder may be the same as the binder contained in the electroluminescent layer and may be formed by the same method. There is no particular limitation on a film thickness of the binder, but preferably it is in a range of 10 nm to 1000 nm.

The light-emitting element of this embodiment emits light when voltage is applied between the pair of electrode layers sandwiching the electroluminescent layer. The light-emitting element of this embodiment can operate with either direct current driving or alternating current driving.

This embodiment mode can be combined with any of Embodiment Mode 1 and 4 as appropriate.

In the semiconductor device of this embodiment mode, as described in Embodiment Mode 1, an SOI substrate can be used which is provided with a semiconductor layer that is separated from a semiconductor substrate, bonded to a supporting substrate, and then subjected to irradiation with electromagnetic waves and polishing treatment so that crystal defects are reduced and high planarity is provided. Therefore, a semiconductor device which has high performance and high reliability can be formed with high yield.

Embodiment Mode 7

A television device can be completed using a semiconductor device which includes a display element and is formed by the present invention. An example of a television device having high performance and high reliability will be described.

Figure 16:
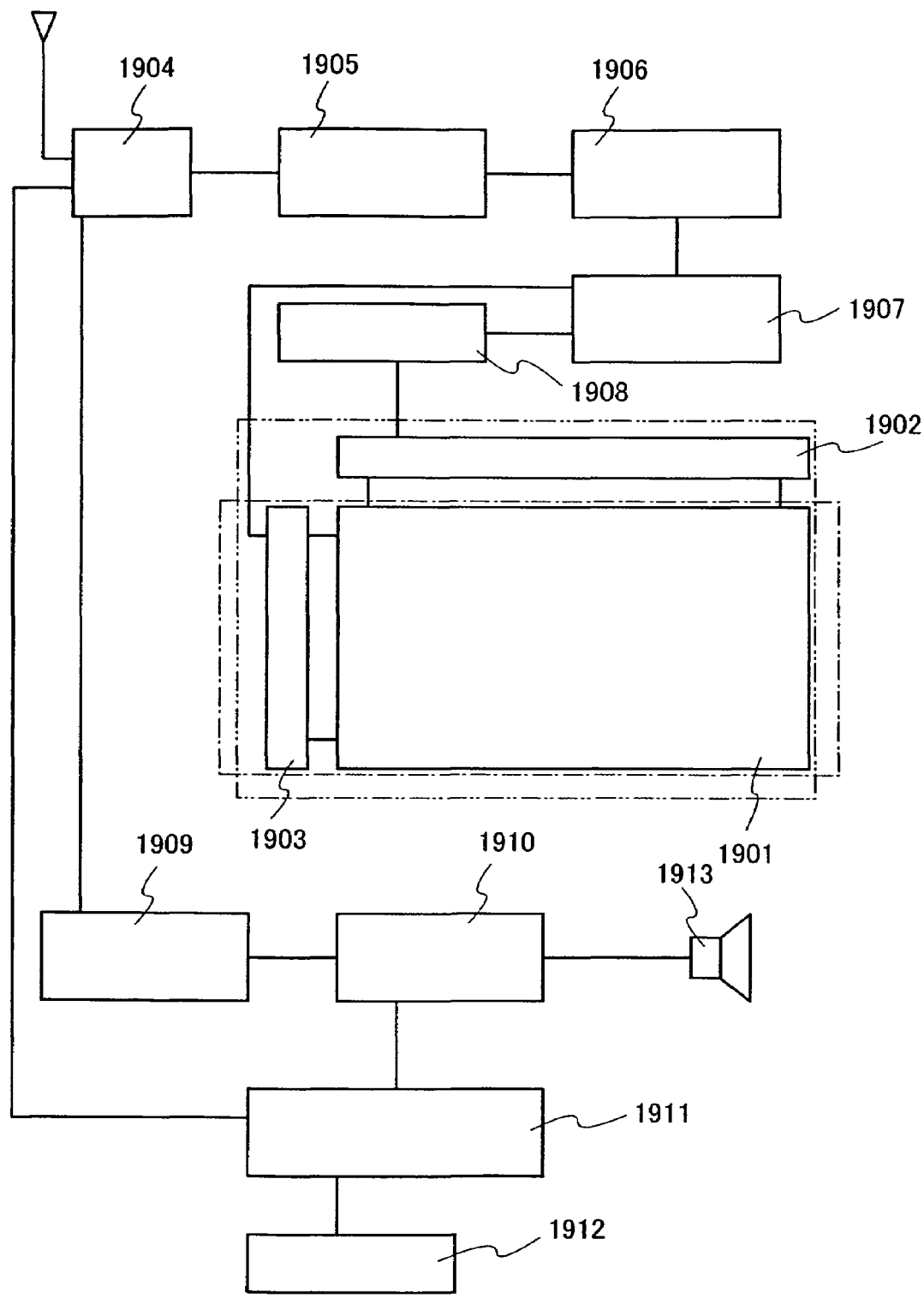
FIG. 16 is a block diagram illustrating a main structure of an electronic device to which the present invention is applied.

FIG. 16 is a block diagram showing a main configuration of a television device (a liquid crystal television device or an EL television device). As for the structures of other external circuits, a video signal amplifier circuit 1905 for amplifying video signals among signals received at a tuner 1904, a video signal processing circuit 1906 for converting signals output from the video signal amplifier circuit 1905 into color signals corresponding to red, green, and blue, a control circuit 1907 for converting the video signals into an input specification of the driver ICs, and the like are provided on the input side of the video signals. The control circuit 1907 outputs signals to each of the scanning line side and the signal line side. In the case of digital driving, a signal divider circuit 1908 may be provided on the signal line side so that input digital signals can be divided into m pieces to be supplied.

Audio signals among the signals received at the tuner 1904 are transmitted to an audio signal amplifier circuit 1909, and an output thereof is supplied to a speaker 1913 through an audio signal processing circuit 1910. A control circuit 1911 receives control data on the receiving station (reception frequency) or sound volume from an input portion 1912, and transmits signals to the tuner 1904 and the audio signal processing circuit 1910.

Figure 20A:
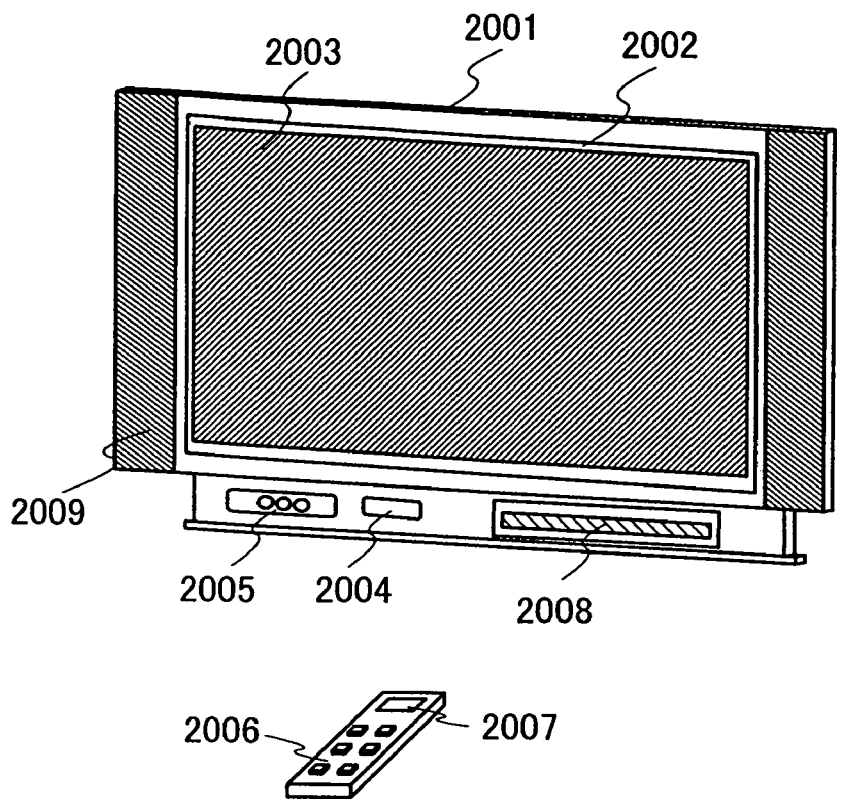
FIGS. 20A and 20B are diagrams illustrating electronic devices to which the present invention is applied.
Figure 20B:
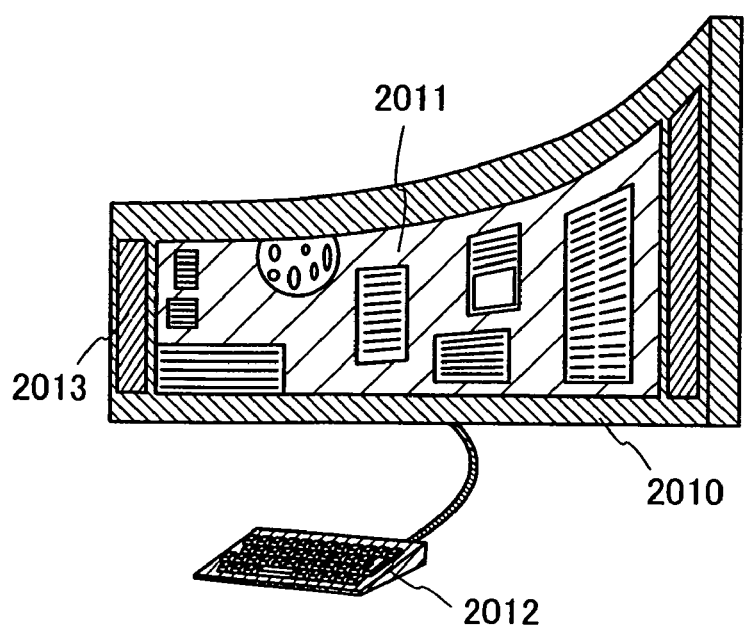

By incorporating a display module into a housing as shown in FIGS. 20A and 20B, a television device can be completed. A display panel in which components up to an FPC are set as shown in FIGS. 8A and 8B is generally called an EL display module. When an EL display module as shown in FIGS. 8A and 8B is used, an EL television device can be completed, and when a liquid crystal display module as shown in FIGS. 7A and 7B is used, a liquid crystal television device can be completed. Using a display module, a main display screen 2003 can be formed, and other accessories such as speaker portions 2009 and operation switches are provided. In this manner, a television device can be completed according to the present invention.

In addition, reflected light of incident light from external may be blocked with the use of a retardation plate or a polarizing plate. In a top-emission semiconductor device, an insulating layer serving as a partition wall may be colored to be used as a black matrix. This partition wall can also be formed by a droplet discharge method or the like. Carbon black or the like may be mixed into a black resin of a pigment material or a resin material such as polyimide or the like, or a stacked layer thereof may be used. By a droplet discharge method, different materials may be discharged to the same region plural times to form the partition wall. A quarter wave plate ($\lambda/4$) or a half wave plate ($\lambda/2$) may be used as the retardation plate and may be designed to be able to control light. As the structure, the light-emitting element, the sealing substrate (sealant), the retardation plates (a quarter wave plate ($\lambda/4$) and a half wave plate ($\lambda/2$)), and the polarizing plate are formed over a TFT element substrate in this order, and light emitted from the light-emitting element is transmitted therethrough and is emitted to the outside from the polarizing plate side. The retardation plate or the polarizing plate may be provided on a side to which light is emitted or may be provided on both sides in the case of a dual-emission semiconductor device in which light is emitted from the both sides. In addition, an anti-reflective film may be provided on the outer side of the polarizing plate. Accordingly, high-definition and precise images can be displayed.

A display panel 2002 using a display element is incorporated into a housing 2001 as shown in FIG. 20A. In addition to reception of general TV broadcast with the use of a receiver 2005, communication of information can also be performed in one way (from a transmitter to a receiver) or in two ways (between a transmitter and a receiver or between receivers) by connection to a wired or wireless communication network through a modem 2004. The television device can be operated with switches incorporated in the housing or with a remote control device 2006 separated from the main body. A display portion 2007 that displays information to be output may also be provided for this remote control device.

In addition, for the television device, a structure for displaying a channel, sound volume, or the like may be additionally provided by formation of a sub-screen 2008 with a second display panel in addition to the main screen 2003. In this structure, the main screen 2003 may be formed using an EL display panel excellent in viewing angle, and the sub-screen 2008 may be formed using a liquid crystal display panel capable of displaying with low power consumption. In order to prioritize low power consumption, a structure in which the main screen 2003 is formed using a liquid crystal display panel, the sub-screen 2008 is formed using an EL display panel, and the sub-screen is able to flash on and off may be employed. By the present invention, a semiconductor device with high performance and high reliability can be manufactured with high productivity even with the use of a large-sized substrate with a number of TFTs and electronic components.

FIG. 20B shows a television device which has a large display portion, for example, 20-inch to 80-inch display portion and includes a housing 2010, a keyboard portion 2012 which is an operation portion, a display portion 2011, a speaker portion 2013, and the like. The present invention is applied to manufacture of the display portion 2011. The display portion in FIG. 20B is formed using a bendable material; therefore, the television device includes the bent display portion. Since the shape of the display portion can be freely set, a television device having a desired shape can be manufactured.

In accordance with the present invention, a semiconductor device with high performance and high reliability which has a display function can be manufactured with high productivity. Therefore, a television device with high performance and high reliability can be manufactured with high productivity.

The present invention is certainly not limited to the television device and is also applicable to various uses such as a monitor of a personal computer and a display medium having a large area, for example, an information display board at a train station, an airport, or the like, or an advertisement display board on the street.

Embodiment Mode 8

In this embodiment mode, an example of a semiconductor device having high performance and high reliability will be described. Specifically, as examples of the semiconductor device, examples of a microprocessor and a semiconductor device which has an arithmetic function and can transmit and receive data without contact are described.

Figure 17:
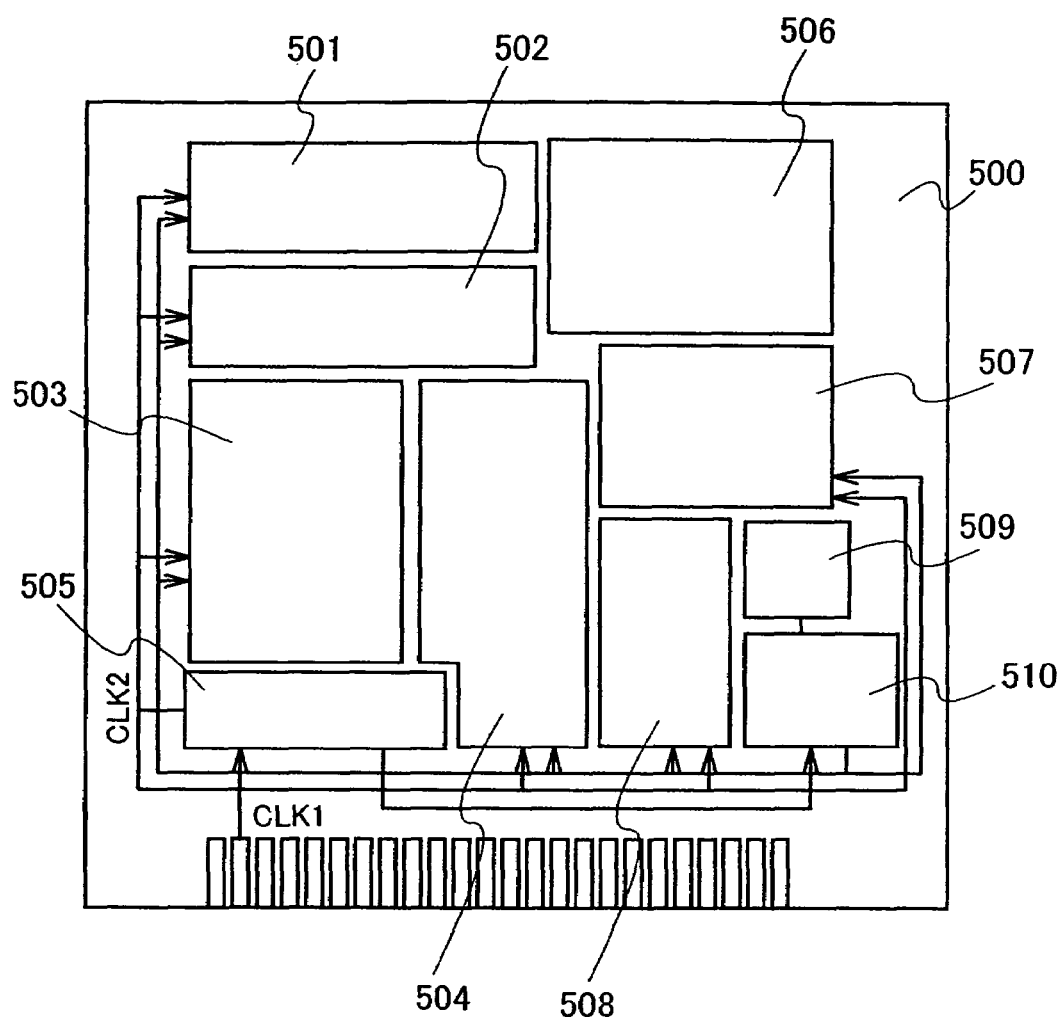
FIG. 17 is a block diagram illustrating a structure of a microprocessor obtained using a semiconductor substrate.

FIG. 17 shows a structure of a microprocessor 500 as an example of a semiconductor device. As described above, the microprocessor 500 is manufactured using the semiconductor substrate of this embodiment mode. This microprocessor 500 has an arithmetic logic unit (also referred to as an ALU) 501, an ALU controller 502, an instruction decoder 503, an interrupt controller 504, a timing controller 505, a register 506, a register controller 507, a bus interface (bus I/F) 508, a read only memory 509, and a memory interface (ROM I/F) 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction. Specifically, the ALU controller 502 generates a signal for controlling the operation of the arithmetic logic unit 501. The interrupt controller 504 judges an interrupt request from an external input/output device or a peripheral circuit based on its priority or a mask state, and processes the request while a program is executed in the microprocessor 500. The register controller 507 generates an address of the register 506, and reads/writes data from/to the register 506 in accordance with the state of the microprocessor 500. The timing controller 505 generates signals for controlling timing of driving of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the clock signal CLK2 to each of the above-mentioned circuits. Note that the microprocessor 500 shown in FIG. 17 is just an example of the simplified structure, and practical microprocessors have various structures depending on usage.

Since an integrated circuit is formed using a single-crystal semiconductor layer whose crystals are oriented in a certain direction and which is bonded to a glass substrate in the microprocessor 500, higher processing speed and lower power consumption can be achieved.

Figure 18:
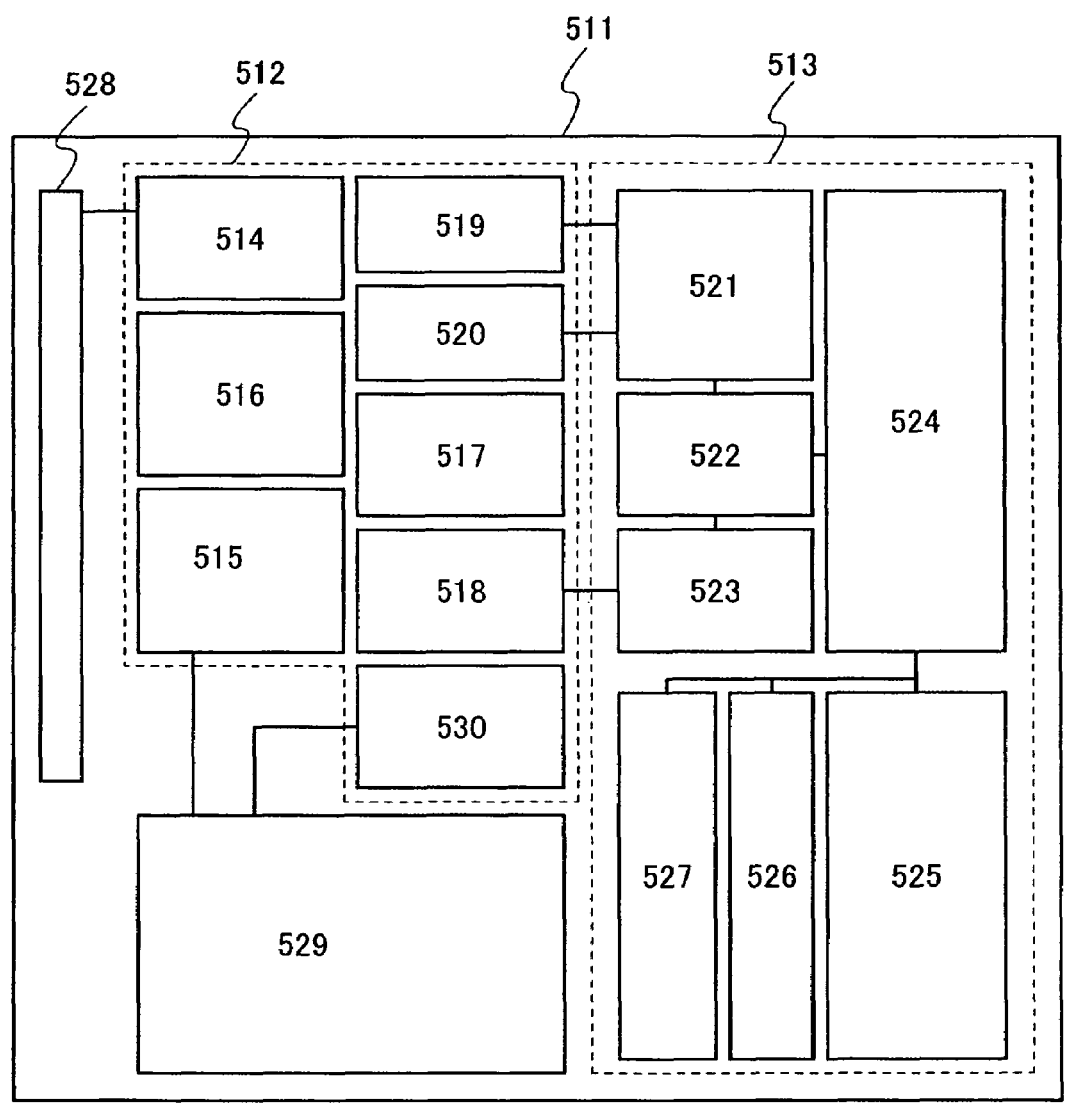
FIG. 18 is a block diagram illustrating a structure of an RFCPU obtained using a semiconductor substrate.

Next, an example of a semiconductor device which has an arithmetic function and can transmit and receive data without contact will be described with reference to FIG. 18. FIG. 18 shows an example of a computer (hereinafter also referred to as an RFCPU) which transmits and receives signals to/from an external device by wireless communication. An RFCPU 511 has an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply control circuit 530. The digital circuit portion 513 includes an RF interface 521, a control register 522, a clock controller 523, a CPU interface 524, a central processing unit 525, a random access memory 526, and a read only memory 527.

The operation of the RFCPU 511 having such a structure is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily formed over the same substrate as the RFCPU 511 and may be attached as another component to a substrate having an insulating surface that partially forms the RFCPU 511.

The reset circuit 517 generates a signal that resets the digital circuit portion 513 to be initialized. For example, the reset circuit 517 generates, as a reset signal, a signal that rises with delay after increase in the power supply voltage. The oscillator circuit 518 changes the frequency and the duty ratio of a clock signal in accordance with a control signal generated by the constant voltage circuit 516. The demodulation circuit 519 having a low pass filter binarizes changes in amplitude of reception signals of an amplitude shift keying (ASK) system, for example. The modulation circuit 520 changes the amplitude of transmission signals of an amplitude shift keying (ASK) system to be transmitted. The modulation circuit 520 changes the resonance point of the resonance circuit 514, thereby changing the amplitude of communication signals. The clock controller 523 generates a control signal for changing the frequency and the duty ratio of the clock signal in accordance with the power supply voltage or current consumption in the central processing unit 525. The power supply voltage is monitored by the power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like. The central processing unit 525 accesses the read only memory 527, the random access memory 526, and the control register 522 via the CPU interface 524. The CPU interface 524 has a function of generating an access signal for any one of the read only memory 527, the random access memory 526, and the control register 522 based on an address requested by the central processing unit 525.

As an arithmetic method of the central processing unit 525, a method may be employed in which the read only memory 527 stores an OS (operating system) and a program is read at the time of starting operation and then executed. Alternatively, a method may be employed in which a circuit dedicated to arithmetic is formed as an arithmetic circuit and an arithmetic processing is conducted using hardware. In a method in which both hardware and software are used, a method can be employed in which part of process is conducted in the circuit dedicated to arithmetic and the other part of the arithmetic process is conducted by the central processing unit 525 using a program.

Since an integrated circuit is formed using a single-crystal semiconductor layer whose crystals are oriented in a certain direction and which is bonded to a glass substrate in the RFCPU 511, higher processing speed and lower power consumption can be achieved. Accordingly, even when the capacitor portion 529 which supplies electric power is miniaturized, long-term operation can be secured.

Embodiment Mode 9

This embodiment mode will be described with reference to FIGS. 14A and 14B. This embodiment mode shows an example of a module using a panel including the semiconductor device manufactured in Embodiment Modes 1 to 8. In this embodiment mode, an example of a module including a semiconductor device having high performance and high reliability will be described.

Figure 14A:
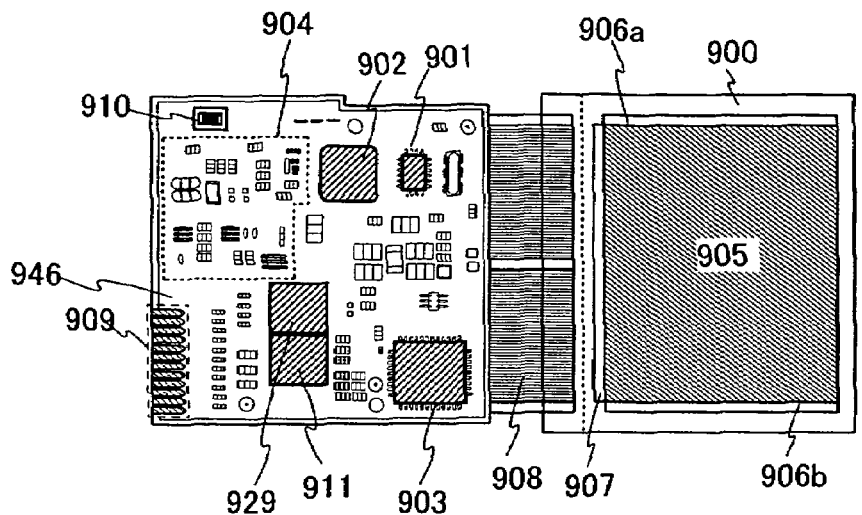
FIGS. 14A and 14B are diagrams illustrating an electronic device to which the present invention is applied.

A module of an information terminal shown in FIG. 14A includes a printed wiring board 946 on which a controller 901, a central processing unit (CPU) 902, a memory 911, a power supply circuit 903, an audio processing circuit 929, a transmission/reception circuit 904, and other elements such as a resistor, a buffer, a capacitor, and the like are mounted. In addition, a panel 900 is connected to the printed wiring board 946 through a flexible printed circuit (FPC) 908.

The panel 900 is provided with a pixel region 905 having a light-emitting element in each pixel, a first scanning line driver circuit 906a and a second scanning line driver circuit 906b which select a pixel included in the pixel region 905, and a signal line driver circuit 907 which supplies a video signal to the selected pixel.

Various control signals are input and output through an interface (I/F) 909 provided over the printed wiring board 946. An antenna port 910 for transmitting and receiving signals to/from an antenna is provided over the printed wiring board 946.

In this embodiment mode, the printed wiring board 946 is connected to the panel 900 through the FPC 908; however, the present invention is not limited to this structure. The controller 901, the audio processing circuit 929, the memory 911, the CPU 902, or the power supply circuit 903 may be directly mounted on the panel 900 by a COG (chip on glass) method. Moreover, various elements such as a capacitor, a buffer, and the like are provided over the printed wiring board 946, so that a noise in power supply voltage or a signal and delay in signal rising are prevented.

Figure 14B:
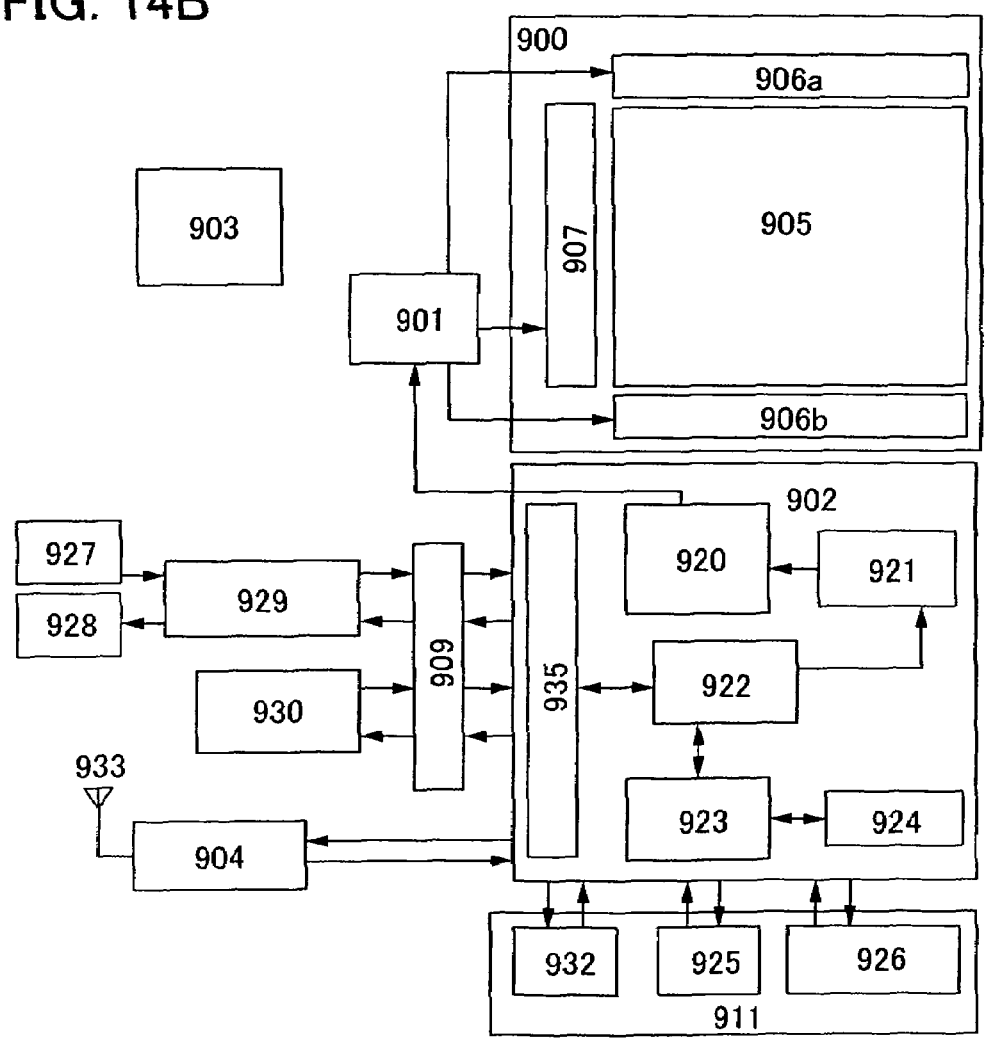

FIG. 14B is a block diagram of the module shown in FIG. 14A. A module 999 includes a VRAM 932, a DRAM 925, a flash memory 926, and the like in the memory 911. The VRAM 932 stores image data to be displayed on the panel, the DRAM 925 stores image data or audio data, and the flash memory stores various programs.

The power supply circuit 903 generates power supply voltage applied to the panel 900, the controller 901, the CPU 902, the audio processing circuit 929, the memory 911, and the transmission/reception circuit 904. Moreover, depending on the specifications of the panel, a current source is provided in the power supply circuit 903 in some cases.

The CPU 902 includes a control signal generating circuit 920, a decoder 921, a register 922, an arithmetic circuit 923, a RAM 924, an interface 935 for the CPU, and the like. Various signals input to the CPU 902 through the interface 935 are input to the arithmetic circuit 923, the decoder 921, and the like after once being held in the register 922. The arithmetic circuit 923 carries out an arithmetic operation based on the input signal and specifies an address to which various instructions are sent. On the other hand, the signal input to the decoder 921 is decoded and input to the control signal generating circuit 920. The control signal generating circuit 920 generates a signal including various instructions based on the input signal and sends it to the address specified by the arithmetic circuit 923, specifically, the memory 911, the transmission/reception circuit 904, the audio processing circuit 929, the controller 901, and the like.

The memory 911, the transmission/reception circuit 904, the audio processing circuit 929, and the controller 901 operate in accordance with respective instructions received. The operations will be briefly described below.

The signal input from an input unit 930 is transmitted to the CPU 902 mounted on the printed wiring board 946 through the interface 909. The control signal generating circuit 920 converts the image data stored in the VRAM 932 into a predetermined format in accordance with the signal transmitted from the input unit 930 such as a pointing device and a keyboard, and then transmits it to the controller 901.

The controller 901 processes a signal including image data transmitted from the CPU 902 in accordance with the specifications of the panel and supplies it to the panel 900. The controller 901 generates a Hsync signal, a Vsync signal, a clock signal CLK, alternating voltage (AC Cont), and a switching signal I/R based on the power supply voltage input from the power supply circuit 903 and various signals input from the CPU 902 and supplies them to the panel 900.

In the transmission/reception circuit 904, a signal transmitted and received as an electric wave at an antenna 933 is processed. Specifically, high frequency circuits such as an isolator, a band path filter, a VCO (voltage controlled oscillator), an LPF (low pass filter), a coupler, and a balun are included. Among the signals transmitted and received at the transmission/reception circuit 904, signals including audio data are transmitted to the audio processing circuit 929 in accordance with an instruction transmitted from the CPU 902.

The signals including audio data transmitted in accordance with the instruction from the CPU 902 are demodulated into audio signals in the audio processing circuit 929 and transmitted to a speaker 928. The audio signal transmitted from a microphone 927 is modulated in the audio processing circuit 929 and transmitted to the transmission/reception circuit 904 in accordance with the instruction from the CPU 902.

The controller 901, the CPU 902, the power supply circuit 903, the audio processing circuit 929, and the memory 911 can be incorporated as a package of this embodiment mode. This embodiment mode is applicable to any circuit other than high frequency circuits such as an isolator, a band path filter, a VCO (voltage controlled oscillator), an LPF (low pass filter), a coupler, and a balun.

Embodiment Mode 10

Figure 15:
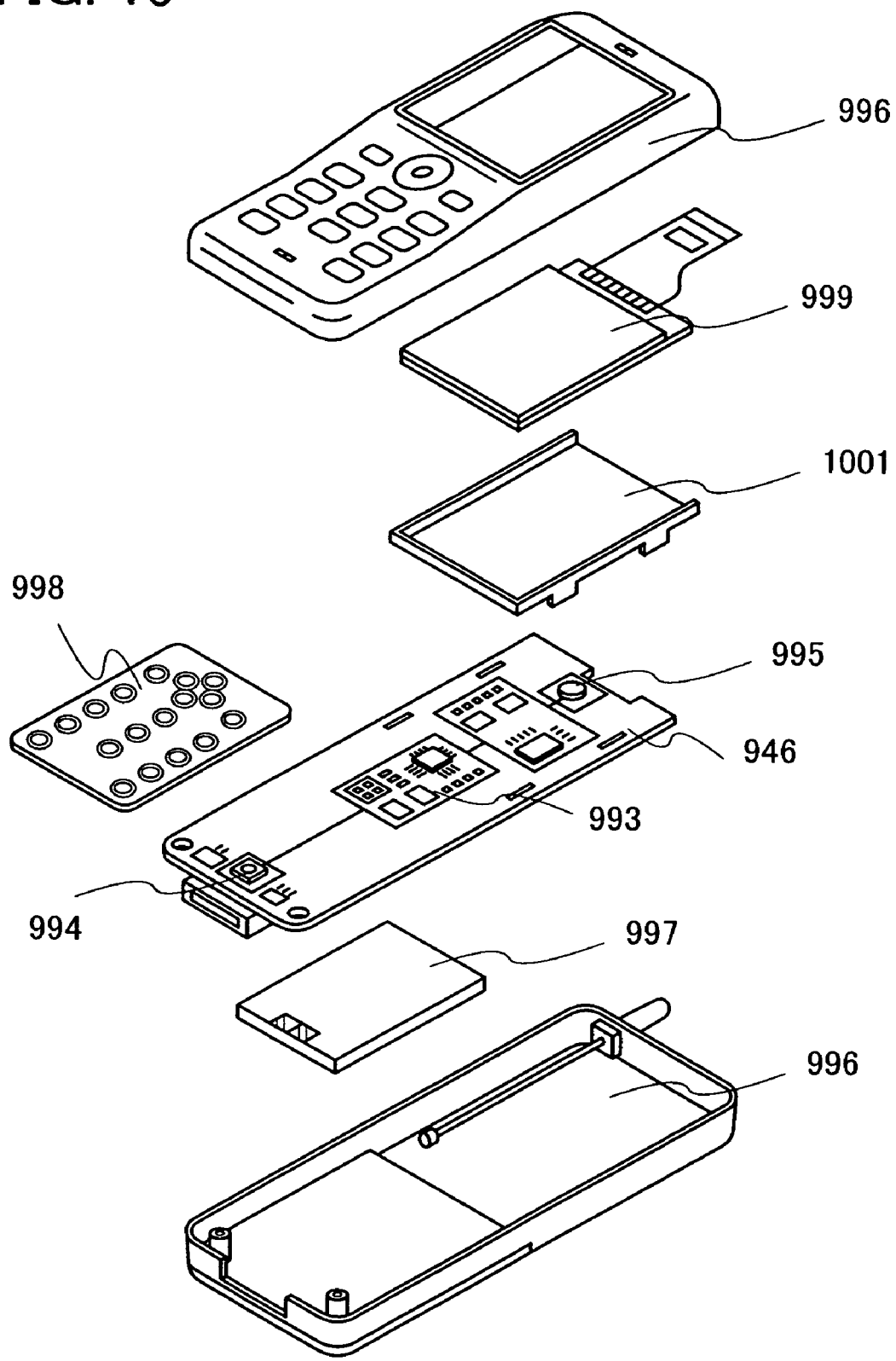
FIG. 15 is a diagram illustrating an electronic device to which the present invention is applied.

This embodiment mode will be described with reference to FIGS. 14A and 14B and 15. FIG. 15 shows one mode of a portable compact phone (mobile phone) which includes the module manufactured in Embodiment Mode 9 and operates wirelessly. The panel 900 is detachably incorporated into a housing 1001 so as to be easily combined with the module 999. The shape and the size of the housing 1001 can be appropriately changed in accordance with an electronic device incorporated therein.

The housing 1001 in which the panel 900 is fixed is fitted to the printed wiring board 946 and set up as a module. A controller, a CPU, a memory, a power supply circuit, and other elements such as a resistor, a buffer, a capacitor, and the like are mounted on the printed wiring board 946. Moreover, an audio processing circuit including a microphone 994 and a speaker 995 and a signal processing circuit 993 such as a transmission/reception circuit or the like are provided. The panel 900 is connected to the printed wiring board 946 through the FPC 908.

The module 999, an input unit 998, and a battery 997 are stored in a housing 996. The pixel region of the panel 900 is arranged so that it can be seen through a window formed in the housing 996.

The housing 996 shown in FIG. 15 is an example of an exterior shape of a telephone. However, an electronic device of this embodiment mode can be changed into various modes in accordance with functions and intended purposes. In the following embodiment mode, examples of the modes will be described.

Embodiment Mode 11

By applying the present invention, various semiconductor devices having a display function can be manufactured. In other words, the present invention is applicable to various electronic devices in which these semiconductor devices having a display function are incorporated into display portions. In this embodiment mode, examples of electronic devices including a semiconductor device having high performance and high reliability will be described.

As electronic devices of the present invention, television devices (also simply referred to as televisions or television receivers), cameras such as digital cameras or digital video cameras, mobile phone sets (also simply referred to as mobile phones or cell-phones), portable information terminals such as PDAs, portable game machines, monitors for computers, computers, audio reproducing devices such as car audio systems, image reproducing devices provided with a recording medium such as home game machines (specifically, a digital versatile disc (DVD)), and the like can be given. Specific examples thereof will be described with reference to FIGS. 19A to 19E.

Figure 19A:
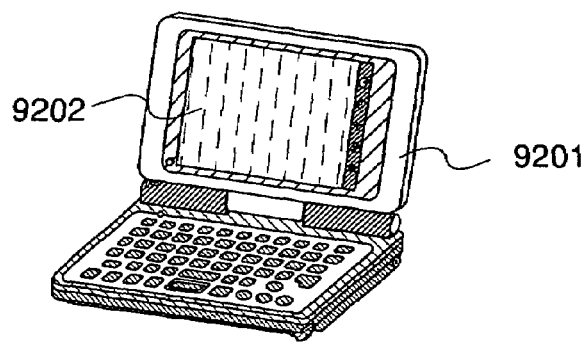
FIGS. 19A to 19E are diagrams illustrating electronic devices to which the present invention is applied.

A portable information terminal shown in FIG. 19A includes a main body 9201, a display portion 9202, and the like. The semiconductor device of the present invention is applicable to the display portion 9202. Accordingly, a portable information terminal with high performance and high reliability can be provided.

Figure 19B:
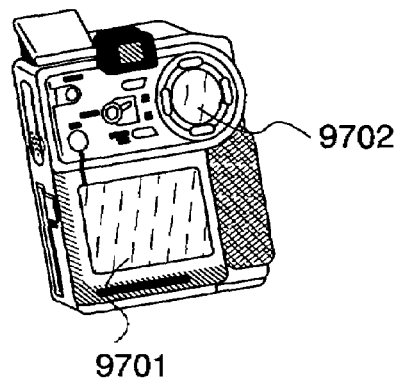

A digital video camera shown in FIG. 19B includes a display portion 9701, a display portion 9702, and the like. The semiconductor device of the present invention is applicable to the display portion 9701. Accordingly, a digital video camera with high performance and high reliability can be provided.

Figure 19C:
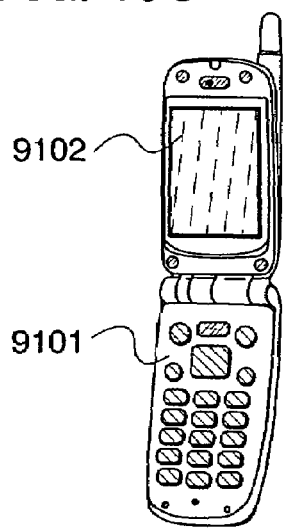

A mobile phone shown in FIG. 19C includes a main body 9101, a display portion 9102, and the like. The semiconductor device of the present invention is applicable to the display portion 9102. Accordingly, a mobile phone with high performance and high reliability can be provided.

Figure 19D:
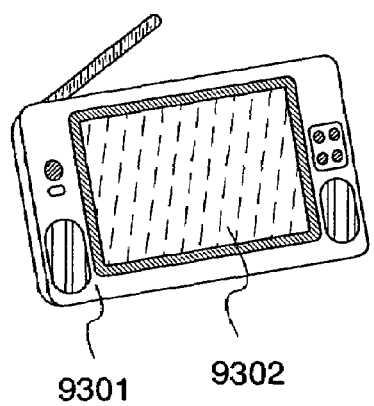

A portable television device shown in FIG. 19D includes a main body 9301, a display portion 9302, and the like. The semiconductor device of the present invention is applicable to the display portion 9302. Accordingly, a portable television device with high performance and high reliability can be provided. The semiconductor device of the present invention is applicable to various types of television devices including a small-sized television incorporated in a portable terminal such as a mobile phone or the like, a medium-sized television that is portable, and a large-sized television (e.g., 40 inches or more in size).

Figure 19E:
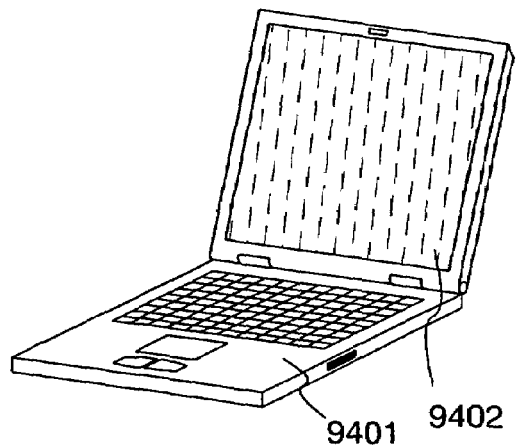

A portable computer shown in FIG. 19E includes a main body 9401, a display portion 9402, and the like. The semiconductor device of the present invention is applicable to the display portion 9402. Accordingly, a portable computer with high performance and high reliability can be provided.

The semiconductor device of the present invention can also be used as a lighting system. The semiconductor device to which the present invention is applied can also be used as a small desk lamp or a large-scale lighting system in a room. Further, the semiconductor device of the present invention can also be used as a backlight of a liquid crystal display device.

In this manner, by using the semiconductor device of the present invention, electronic devices with high performance and high reliability can be provided.

Example 1

In this example, a thin film transistor is manufactured using the present invention, and the result of the electric characteristic evaluation is shown.

As Example A, a laser beam irradiation step was performed on a silicon layer which had been separated from a single-crystal silicon substrate and bonded to a glass substrate, and the silicon layer, which was subjected to a polishing step by a CMP method, was used to form an n-channel thin film transistor having a top-gate planar structure.

As Example B, etching treatment was performed on a silicon layer which had been separated from a single-crystal silicon substrate and bonded to a glass substrate; a laser beam irradiation step was performed on the silicon layer; and the silicon layer, which was subjected to a polishing step by a CMP method, was used to form an n-channel thin film transistor having a top-gate planar structure.

Further, as Comparative Example, only a laser beam irradiation step was performed on a silicon layer which has been separated from a single-crystal silicon substrate and bonded to a glass substrate, and the silicon layer was used to form an n-channel thin film transistor having a top-gate planar structure. As the transistor structure of each in Comparative Example, Example A, and Example B, a silicon oxide layer (a thickness of 50 nm) which is formed using tetraethoxysilane as an organic silane gas, a silicon nitride oxide layer (a thickness of 50 nm), a silicon oxynitride layer (a thickness of 50 nm), a silicon layer (a thickness of 55 nm) are sequentially stacked over the glass substrate; and a gate insulating layer (a stacked layer of a silicon oxide layer having a thickness of 10 nm and a silicon oxynitride layer having a thickness of 10 nm) over the silicon layer, a gate electrode layer (a stacked layer of a tantalum nitride layer having a thickness of 30 nm and a tungsten layer having a thickness of 370 nm) over the gate insulating layer, and a source electrode layer and a drain electrode layer (a stacked layer in which a titanium layer having a thickness of 60 nm, a titanium nitride layer having a thickness of 40 nm, an aluminum layer having a thickness of 300 nm, and a titanium layer having a thickness of 100 nm are sequentially stacked) connected to a source region and a drain region (impurity regions which include phosphorus as an impurity element that imparts n-type conductivity) in the silicon layer are included. In addition, an interlayer insulating layer (a stacked layer in which a silicon oxynitride film having a thickness of 50 nm, a silicon nitride film having a thickness of 100 nm, and a silicon oxide film having a thickness of 600 nm are sequentially stacked) is formed over the transistor.

Detailed conditions of a manufacturing process are described hereinafter.

The specification of a laser used in the laser beam irradiation step in Example A, Example B, and Comparative Example was set as follows: an XeCl excimer laser, a wavelength of 308 nm, a pulse duration of 25 nsec, and a repetition frequency of 30 Hz.

A laser beam is a linear-shaped laser beam whose laser beam spot has a linear shape by using an optical system including a cylindrical lens or the like. A substrate having a semiconductor layer is irradiated with a laser beam while being relatively moved with respect to the laser beam. At this time, the scanning speed of the laser beam is 1.0 mm/sec, and a region is irradiated with ten shots of the laser beam.

In addition, the atmosphere of the laser beam was a nitrogen atmosphere, and the energy density of the laser beam was in the range of about 620 mJ/cm$^2$ to 710 mJ/cm$^2$.

The conditions of the CMP method used in the polishing treatment step in Example A and Example B were set as follows: abrasive cloth (IC 1400 made by Nitta Haas Incorporated), slurry liquid (NP 8020 made by Nitta Haas Incorporated, a grain size of 60 nm, and twenty-fold dilution), a slurry flow rate of 100 ml/min, a polishing pressure of 0.01 MPa, a spindle rotation speed of 20 rpm, a table rotation speed of 20 rpm, and processing time of 3.4 min. The silicon layer had a thickness of 55 nm by performing the polishing treatment step for the silicon layer in Example A and Example B.

Etching conditions used in the etching step in Example B were set as follows: a power to be applied to a coil-shaped electrode of 150 W, a power to be applied to a lower electrode of 40 W, a reaction pressure of 1.0 Pa, and an etching gas (flow rate of chlorine) of 100 sccm. The silicon layer had a thickness of 95 nm by performing dry etching to the silicon layer in Example B.

Figure 21:
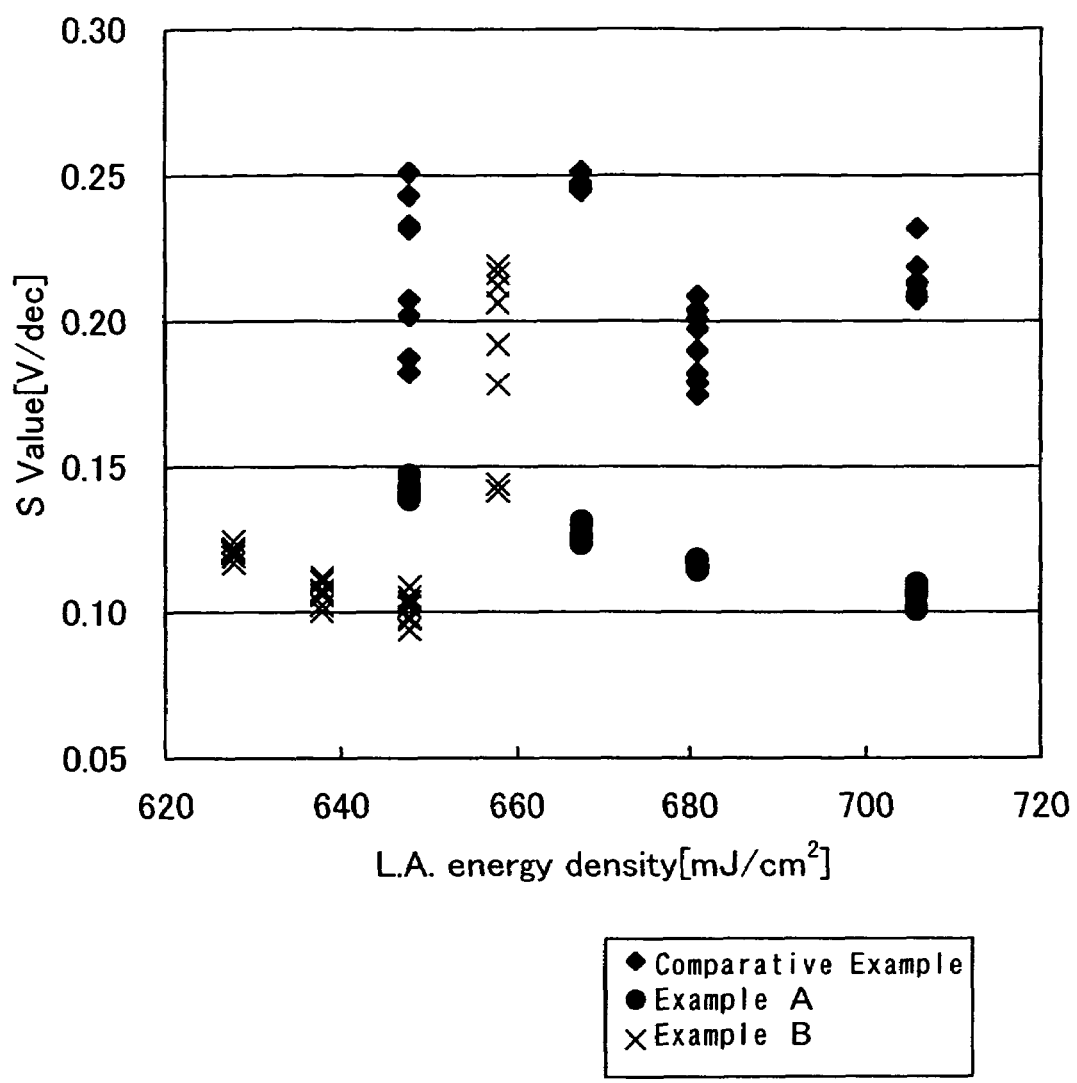
FIG. 21 is a graph illustrating a relationship between laser energy density and subthreshold swing of a thin film transistor of Comparative Example, Example A, and Example B.

In FIG. 21, a relationship between laser energy density and subthreshold swing (also referred to as an S value or a subthreshold coefficient) of Example A, Example B, and Comparative Example is shown. In FIG. 21, a diamond-shaped data marker is used for Comparative Example, a circular data marker is used for Example A, and an x-shaped data marker is used for Example B.

As shown in FIG. 21, the result confirms that Comparative Example had the largest S value, followed by Example A and Example B, and that the electric characteristics of a thin film transistor was improved by using the present invention.

In this example as described above, a semiconductor device which has high performance and high reliability can be formed with high yield by using an SOI substrate that has a semiconductor layer in which a crystal defect is reduced by irradiation with electromagnetic waves and which has high planarity by polishing treatment.

This application is based on Japanese Patent Application serial No. 2007-173070 filed with Japan Patent Office on Jun. 29, 2007, the entire contents of which are hereby incorporated by reference.

What is claimed is:

1. A method of manufacturing a silicon-on-insulator (SOI) substrate, comprising:
irradiating one surface of a semiconductor substrate with an ion to form an embrittlement layer at a given depth from the one surface of the semiconductor substrate;
forming an insulating layer over the one surface of the semiconductor substrate or over a supporting substrate;
performing a heat treatment for generating a crack in the embrittlement layer in a state that the semiconductor substrate and the supporting substrate are overlapped with each other with the insulating layer interposed therebetween and for separating the semiconductor substrate at the embrittlement layer so that a semiconductor layer is formed over the supporting substrate;
irradiating the semiconductor layer with an electromagnetic wave; and
performing a polishing treatment on a surface of the semiconductor layer after irradiating the semiconductor layer.

2. A method of manufacturing a silicon-on-insulator (SOI) substrate, comprising:
forming an insulating layer over one surface of a semiconductor substrate;
irradiating the semiconductor substrate with an ion through the insulating layer formed over the one surface of the semiconductor substrate to form an embrittlement layer at a given depth from the one surface of the semiconductor substrate;
performing a heat treatment for generating a crack in the embrittlement layer in a state that the semiconductor substrate and a supporting substrate are overlapped with each other with the insulating layer interposed therebetween and for separating the semiconductor substrate at the embrittlement layer so that a semiconductor layer is formed over the supporting substrate;
irradiating the semiconductor layer with an electromagnetic wave; and
performing a polishing treatment on a surface of the semiconductor layer after irradiating the semiconductor layer.

3. A method of manufacturing a silicon-on-insulator (SOI) substrate, comprising:
irradiating one surface of a semiconductor substrate with an ion to form an embrittlement layer at a given depth from the one surface of the semiconductor substrate;
forming an insulating layer over the one surface of the semiconductor substrate or over a supporting substrate;
performing a heat treatment for generating a crack in the embrittlement layer in a state that the semiconductor substrate and the supporting substrate are overlapped with each other with the insulating layer interposed therebetween and for separating the semiconductor substrate at the embrittlement layer so that a semiconductor layer is formed over the supporting substrate;
performing a first polishing treatment on a surface of the semiconductor layer;
irradiating the semiconductor layer which is subjected to the first polishing treatment with an electromagnetic wave; and
performing a second polishing treatment on the surface of the semiconductor layer after irradiating the semiconductor layer.

4. A method of manufacturing a silicon-on-insulator (SOI) substrate, comprising:
forming an insulating layer over one surface of a semiconductor substrate;
irradiating the semiconductor substrate with an ion through the insulating layer formed over the one surface of the semiconductor substrate to form an embrittlement layer at a given depth from the one surface of the semiconductor substrate;
performing a heat treatment for generating a crack in the embrittlement layer in a state that the semiconductor substrate and the supporting substrate are overlapped with each other with the insulating layer interposed therebetween and for separating the semiconductor substrate at the embrittlement layer so that a semiconductor layer is formed over the supporting substrate;
performing a first polishing treatment on a surface of the semiconductor layer;
irradiating the semiconductor layer which is subjected to the first polishing treatment with an electromagnetic wave; and
performing a second polishing treatment on the surface of the semiconductor layer after irradiating the semiconductor layer.

5. The method of manufacturing a silicon-on-insulator (SOI) substrate according to claim 3 or 4, wherein the first polishing treatment and the second polishing treatment are performed by a chemical mechanical polishing method.

6. A method of manufacturing a silicon-on-insulator (SOI) substrate, comprising:
irradiating one surface of a semiconductor substrate with an ion to form an embrittlement layer at a given depth from the one surface of the semiconductor substrate;
forming an insulating layer over the one surface of the semiconductor substrate or over a supporting substrate;
performing a heat treatment for generating a crack in the embrittlement layer in a state that the semiconductor substrate and the supporting substrate are overlapped with each other with the insulating layer interposed therebetween and for separating the semiconductor substrate at the embrittlement layer so that a semiconductor layer is formed over the supporting substrate;
performing an etching treatment on a surface of the semiconductor layer;

irradiating the semiconductor layer which is subjected to the etching treatment with an electromagnetic wave; and performing a polishing treatment on the surface of the semiconductor layer after irradiating the semiconductor layer.

7. A method of manufacturing a silicon-on-insulator (SOI) substrate, comprising:

forming an insulating layer over one surface of a semiconductor substrate;

irradiating the semiconductor substrate with an ion through the insulating layer formed over the one surface of the semiconductor substrate to form an embrittlement layer at a given depth from the one surface of the semiconductor substrate;

performing a heat treatment for generating a crack in the embrittlement layer in a state that the semiconductor substrate and a supporting substrate are overlapped with each other with the insulating layer interposed therebetween and for separating the semiconductor substrate at the embrittlement layer so that a semiconductor layer is formed over the supporting substrate;

performing an etching treatment on a surface of the semiconductor layer;

irradiating the semiconductor layer which is subjected to the etching treatment with an electromagnetic wave; and performing a polishing treatment on the surface of the semiconductor layer after irradiating the semiconductor layer.

8. The method of manufacturing a silicon-on-insulator (SOI) substrate according to any one of claims 1, 2, 6, and 7, wherein the polishing treatment is performed by a chemical mechanical polishing method.

9. The method of manufacturing a silicon-on-insulator (SOI) substrate according to any one of claims 1, 3, and 6, wherein a protective layer is formed over the one surface of the semiconductor substrate, the semiconductor substrate is irradiated with an ion through the protective layer formed over the one surface of the semiconductor substrate, and the embrittlement layer is formed at a given depth from the one surface of the semiconductor substrate.

10. The method of manufacturing a silicon-on-insulator (SOI) substrate according to any one of claims 2, 4, and 7, wherein a protective layer is formed over the one surface of the semiconductor substrate, and the insulating layer is formed over the protective layer.

11. The method of manufacturing a silicon-on-insulator (SOI) substrate according to any one of claims 1-4 and 6-7, wherein a protective layer has a single-layer structure or a stacked structure of a plurality of layers selected from a group of a silicon nitride layer, a silicon oxide layer, a silicon nitride oxide layer, and a silicon oxynitride layer.

12. The method of manufacturing a silicon-on-insulator (SOI) substrate according to any one of claims 1-4 and 6-7, wherein the electromagnetic wave is a laser beam.

13. The method of manufacturing a silicon-on-insulator (SOI) substrate according to any one of claims 1-4 and 6-7, wherein at least part of the semiconductor layer is melted by irradiation with the electromagnetic wave.

14. The method of manufacturing a silicon-on-insulator (SOI) substrate according to any one of claims 1-4 and 6-7, wherein an atmosphere of irradiation with the electromagnetic wave contains 10% or more oxygen.

15. The method of manufacturing a silicon-on-insulator (SOI) substrate according to any one of claims 1-4 and 6-7, wherein an atmosphere of irradiation with the electromagnetic wave contains oxygen of 10 ppm or less.

16. A method of manufacturing a semiconductor device, comprising:

forming a semiconductor element using the semiconductor layer formed in the method of manufacturing a silicon-on-insulator (SOI) substrate according to any one of claims 1-4 and 6-7.

17. A method of manufacturing a semiconductor device, comprising:

forming a semiconductor element using the semiconductor layer formed in the method of manufacturing a silicon-on-insulator (SOI) substrate according to any one of claims 1-4 and 6-7; and forming a display element which is electrically connected to the semiconductor element.

18. The method of manufacturing a semiconductor device according to any one of claims 1-4 and 6-7, wherein a liquid crystal display element is formed as a display element.

19. The method of manufacturing a semiconductor device according to any one of claims 1-4 and 6-7, wherein a light-emitting element is formed as a display element.

* * * * *